(12) United States Patent
Jeon et al.

(10) Patent No.: US 9,748,446 B2
(45) Date of Patent: Aug. 29, 2017

(54) SEMICONDUCTOR LIGHT EMITTING DEVICE

(71) Applicant: SEMICON LIGHT CO., LTD., Gyeonggi-do (KR)

(72) Inventors: Soo Kun Jeon, Gyeonggi-do (KR); Geun Mo Jin, Gyeonggi-do (KR)

(73) Assignee: SEMICON LIGHT CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/028,653

(22) PCT Filed: Oct. 13, 2014

(86) PCT No.: PCT/KR2014/009582
§ 371 (c)(1),
(2) Date: Apr. 11, 2016

(87) PCT Pub. No.: WO2015/053595
PCT Pub. Date: Apr. 16, 2015

(65) Prior Publication Data
US 2016/0260869 A1    Sep. 8, 2016

(30) Foreign Application Priority Data

Oct. 11, 2013  (KR) .................. 10-2013-0121306
Dec. 23, 2013  (KR) .................. 10-2013-0161297
(Continued)

(51) Int. Cl.
*H01L 33/00*    (2010.01)
*H01L 33/46*    (2010.01)
(Continued)

(52) U.S. Cl.
CPC .......... *H01L 33/46* (2013.01); *H01L 33/0025* (2013.01); *H01L 33/0062* (2013.01);
(Continued)

(58) Field of Classification Search
CPC . H01L 33/38; H01L 33/0075; H01L 33/0062; H01L 33/0025; H01L 33/40;
(Continued)

(56) References Cited

U.S. PATENT DOCUMENTS 3,648,121 A  *  3/1972  Suenaga .............. H01L 21/56
                                                        257/700
7,262,436 B2     8/2007  Kondoh et al. ............... 257/94
(Continued)

FOREIGN PATENT DOCUMENTS

JP  2002-118294  4/2002  ............ H01L 33/00
JP  2006-120913  5/2006  ............ H01L 33/00
(Continued)

OTHER PUBLICATIONS

International Search Report (ISR) dated Jan. 19, 2015 in PCT/KR2014/009582 with English translation.

*Primary Examiner* — Nikolay Yushin
(74) *Attorney, Agent, or Firm* — Harness, Dickey & Pierce, P.L.C.

(57) ABSTRACT

Disclosed is a semiconductor light emitting device, including: a plurality of semiconductor layers grown sequentially on a growth substrate; a first electrode part, which is in electrical communication with the first semiconductor layer and supplies one of electrons or holes thereto; a second electrode part, which is in electrical communication with the second semiconductor layer and supplies the other one of electrons or holes thereto; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, (Continued)

which comes into contact with the lower electrode by passing through the opening and is in electrical communication with the upper electrode.

12 Claims, 46 Drawing Sheets

(30) Foreign Application Priority Data

| | | |
|---|---|---|
| Feb. 10, 2014 | (KR) | 10-2014-0014753 |
| Mar. 31, 2014 | (KR) | 10-2014-0037933 |
| Mar. 31, 2014 | (KR) | 10-2014-0037938 |
| Mar. 31, 2014 | (KR) | 10-2014-0037940 |
| Apr. 24, 2014 | (KR) | 10-2014-0049301 |

(51) Int. Cl.

| | |
|---|---|
| *H01L 33/38* | (2010.01) |
| *H01L 33/14* | (2010.01) |
| *H01L 33/40* | (2010.01) |
| *H01L 33/06* | (2010.01) |
| *H01L 33/30* | (2010.01) |
| *H01L 33/32* | (2010.01) |
| *H01L 33/62* | (2010.01) |
| *H01L 33/42* | (2010.01) |

(52) U.S. Cl.
CPC ........ *H01L 33/0075* (2013.01); *H01L 33/145* (2013.01); *H01L 33/38* (2013.01); *H01L 33/40* (2013.01); *H01L 33/06* (2013.01); *H01L 33/30* (2013.01); *H01L 33/32* (2013.01); *H01L 33/382* (2013.01); *H01L 33/387* (2013.01); *H01L 33/42* (2013.01); *H01L 33/62* (2013.01); *H01L 2933/0016* (2013.01); *H01L 2933/0025* (2013.01)

(58) Field of Classification Search
CPC ....... H01L 33/145; H01L 33/46; H01L 33/42; H01L 33/06; H01L 33/30; H01L 33/62; H01L 33/387; H01L 33/32; H01L 33/382; H01L 2933/0016; H01L 2933/0025
See application file for complete search history.

(56) References Cited

U.S. PATENT DOCUMENTS

| | | | |
|---|---|---|---|
| 7,737,456 B2 | 6/2010 | Song et al. | 257/98 |
| 8,357,949 B2* | 1/2013 | Kim | H01L 33/405 |
| | | | 257/98 |
| 2008/0217640 A1* | 9/2008 | Suzuki | H01L 33/405 |
| | | | 257/98 |
| 2011/0233589 A1* | 9/2011 | Kim | H01L 33/405 |
| | | | 257/98 |
| 2014/0217439 A1 | 8/2014 | Jeon et al. | 257/98 |

FOREIGN PATENT DOCUMENTS

| | | | |
|---|---|---|---|
| KR | 10-2008-0035215 | 4/2008 | ............. H01L 33/36 |
| KR | 10-1087968 | 12/2011 | ............. H01L 33/36 |
| KR | 10-1226706 | 1/2013 | ............. H01L 33/36 |

* cited by examiner

SEMICONDUCTOR LIGHT EMITTING DEVICE

CROSS-REFERENCE TO RELATED APPLICATIONS

This application is a national phase application of PCT Application No. PCT/KR2014/009582, filed on Oct. 13, 2014, which claims the benefit and priority to Korean Patent Application No. 10-2014-0049301, filed Apr. 24, 2014, to Korean Patent Application No. 10-2014-0037940, filed Mar. 31, 2014, to Korean Patent Application No. 10-2014-0037938, filed Mar. 31, 2014, to Korean Patent Application No. 10-2014-0037933, filed Mar. 31, 2014, to Korean Patent Application No. 10-2014-0014753, filed Feb. 10, 2014, to Korean Patent Application No. 10-2013-0161297, filed Dec. 23, 2013, and to Korean Patent Application No. 10-2013-0121306, filed Oct. 11, 2013. The entire disclosures of the applications identified in this paragraph are incorporated herein by references.

FIELD

The present disclosure relates generally to a semiconductor light emitting device, and more particularly to a semiconductor light emitting device having an electrode structure for lowering the electrical contact resistance and for improving the reliability of electrical contacts.

In the context herein, the term "semiconductor light emitting device" is intended to indicate a semiconductor optoelectronic device which generates light by electron-hole recombination. One example thereof is Group III-nitride semiconductor light emitting devices, in which the Group III-nitride semiconductor is made of a compound containing $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

BACKGROUND

This section provides background information related to the present disclosure which is not necessarily prior art.

FIG. 1 is a schematic view illustrating one exemplary embodiment of the semiconductor light emitting device disclosed in U.S. Pat. No. 7,262,436.

The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, with the electrodes serving as reflective films, and an n-side bonding pad 800 formed on the n-type semiconductor layer 300 which had been etched and exposed.

A chip having the above structure, i.e. a chip where all of the electrodes 901, 902 and 903, and the electrode 800 are formed on one side of the substrate 100, with the electrodes 901, 902 and 903 serving as reflective films, is called a flip chip. The electrodes 901, 902 and 903 are made up of an electrode 901 (e.g. Ag) having a high reflectance, an electrode 903 (e.g. Au) for bonding, and an electrode 902 (e.g. Ni) for preventing diffusion between materials of the electrode 901 and materials of the electrode 903. While this metal reflective film structure has a high reflectance and is advantageous for current spreading, it has the drawback that the metal absorbs light.

FIG. 2 is a schematic view illustrating an exemplary embodiment of the semiconductor light emitting device disclosed in JP Laid-Open Pub. No. 2006-120913.

The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, a p-side bonding pad 700 formed on the light transmitting conductive film 600, and an n-side bonding pad 800 formed on the n-type semiconductor layer 300 which had been etched and exposed. Further, a DBR (Distributed Bragg Reflector) 900 and a metal reflective film 904 are provided on the light transmitting conductive film 600. While this structure shows reduced light absorption by the metal reflective film 904, it has the drawback that current spreading is not facilitated, as compared with the structure using the electrodes 901, 902 and 903.

SUMMARY OF THE INVENTION

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a semiconductor light emitting device, including a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a first electrode part, which is in electrical communication with the first semiconductor layer and supplies electrons or holes thereto; a second electrode part, which is in electrical communication with the second semiconductor layer and supplies holes thereto if the first electrode part supplies electrons, or electrons if the first electrode part supplies holes; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode.

Advantageous Effects

The advantageous effects of the present disclosure will be described in the latter part of the best mode for carrying out the invention.

DETAILED DESCRIPTION

Hereinafter, the present disclosure will now be described in detail with reference to the accompanying drawings. The following description is presented for purposes of illustration only and not of limitation as the scope of the invention is defined by the appended claims. For example, the steps mentioned in any of the method or process may be executed in any order and are not necessarily limited to the order provided. Also, any reference to singular includes plural embodiments, and vice versa.

Figure 3:
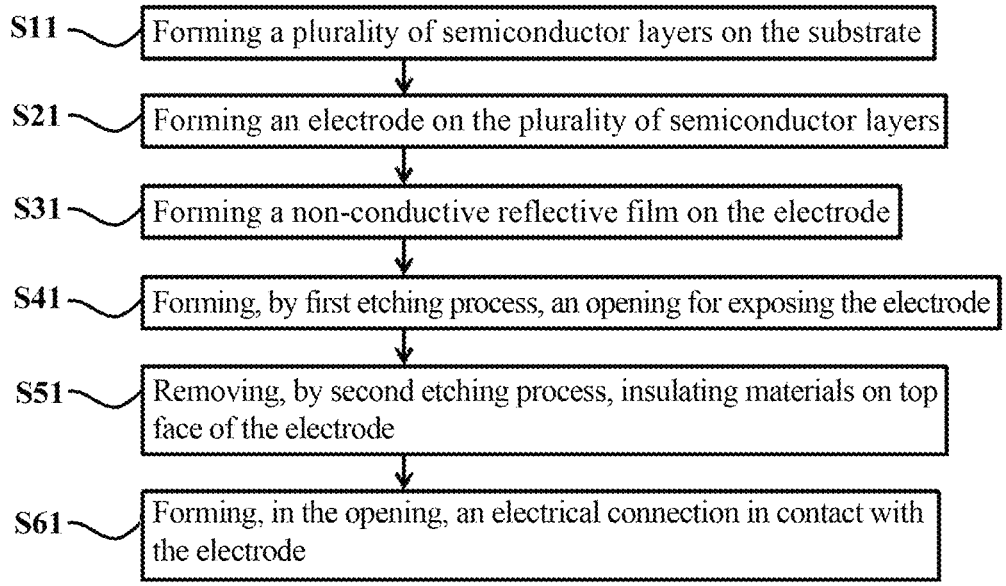
FIG. 3 is a schematic view illustrating an exemplary embodiment of a semiconductor light emitting device according to the present disclosure and a manufacturing method of the same.

FIG. 3 is a schematic view illustrating an exemplary embodiment of a semiconductor light emitting device according to the present disclosure and a manufacturing method of the same.

In a manufacturing method of a semiconductor light emitting device, in step 11, a plurality of semiconductor layers is formed on a substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination. Then, in step 21, an electrode electrically connected to the first semiconductor layer or the second semiconductor layer is formed. Next, in step 31, a non-conductive film for reflecting light from the active layer is formed in a manner that the non-conductive film covers the electrode and faces the plurality of semiconductor layers. The subsequent step 41 involves a process of forming an opening on the non-conductive film for an electrical connecting pass with the electrode. That is, a first etching process is carried out to form an opening through which the electrode is exposed. Afterwards, in step 51, a second etching process is carried out to remove insulating materials formed on top of the electrode having been exposed to the opening. Then, in step 61, an electrical connection in contact with the electrode is formed in the opening.

Figure 4:
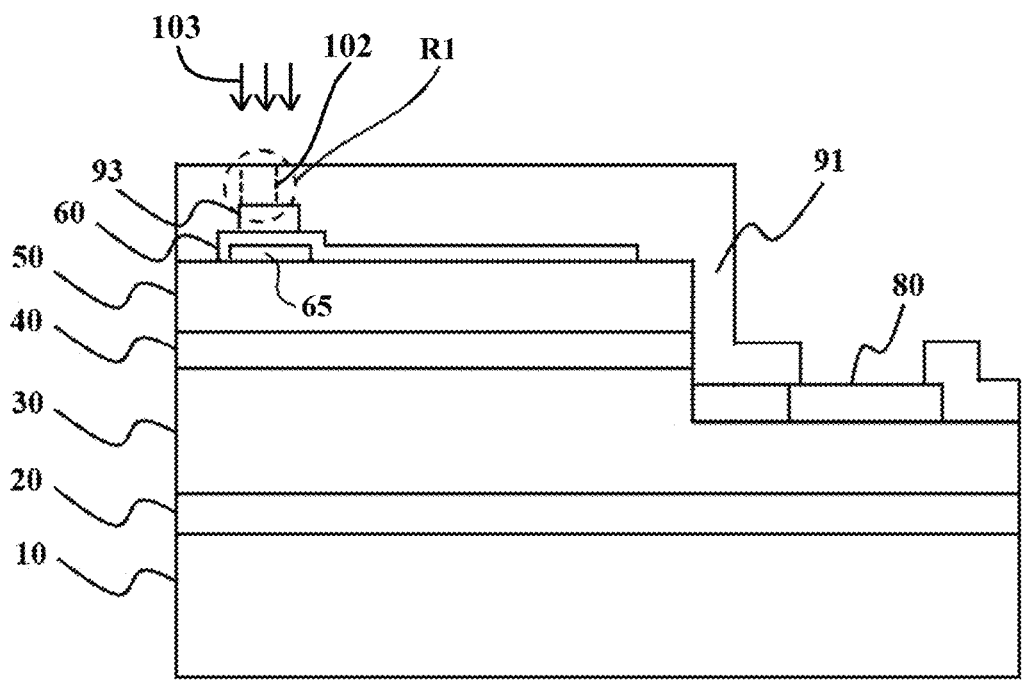
FIG. 4 is a schematic view illustrating an exemplary embodiment of a manufacturing method of the semiconductor light emitting device shown in FIG. 3.

FIG. 4 is a schematic view illustrating an exemplary embodiment of a manufacturing method of the semiconductor light emitting device shown in FIG. 3.

In this manufacturing method of the semiconductor light emitting device, firstly, a buffer layer 20 is grown on a substrate 10, followed by an n-type semiconductor layer 30 (a first semiconductor layer), an active layer 40, and a p-type semiconductor layer 50 (a second semiconductor layer) in sequence (refer to S11 in FIG. 3).

The substrate 10, which may eventually be removed, is typically made of sapphire, SiC, Si, GaN or the like, and the buffer layer 20 may be omitted.

The p-type semiconductor layer 50 and the active layer 40 are mesa-etched, thereby exposing a part of the n-type semiconductor layer. The mesa etching may be carried out in different orders.

A light absorption barrier 65 is formed on the p-type semiconductor layer, in correspondence with an electrode 93 to be formed in a subsequent step. The light absorption barrier 65 may be omitted. The light absorption barrier 65 may be composed of a single layer (e.g. $SiO_2$) that is made of a light transmitting material having a refractive index lower than the refractive index of the p-type semiconductor layer 50, or a multilayered structure (e.g. $SiO_2/TiO_2/SiO_2$), or a DBR, or a combination of the single layer and the DBR. In addition, the light absorption barrier 65 may be made of a non-conductive material (e.g. a dielectric film such as $SiO_x$, $TiO_x$ or the like).

A light transmitting conductive film 60 covering the light absorption barrier 65 is preferentially formed on the p-type semiconductor layer 50, for current spreading into the p-type semiconductor layer 50. For example, the light transmitting conductive film 60 may be made of a material such as ITO, Ni/Au or the like.

Next, the electrode 93 is formed on the light transmitting conductive film 60 (refer to S21 in FIG. 3). The electrode 93 is electrically connected with the p-type semiconductor layer 50 by means of the light transmitting conductive film 60. When the electrode 93 is formed, an n-side bonding pad 80 adapted to supply electrons to the n-type semiconductor layer 30 may also be formed on the exposed n-type semiconductor layer 30. Optionally, the n-side bonding pad 80 may be formed when a reflective electrode 92 (to be described later) is formed.

If an electrical connection 94 (see FIG. 7) (to be described later) is directly connected to the light transmitting conductive film 60, it may not be easy to form a satisfactory electrical contact between the reflective electrode 92 (see FIG. 7) and the light transmitting conductive film 60. In this embodiment, the electrode 93 which is interpositioned between the light transmitting conductive film 60 and the electrical connection 94 makes a stable electrical contact with them and prevents an increase in the contact resistance.

Subsequently, as a non-conductive film, a non-conductive reflective film 91 covering the electrode 93 is formed (see S31 in FIG. 3). The non-conductive reflective film 91 may also be formed on top of the etch-exposed n-type semiconductor layer 30 and on top of a part of the n-side bonding pad 80. It is not absolutely necessary for the non-conductive reflective film 91 to cover the entire area on the n-type and p-type semiconductor layers 30, 50. It is desirable that the non-conductive reflective film 91 functions as a reflective film, yet it is made of light transmitting materials for avoiding light absorption. The non-conductive reflective film 91 may be formed of light transmitting dielectric materials such as $SiO_x$, $TiO_x$, $Ta_2O_5$, or $MgF_2$. When the non-conductive reflective layer 91 is made of $SiO_x$, it has a lower refractive index than the refractive index of the p-type semiconductor layer 50 (e.g. GaN) such that the light incident at a greater angle than the critical angle will partly be reflected towards the plurality of semiconductor layers 30, 40, 50.

Meanwhile, when the non-conductive reflective film 91 is made of a DBR (e.g. DBR using the combination of $SiO_2$ and $TiO_2$), a greater amount of incident light will be reflected towards the plurality of semiconductor layers 30, 40, 50.

Figure 5:
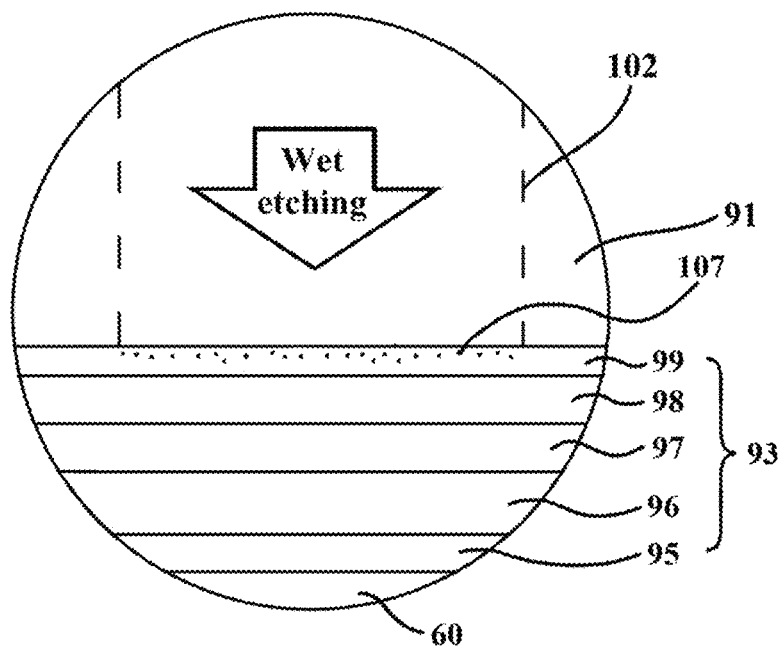
FIG. 5 is an enlarged view of a portion R1 of an opening formed by dry etching.
Figure 6:
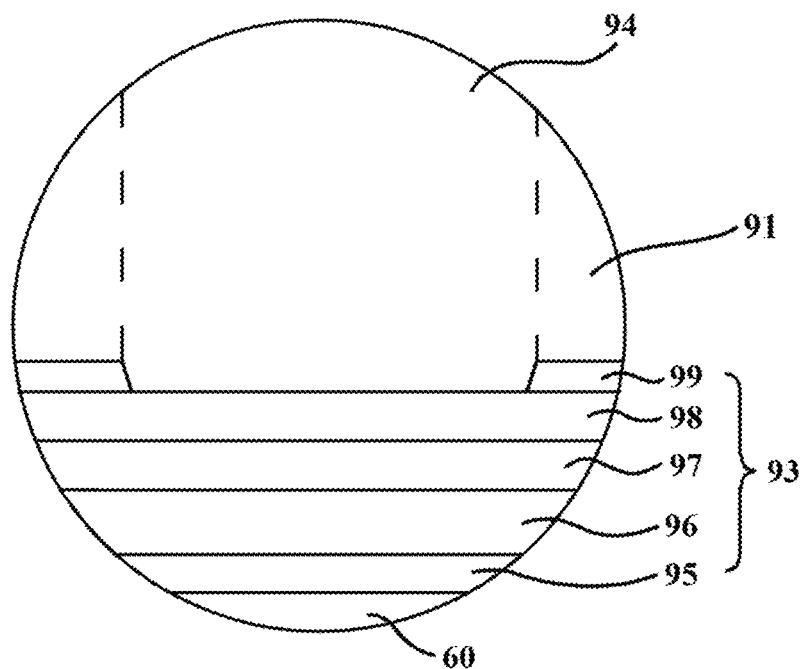
FIG. 6 is a schematic view illustrating the upper face of a wet-etched electrode.

FIG. 5 is an enlarged view of a portion R2 of an opening formed by dry etching, and FIG. 6 is a schematic view illustrating the upper face of a wet-etched electrode.

Further, an opening 102 is formed by dry etching (a first etching process) in the non-conductive reflective film 91 such that a part of the electrode 93 is exposed (see S41 in FIG. 3). During dry etching, halogen gases containing an F group (e.g. $CF_4$, $C_2F_6$, $C_3F_8$, $SF_6$ or the like) may be used as an etching gas. The electrode 93 may include multiple layers. For example, the electrode 93 includes a contact layer 95 electrically connected with the p-type semiconductor layer 50, an anti-oxidation layer 98 formed on the contact layer 95, and an anti-etching layer 99 formed on the anti-oxidation layer 98. In this embodiment, the electrode 93 includes a contact layer 95, a reflective layer 96, a diffusion barrier layer 97, an anti-oxidation layer 98 and an anti-etching layer 99, which are arranged sequentially on the light transmitting conductive film 60.

The contact layer 95 is preferentially made of a material that can establish a satisfactory electrical contact with the light transmitting conductive film 60. To this end, a material such as Cr or Ti is typically used, but other materials such as Ni, Ti or TiW and highly reflective materials such as Al or Ag can also be used for the contact layer 95.

The reflective layer 96 may be made of a highly reflective metal (e.g. Ag, Al or a combination thereof). The reflective layer 96 reflects light generated in the active layer 40 towards the plurality of semiconductor layers 30, 40, 50. The reflective layer 96 may be omitted.

The diffusion barrier layer 97 prevents the material of the reflective layer 96 or the material of the anti-oxidation layer 98 from diffusing to other layers. The diffusion barrier layer 97 may be made of at least one of Ti, Ni, Cr, W or TiW. If high reflectance is required, Al or Ag may be used.

The anti-oxidation layer 98 may be made of Au, Pt or the like. Any material that is not easily oxidized when exposed to the outside and brought into contact with oxygen is also acceptable. Au with high electrical conductivity is preferentially used for the anti-oxidation layer 98.

The anti-etching layer 99 is exposed during dry etching for forming the opening 102. In this embodiment, the anti-etching layer 99 corresponds to a top layer of the electrode 93. When the anti-etching layer 99 is made of Au, it shows weak bonding strength towards the non-conductive reflective film 91, and part of Au may be damaged or ruined during etching. Hence, the anti-etching layer 99 is preferentially made of a material such as Ni, W, TiW, Cr, Pd, Mo or the like, instead of Au, in order to retain the bonding strength towards the non-conductive reflective layer 91, thus improving reliability.

During dry etching, the anti-etching layer 99 protects the electrode 93, and in particular it prevents damages on the anti-oxidation layer 98. During dry etching, halogen gases containing an F group (e.g. $CF_4$, $C_2F_6$, $C_3F_8$, $SF_6$ or the like) may be used as an etching gas. To avoid any damage on the anti-oxidation layer 98 during dry etching, the anti-etching layer 99 is preferentially made of a material having high etching selectivity. If the anti-etching layer 99 has poor etching selectivity, the anti-oxidation layer 98 may be damaged or ruined during dry etching. Therefore, from the perspective of etching selectivity, Cr or Ni is a suitable choice of materials for the anti-etching layer 99. Ni or Cr does not or only slightly reacts with the etching gas during dry etching, thereby remaining in a non-etched condition, which enables the anti-etching layer to protect the electrode.

Meanwhile, the etching gas used in dry etching for forming the opening 102 may produce a material 107 such as an insulation material or impurities on the top layer of the electrode 93. For example, the material 107 may be produced by a reaction between the halogen etching gas containing an F group and the top layer metal of the electrode. For instance, Ni, W, TiW, Cr, Pd, Mo and the like, which are the materials of the anti-etching layer 99, may at least partly react with the etching gas used in dry etching, and produce the material 107 (e.g. NiF), as shown in FIG. 5. However, the material 107 thus produced can cause deterioration of the electrical properties (e.g. an increased operating voltage) of the semiconductor light emitting device. Another part of Ni, W, TiW, Cr, Pd, Mo and the like, which are the materials of the anti-etching layer 99, may react with the etching gas but will not produce the material at all or produce a very small amount of the material. It is desirable to suppress the production of the material, or allow only a very small amount to be produced. From this perspective, Cr is preferred to Ni as a material for the anti-etching layer 99.

In this embodiment, due to the material being produced, the top layer of the electrode 93, i.e. a part of the anti-etching layer 99 in correspondence to the opening 102 is subjected to wet etching (a second etching process) and removed such that, as shown in FIG. 6, a part of the anti-oxidation layer 98 in correspondence to the opening 102 is exposed. As such, the material 107 as well as the anti-etching layer 99 are etched and removed together. With the material 107 having been removed, the electrode 93 and the electrical connection 94 (see FIG. 7) may have a better electrical contact between them, and deterioration of the electrical properties of the semiconductor light emitting device is avoided.

Alternatively, the first etching process for forming the opening 102 may be carried out by wet etching. In this case, the wet etchant for the non-conductive reflective film 91 may be HF, BOE, NHO$_3$, or HCl, which is used singly or in combination at a suitable concentration. Similar to dry etching mentioned above, when the opening 102 is formed in the non-conductive reflective film 91 by wet etching, the anti-etching layer 99 should preferentially have high etching selectivity for protecting the anti-oxidation layer 98. From this perspective, Cr is a suitable material for the anti-etching layer 99. Then a part of the anti-etching layer 99 in correspondence to the opening 102 can be removed by another subsequent wet etching (a second etching process).

As a result of the processes of forming the opening 102 and removing a part of the anti-etching layer 99 in correspondence to the opening 102, the non-conductive reflective film 91 and the anti-etching layer 99 having excellent bonding strength in other parts except for the opening 102 are brought into contact with each other; and, for example, the electrode 93 will have a stack of Cr (contact layer)/Al (reflective layer)/Ni (diffusion barrier layer)/Au (anti-oxidation layer)/Cr (anti-etching layer) arranged sequentially. Also, having removed a part of the anti-etching layer 99 in correspondence to the opening 102 to avoid deterioration of the electrical properties, the electrode 93 will have a stack including Cr (contact layer)/Al (reflective layer)/Ni (diffusion barrier layer)/Au (anti-oxidation layer) arranged sequentially, in which the anti-oxidation layer 98 may come into contact with an electrical connection 94 (to be described).

Unlike the embodiment shown in FIG. 6, a part of the anti-etching layer 99 in correspondence to the opening 102 may be partly wet etched down to a certain thickness, leaving the other part of the anti-etching layer 99 non-etched; and the material centered on the top face of the anti-etching layer can be removed.

Figure 7:
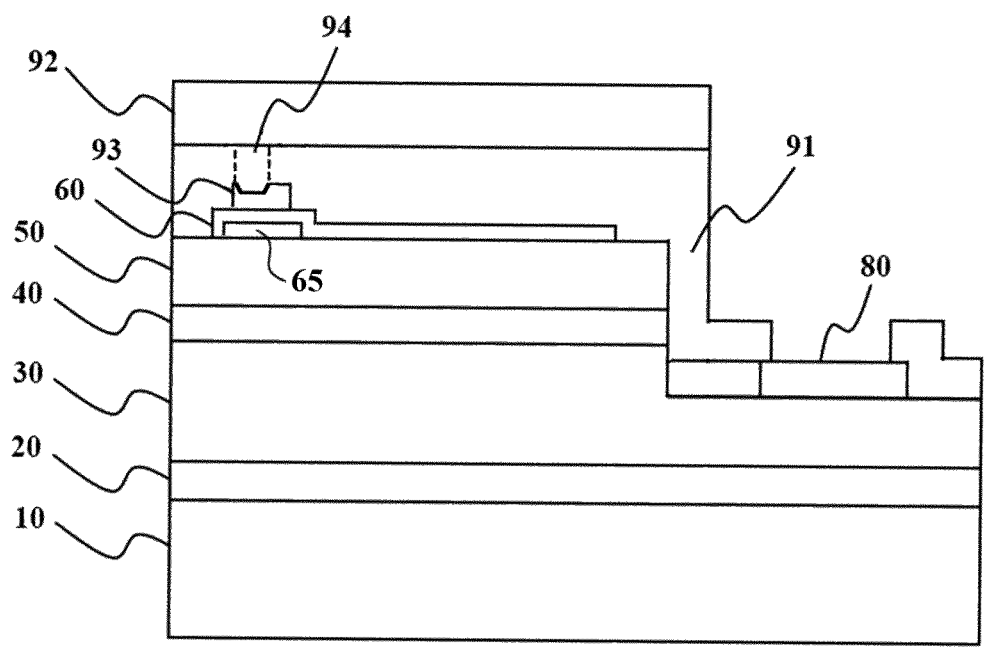
FIG. 7 is a schematic view illustrating an electrical connection formed in the opening.

FIG. 7 is a schematic view illustrating an electrical connection formed in the opening.

As can be seen in FIG. 7, an electrical connection 94 in contact with the electrode 93 is formed in the opening 102 (see S61 in FIG. 3). The electrical connection 94 may be formed such that it is brought into contact with the anti-oxidation layer 98 exposed to the opening 102.

A reflective electrode 92 being in contact with the electrical connection 94 may then be formed on the non-conductive reflective film 91, with the reflective electrode being made of a highly reflective metal such as Al or Ag. The reflective electrode 92 may be formed by deposition or plating, for instance. Alternatively, the reflective electrode 92 and the electrical connection 94 may be formed together instead of forming them separately. For example, the electrical connection 94 is formed by filling the opening 102 during the formation of the reflective electrode 92. For a stable electrical contact, the reflective electrode 92 may be made of Cr, Ti, Ni or an alloy thereof. The reflective electrode 92 may be electrically connected to the outside to supply holes to the p-type semiconductor layer 50, and it may reflect light that is not reflected by the non-conductive reflective film 91.

When the substrate 10 has been removed or the substrate 10 is conductive, the n-side bonding pad 80 may be formed either on the n-type semiconductor layer 30 side after the substrate 10 had been removed, or on the conductive substrate side. The positions of the n-type semiconductor layer 30 and p-type semiconductor layer 50 may be exchanged, and these semiconductor layers are typically made of GaN in case of Group III-nitride semiconductor light emitting devices. Each of the semiconductor layers 20, 30, 40, 50 may have a multilayered structure, and an additional layer may optionally be added thereto.

The electrode 93, the n-side bonding pad 80 and the reflective electrode 92 may be formed to have a branch portion to spread current. The n-side bonding pad 80 may have a height that is high enough to be combined with a package with the help of a separate bump, or the n-side bonding pad itself may be deposited up to a certain height that is high enough to be combined with a package as in FIG. 2.

According to the manufacturing method of a semiconductor light emitting device described above, deterioration of the electrical properties of the semiconductor light emitting device is avoided by removing the material produced between the electrode 93 and the electrical connection 94.

Moreover, the method makes it possible to manufacture a semiconductor light emitting device including an electrode 93 that demonstrates excellent bonding strength towards the non-conductive reflective film 91 as well as a satisfactory electrical contact with the electrical connection 94.

In this embodiment, the electrode 93, the electrical connection 94 and the reflective electrode 92 form an electrode part adapted to supply holes to the second semiconductor layer 50. In this electrode part, the electrode 93 is provided as a lower electrode, the reflective electrode 92 is provided as an upper electrode, and the electrical connection formed in the opening serves to electrically connect the lower electrode and the upper electrode.

Figure 8:
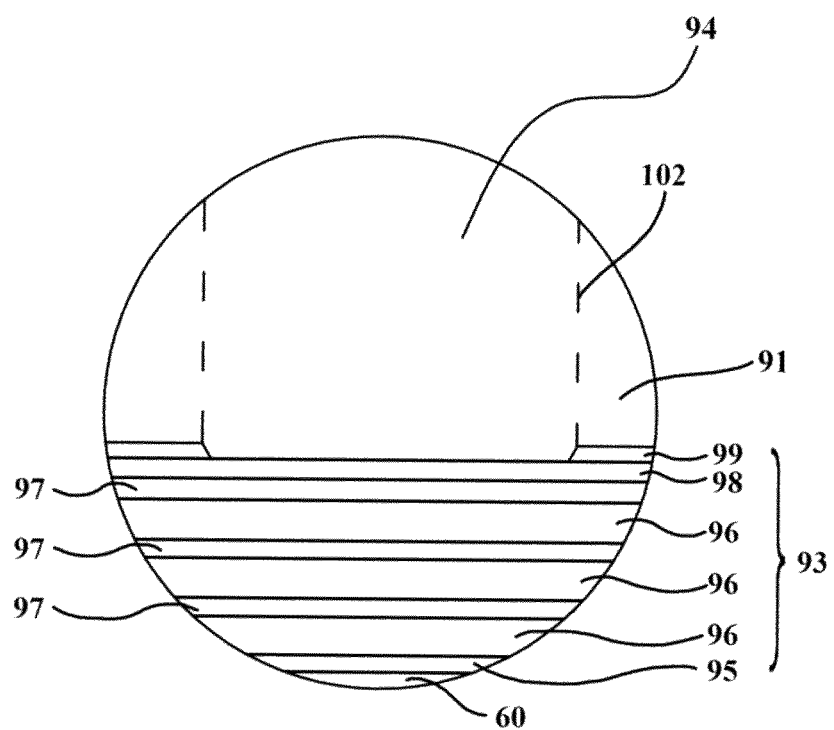
FIG. 8 is a schematic view illustrating a further exemplary embodiment of a semiconductor light emitting device according to the present disclosure and a manufacturing method of the same.

FIG. 8 is a schematic view illustrating a further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that an electrode 93 is formed to have alternating layers of a reflective layer 96 and a diffusion barrier layer 97. Hence, common features will not be described to avoid redundancy.

The electrode 93 includes a contact layer 95 formed on a light transmitting conductive film 60; alternating layers of a reflective layer 96 and a diffusion barrier layer 97 deposited on the contact layer 95; an anti-oxidation layer 98 formed on the diffusion barrier layer 97; and an anti-etching layer 99 in contact with a non-conductive reflective film 91. A part of the anti-etching layer 99 in correspondence to an opening is removed to expose the anti-oxidation layer 98 such that the anti-oxidation layer 98 may be brought into contact with an electrical connection 94.

For example, the reflective layer 96/the diffusion barrier layer 97 may form an Al/Ni/Al/Ni/Al/Ni layered structure. If multiple electrical connections 94 are formed between the electrode 93 and a p-side bonding pad, the electrode 94 may have an increased area. Because of this, the prevention of light absorption by the electrode 93 can become more important, and the reflective layer 96 becomes important as well. If the reflective layer 96 such as Al is made very high, several problems may occur, e.g. the Al layer may burst. However, the alternating layers of the reflective layer 96/the diffusion barrier layer 97 as in this embodiment make it possible to remove things like insulating materials or impurities, which in turn provides a satisfactory electrical contact and improves reflectivity, while eliminating the aforementioned problems.

Figure 9:
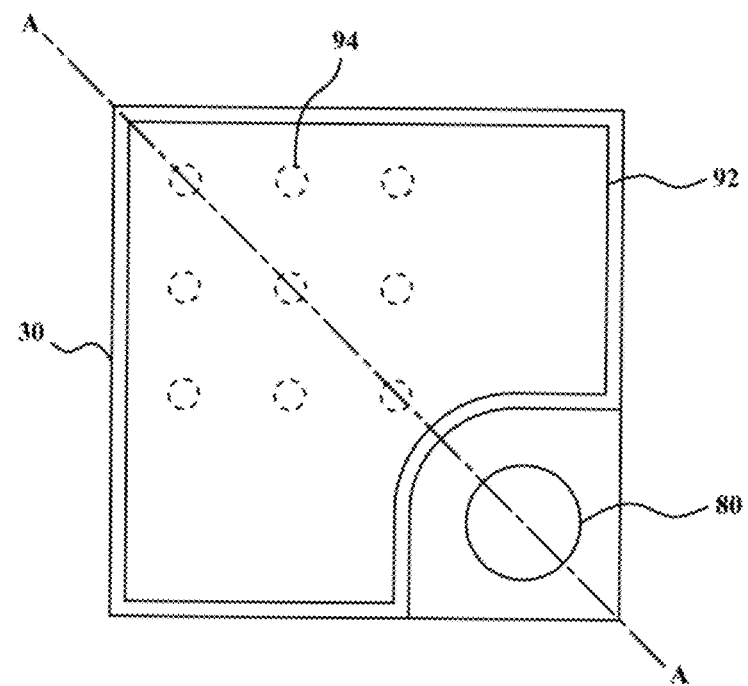
FIG. 9 is a schematic view illustrating a still further exemplary embodiment of a semiconductor light emitting device according to the present disclosure and a manufacturing method of the same.
Figure 10:
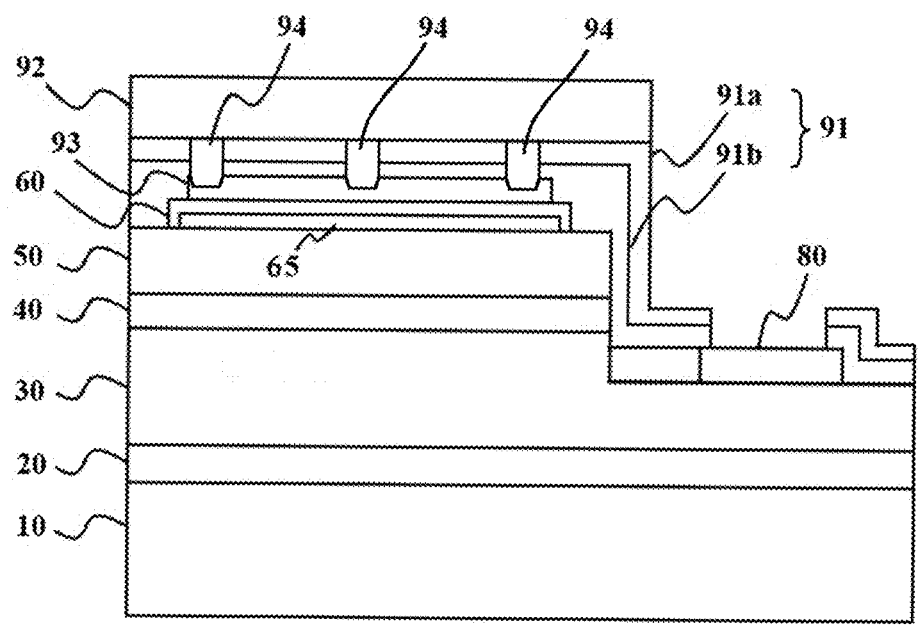
FIG. 10 is a schematic view illustrating a cutaway portion, taken along line A-A in FIG. 9.

FIG. 9 is a schematic view illustrating a still further exemplary embodiment of a semiconductor light emitting device according to the present disclosure and a manufacturing method of the same, and FIG. 10 is a schematic view illustrating a cutaway portion, taken along line A-A in FIG. 9.

This manufacturing method of a semiconductor light emitting device is applicable to a large area semiconductor light emitting device. This manufacturing method of a semiconductor light emitting device is substantially identical with the manufacturing method of the semiconductor light emitting device illustrated in FIG. 3 through FIG. 7, except that the electrode 93 has an increased area or stretched in a finger electrode form, a plurality of openings and a plurality of electrical connections 94 are formed, and the non-conductive reflective film 91 has a dielectric film 91b and a DBR 91a (e.g. DBR using the combination of $SiO_2$ and $TiO_2$). Hence, common features will not be described to avoid redundancy.

Since the non-conductive reflective film 91 includes a DBR, a greater amount of light can be reflected towards the plurality of semiconductor layers 30, 40, 50.

The dielectric film 91b is suitably made of $SiO_2$, and it preferentially has a thickness ranging from 0.2 μm and 1.0 μm. The dielectric film 91b made of $SiO_2$ is preferentially formed by CVD (Chemical Vapor Deposition) and in particular by PECVD (Plasma Enhanced CVD).

If the DBR 91a is made of the combination of $TiO_2/SiO_2$, each layer is designed to have an optical thickness of ¼ of a given wavelength, and the number of the combinations thereof is suitably in a range of from 4 to 20 pairs. The DBR 91a is preferentially formed by PVD (physical vapor deposition), and in particular by E-beam evaporation, sputtering or thermal evaporation.

An additional dielectric film may be formed on the DBR 91a before the reflective electrode 92 is formed. The dielectric film 91b, the DBR 91a and the additional dielectric form a light guide structure.

To spread current, a plurality of electrical connections 94 is formed between the electrode and the p-side reflective electrode 92. As such, during dry etching for forming a plurality of openings in the non-conductive reflective film 91, a material may be produced on top of the exposed electrode 93 through the plurality of openings.

The material as well as the top layer of the electrode 93, for instance, a part of the anti-etching layer in correspondence to the openings are removed by wet etching. Afterwards, those electrical connections 94 are formed in the plurality of openings. Accordingly, deterioration of the electrical properties of a large area semiconductor light emitting device is avoided.

Figure 11:
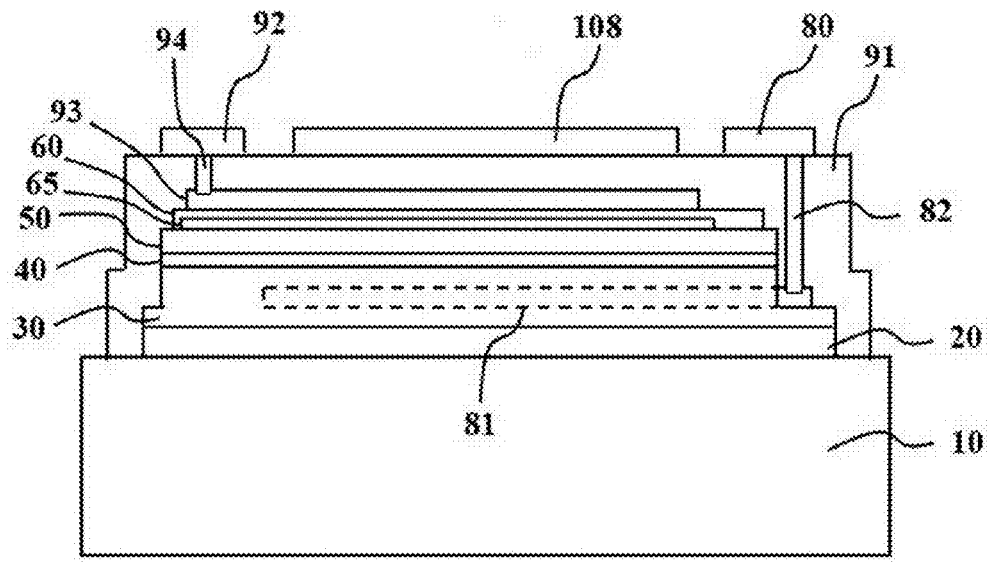
FIG. 11 is a schematic view illustrating a still further exemplary embodiment of a semiconductor light emitting device according to the present disclosure and a manufacturing method of the same.

FIG. 11 is a schematic view illustrating a still further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that an n-side bonding pad 80 is formed on a non-conductive reflective film 91, an opening is formed to generate an electrical connection 82 between the n-side bonding pad 81 and an n-side finger electrode 81, and heat-emission and reflective electrode 108 is provided. Hence, common features and thus their description will be omitted to avoid redundancy.

Dry etching is carried out to form openings which respectively expose a part of the electrode 93 and the n-side finger electrode 81. As such, a material such as an insulating material or impurities are produced not only on top of the electrode 93, but also on top of the n-side finger electrode 81.

The materials on top of the electrode 93 and of the n-side finger electrode 81, each being exposed to the respective opening by subsequent wet etching, may be removed together. Electrical connections 94, 82 are then formed. The electrical connections 94, 82 may be formed in a manner that they are brought into contact with the electrode 93 and with the anti-oxidation layer of the n-side finger electrode 81, which are exposed after the anti-etching layer had been removed. These electrical connections 94, 82 electrically connect the p-side bonding pad 92 and the n-side bonding pad 80 to the p-type semiconductor layer 50 and the n-type semiconductor layer 30, respectively.

Figure 12:
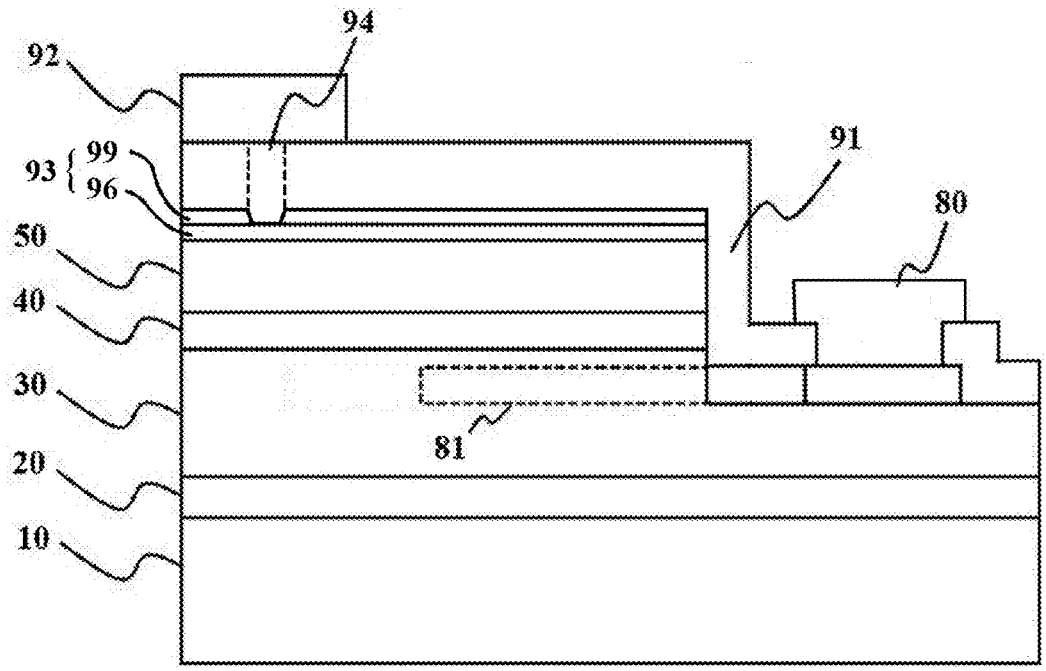
FIG. 12 is a schematic view illustrating a still further exemplary embodiment of a semiconductor light emitting device according to the present disclosure and a manufacturing method of the same.

FIG. 12 is a schematic view illustrating a still further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that a light transmitting conductive film and a light absorption barrier are omitted, an electrode 93 having a 2-layered structure is formed all over a p-type semiconductor layer 50 to serve as a reflective film and a current-spreading conductive film, and an n-side finger electrode 81 is additionally provided. Hence, common features will not be described to avoid redundancy.

The electrode 93 includes a reflective layer 96 made of a highly reflective material such as Ag or Al, and the reflective layer 96, together with the p-type semiconductor layer 50, serves as an ohmic contact layer. The electrode 93 includes an anti-etching layer 99 on the reflective layer 96, in which the anti-etching layer 99 is made of a material having high bonding strength towards the non-conductive film 91. For example, the electrode 93 may include an anti-etching layer on the reflective layer, e.g. an Ag layer or an Al layer, in which the anti-etching layer is made of a material such as Ni, W, TiW, Cr, Pd or Mo. The anti-etching layer 99 may be formed all over the Ag or the Al layer, or only on a part in correspondence to the opening. The anti-etching layer 99 is preferentially selected from materials which have high etching selectivity during dry etching for forming an opening, and which do not react with an etching gas or produce a smaller amount of a material such as an insulating material or impurities. From these perspectives, Cr or Ni is a suitable choice.

In this embodiment, a dielectric film 91 is provided as a non-conductive film. The dielectric film 91 may be made of a light transmitting dielectric material such as $SiO_x$, $TiO_x$, $Ta_2O_5$ or $MgF_2$.

An opening is formed in the dielectric film 91 by dry etching. During dry etching for forming an opening, a material such as an insulating material or impurities may be produced on top of the electrode 93. This material is later removed by wet etching. During wet etching for removing the material, a part of the electrode 93, e.g. at least part of the anti-etching layer 99 in correspondence to the opening may be removed. An electrical connection 94 is formed in the opening. Therefore, an increase in an operating voltage of the semiconductor light emitting device due to the material is prevented.

Each of the semiconductor light emitting devices described above include a first electrode part (an n-side electrode part) and a second electrode part (a p-side electrode part). At least one of the first and second electrode parts includes a lower electrode (e.g. 93, 81) at least partly exposed via the opening, an upper electrode (e.g. 92, 80) provided on the non-conductive film, and an electrical connection (e.g. 94, 82) formed in the opening to electrically connect the lower electrode and the upper electrode. These electrode parts are also provided to those semiconductor light emitting devices described below.

Figure 13:
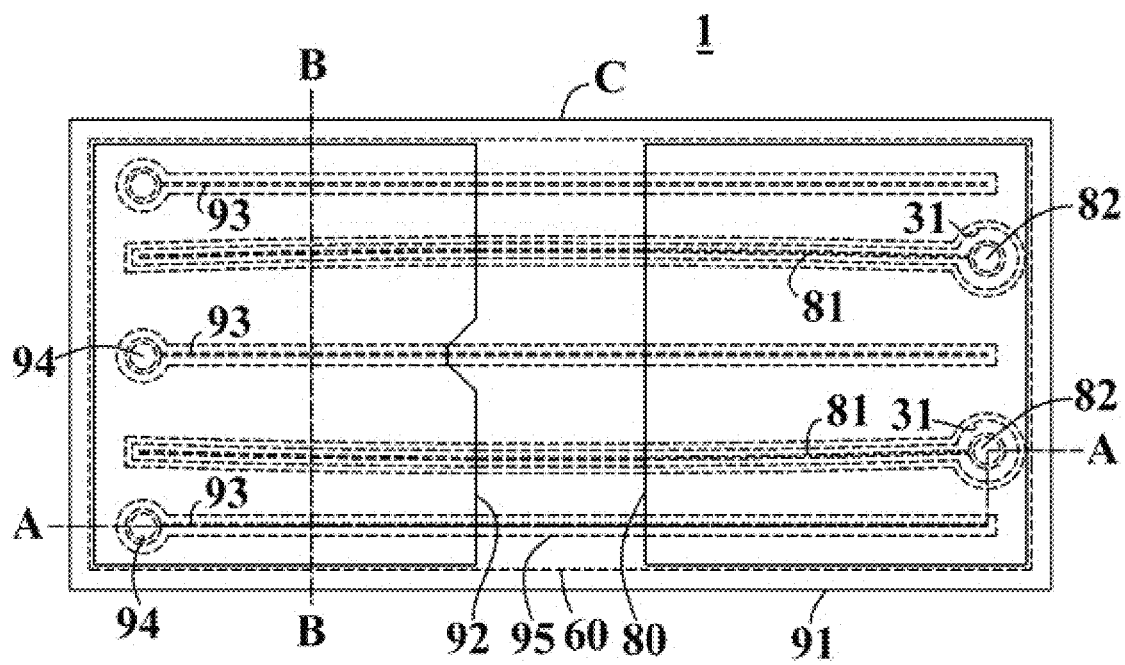
FIG. 13 is a schematic view illustrating a still further exemplary embodiment of a semiconductor light emitting device according to the present disclosure.
Figure 14:
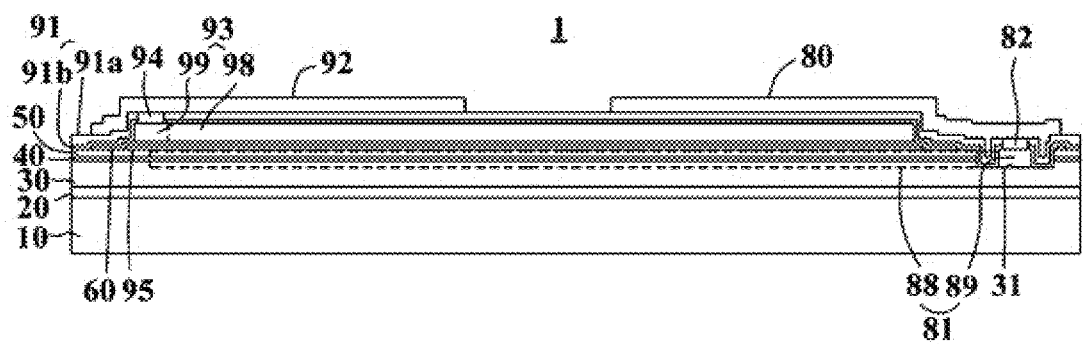
FIG. 14 is a cross-sectional view taken along line A-A in FIG. 13.
Figure 15:
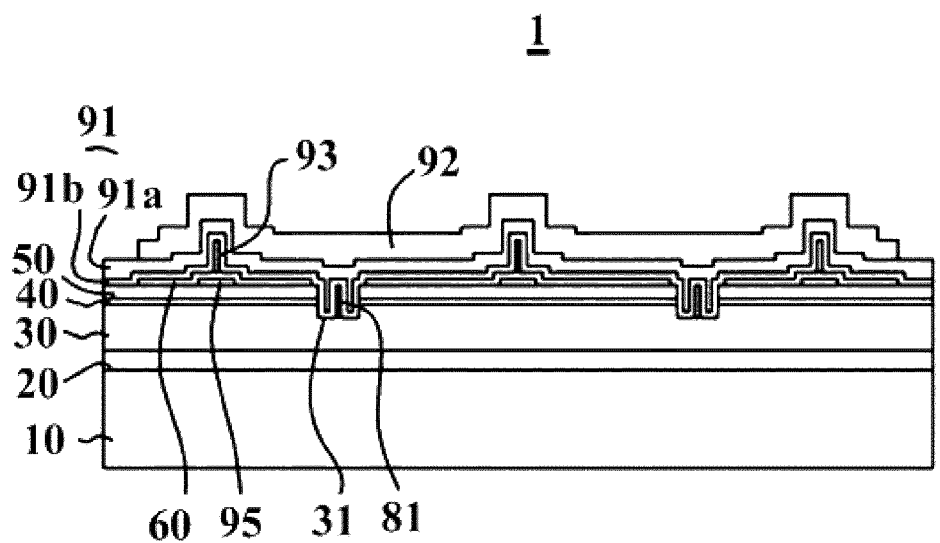
FIG. 15 is a cross-sectional view taken along line B-B in FIG. 13.
Figure 16:
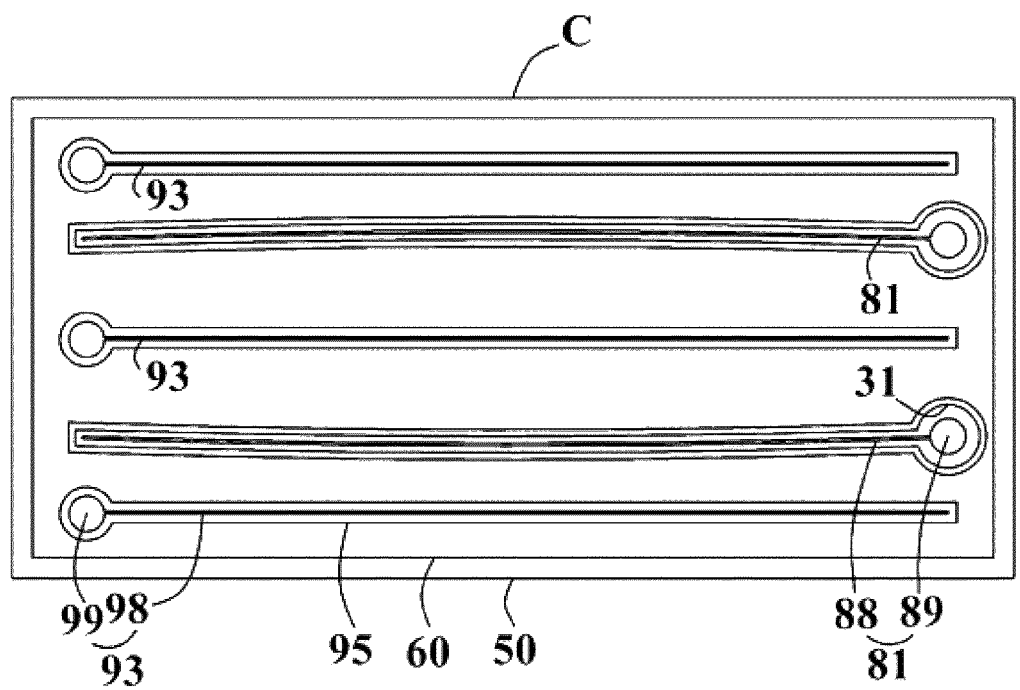
FIG. 16 is a schematic view illustrating the semiconductor light emitting device of FIG. 13, after the p-side electrode, the n-side electrode and the non-conductive reflective film have been removed therefrom.

FIG. 13 is a schematic view illustrating a still further exemplary embodiment of a semiconductor light emitting device according to the present disclosure, FIG. 14 is a cross-sectional view taken along line A-A in FIG. 13, FIG. 15 is a cross-sectional view taken along line B-B in FIG. 13, and FIG. 16 is a schematic view illustrating the semiconductor light emitting device of FIG. 13, after the p-side electrode, the n-side electrode and the non-conductive reflective film have been removed therefrom.

The semiconductor light emitting device 1 includes a substrate 10, a buffer layer 20 grown on the substrate 10, an n-type semiconductor layer 30 grown on the buffer layer 20, an active layer 40 grown on the n-type semiconductor layer 30 for generating light by electron-hole recombination, and a p-type semiconductor layer 50 grown on the active layer 40.

The substrate 10, which may eventually be removed, is typically made of sapphire, SiC, Si, GaN or the like, and the buffer layer 20 can be omitted. When the substrate 10 has been removed or the substrate 10 is conductive, an n-side bonding pad 80 may be formed either on the n-type semiconductor layer 30 side after the substrate 10 had been removed, or on the conductive substrate 10 side. The positions of the n-type semiconductor layer 30 and p-type semiconductor layer 50 may be exchanged, and these semiconductor layers are typically made of GaN in case of Group III-nitride semiconductor light emitting devices. Each of the semiconductor layers 20, 30, 40, 50 may have a multilayered structure, and an additional layer may optionally be added thereto.

The p-type semiconductor layer 50 and the active layer 40 are partly removed by mesa etching and form two n-side contact areas 31 with the n-type semiconductor layer 30 being exposed. An n-side finger electrode 81 is then formed on the n-type semiconductor layer 30 in each of the n-side contact areas 31. The n-side contact areas 31 are expanded in parallel with one lateral face C of the semiconductor light emitting device. While the n-side contact areas 31 may be open to the lateral direction of the semiconductor light emitting device, their rims are preferentially enclosed and blocked by the active layer 40 and the p-type semiconductor layer 50 without being open to any of the lateral faces. The number of the n-side contact areas 31 may be higher or lower, and the array or configuration thereof may vary. The n-side finger electrode 81 preferentially includes a branch portion 88 being stretched, and a connecting part 89 to allow a greater width at one side end of the branch portion 88. Corresponding to this, the n-side contact area 31 has a smaller width at the part where the branch portion 88 of the n-side finger electrode 81 is disposed, and a greater width at the part where the connection portion 89 of the n-side finger electrode 81 is disposed.

Three p-side finger electrodes 93 are formed on the p-type semiconductor layer 50. The p-side finger electrodes 93 are formed in parallel with the n-side finger electrodes 81, in which one of the p-side finger electrodes is arranged between two n-side finger electrodes 81 and the other two p-side finger electrodes are arranged on both sides of the n-side finger electrodes, respectively. Therefore, the n-side finger electrodes 81 are placed in-between three p-side finger electrodes 93, respectively, in an alternate manner. Also, the p-side finger electrode 93 preferentially includes a branch portion 98 being stretched, and a connecting part 99 to allow a greater width at one side end of the branch portion 98. Meanwhile, as shown in FIG. 13, when the semiconductor light emitting device is seen in a top plan view, the connecting part 99 of the p-side finger electrode 93 is positioned on the opposite side of the connecting part 89 of the n-side finger electrode 81. That is to say, the connecting part 99 of the p-side finger electrode 93 is positioned on the left side, while the connecting part 89 of the n-side finger electrode 81 is positioned on the right side. The p-side finger electrode 93 is long stretched along one lateral C direction of the semiconductor light emitting device. For instance, in FIG. 13 and FIG. 16, it is long stretched from the left side to the right side. With these long stretched, plural p-side finger electrodes 93, the device can be placed on a mount (e.g., a sub-mount, a package, or a COB (Chip on Board)) in an upside-down position without leaning. In this regard, it is preferential to form the p-side finger electrodes 93 as long as possible.

A suitable height for the p-side finger electrodes 83 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Preferentially, a light absorption barrier film 95 is first formed on the p-type semiconductor layer 50 and then the p-side finger electrode 93 is formed above them. The light absorption barrier film 95 is formed in a manner that it is slightly wider than the p-side finger electrode 93. The light absorption preventing layer 95 serves to prevent the p-side finger electrode 93 from absorbing light that is generated in the active layer 40. The light absorption barrier film 95 may only serve to reflect part or all of the light generated in the active layer 40, or may only serve to stop the current flow from the p-side finger electrode 93 to the bottom thereof, or may serve both functions. To perform these functions, the light absorption barrier film 95 can be composed of a single layer that is made of a light transmitting material having a lower refractive index than the refractive index of the p-type semiconductor layer 50 (e.g., $SiO_2$), or multilayers (e.g., $SiO_2/TiO_2/SiO_2$), or a DBR, or a combination of the single layer and the DBR. In addition, the light absorption barrier film 95 can be made of a non-conductive material (e.g., a dielectric material such as $SiO_x$, $TiO_x$ or the like). Depending on the structure, a suitable thickness for the light absorption barrier film 95 would range from 0.2 µm to 3.0 µm. If the light absorption barrier film 95 is thinner than the range, it cannot function properly; and if the light absorption barrier film 95 is thicker than the range, it may be difficult to deposit the light transmitting conductive film 60 on the light absorption barrier film 95. Although the light absorption prevention film 95 does not always have to be made of a light transmitting material, or of a non-conductive material, the effects thereof may be enforced by incorporating a light transmitting dielectric material.

Preferentially, the light transmitting conductive film 60 is formed on the p-type semiconductor layer 50, prior to the formation of the light absorption barrier film 95 followed by the p-side finger electrode 93. The light transmitting conductive film 60 is formed on the p-type semiconductor layer 50 in such a way that it covers nearly the entire p-type semiconductor layer, but it does not cover the n-side contact area 31 that is formed by mesa etching. In this way, the light absorption barrier film 95 is disposed between the light transmitting conductive film 60 and the p-type semiconductor layer 50. Especially p-type GaN demonstrates poor current spreading capability. Also, when the p-type semiconductor layer 50 is made of GaN, the light transmitting conductive film 60 should be incorporated most of the time. For instance, a material such as ITO, Ni/Au or the like may be used for the light transmitting conductive film 60. Once the light transmitting conductive film 60 is formed, the light absorption barrier film 95 and then the p-side finger electrode 93 are formed above the light transmitting conductive film 60.

Following the formation of the n-side finger electrode 81 and the p-side finger electrode 93, a non-conductive reflective film 91 is formed in a manner that the both n-side contact area 31 including the n-side finger electrode 81 and the p-type semiconductor layer 50 including the p-side finger electrode 93 are covered all over with the non-conductive reflective film 91. The non-conductive reflective film 91 serves to reflect light from the active layer 40 towards the substrate 10 used for growing or towards the n-type semiconductor layer 30 if the substrate 10 has been removed. The non-conductive reflective film 91 preferentially covers the p-type semiconductor layer 50 that connects the upper face of the p-type semiconductor layer 50 and the upper face of the n-side contact area 31, as well as the exposed lateral face of the active layer 40. A person skilled in the art would understand that it is not absolutely necessary for the non-conductive reflective film 91 to cover the entire area of the etch-exposed n-type semiconductor layer 30 and p-type semiconductor layer 50 on the opposite side of the substrate 10.

The non-conductive reflective film 91 serves as a reflective film, yet it may preferentially be made of a light transmitting material, for example, a light transmitting dielectric material such as $SiO_x$, $TiO_x$, $Ta_2O_5$ or $MgF_2$, so as to prevent light absorption. The non-conductive reflective film 91 may be formed in various structures, including a single dielectric layer made of a light transmitting dielectric material such as $SiO_x$ (e.g., a single DBR including the combination of $SiO_2$ and $TiO_2$), heterogeneous plural dielectric films, or any combination of a dielectric film and a DBR, at a thickness ranging from 3 to 8 µm, for example. The dielectric film has a lower refractive index than the refractive index of the p-type semiconductor layer 50 (e.g., GaN) such that it can reflect part of the light incident at a greater angle than the critical angle towards the substrate 10. Meanwhile, the DBR can reflect a greater amount of light towards the substrate 10, and may be designed for a specific wavelength such that it can effectively reflect light according to the wavelength of the light generated.

Preferentially, as can be seen in FIG. 14 and FIG. 15, the non-conductive reflective film 91 has a dual structure of a DBR 91a and a dielectric film 91b. As the deposition of the DBR 91a needs to be done with high precision, the dielectric film 91b having a uniform thickness is formed prior to the deposition such that the DBR 91b may be prepared in a stable manner, and light reflection may also benefit therefrom.

During the manufacture of a semiconductor light emitting device according to the present disclosure, a step (or bump) may be created by mesa etching for forming the n-side contact area 31, and thus a component such as the p-side finger electrode 93 or the n-side finger electrode 81 is required to accommodate the step. Even after the non-conductive reflective film 91 is formed, a perforation process as described in detail below is still required to make an opening in the non-conductive reflective film 91. Thus, extra caution should be paid especially during the formation of the dielectric film 91b.

The dielectric film 91b is suitably made of $SiO_2$, and it preferentially has a thickness ranging from 0.2 µm to 1.0 µm. If the dielectric film 91b is thinner than the range, it is not sufficiently thick enough to sufficiently cover the n-side finger electrode 81 and p-side finger electrode 93 having a height ranging from 2 µm to 3 µm; and if the dielectric film 91b is thicker than the range, it would make the subsequent perforation process more difficult. The dielectric film 91b may be thicker than the DBD 91b that comes next. Moreover, it is necessary to form the dielectric film 91b by a more suitable method to ensure the reliability of the device. For example, it is preferential to form the dielectric film 91b made of $SiO_2$ by CVD (Chemical Vapor Deposition), or inter alia, by PECVD (Plasma Enhanced CVD). This is because steps are created during the formation of the n-side contact area 31, the p-side finger electrode 93 and the n-side finger electrode 81 by mesa etching, and because a CVD such as E-beam evaporation is more advantageous than PVD (Physical Vapor Deposition) to cover the steps. More specifically, if the dielectric film 91b is formed by E-beam evaporation, the dielectric film 91b may be formed into a thin film on the lateral faces of the p-side finger electrode 93 and n-side finger electrode 81 having steps, or on the tilted step faces generated by mesa etching. Meanwhile, if a thinner dielectric film 91b is formed on the step face, and especially if the p-side finger electrode 93 and the n-side finger electrode 81 are placed below the p-side electrode 92 and the n-side electrode 80 as described below, a short might occur between the electrodes. Therefore, in order to ensure insulation, the dielectric film 91b is preferentially formed by CVD. Accordingly, it is possible to secure the reliability of the semiconductor light emitting device, while ensuring those functions of the dielectric film as the non-conductive reflective film 91.

The DBR 91a is formed on the dielectric film 91b, and the DBR 91a and the dielectric film 91b together form the non-conductive reflective film 91. For example, the DBR 91a having alternating layers of the combination of $TiO_2$/$SiO_2$ is preferentially formed by PVD, and inter alia, by E-beam evaporation, sputtering or thermal evaporation. When the DBR 91a is made of the combination of $TiO_2$/$SiO_2$, each layer is designed to have an optical thickness of one fourth of a given wavelength, and the number of its combinations is suitably between 4 and 20 pairs. This range is set because if the number of pairs is smaller than the range, the reflectivity of the DBR 91a may be degraded; and if the number of pairs is larger than the range, the DBR 91a may become excessively thick.

With the non-conductive reflective film 91 thus formed, the p-side finger electrode 93 and the n-side finger electrode 81 are fully covered with the non-conductive reflective film 91. To enable the p-side finger electrode 93 and the n-side finger electrode 81 to electrically communicate with the p-side electrode 92 and the n-side electrode 80 described below, openings that pass through the non-conductive reflective film 91 are formed, and the openings are then filled with an electrode material to form electrical connections 94, 82. These openings are preferentially formed by dry etching or wet etching or both. As the p-side finger electrode 93 and the n-side finger electrode 81 have narrow-width branch portions 98, 88 respectively, the electrical connections 94, 82 are preferentially formed on the connection parts 99, 89 of the p-side finger electrode 93 and the n-side finger electrode 81, respectively. In absence of the p-side finger electrode 93, a number of electrical connections 94 should be formed and connected directly to the light transmitting conductive film 60 that is prepared on nearly the entire face of the p-type semiconductor layer 50. Likewise, in absence of the n-side finger electrode 81, a number of electrical connections 82 should be formed and connected directly to the n-side contact area 31. However, these do not necessarily make it easier to form a satisfactory electrical contact between the p-side electrode 92 and the light transmitting conductive film 60, and between the n-side electrode 80 and the n-type semiconductor layer 30, and many problems also occur during the manufacturing process. Meanwhile, according to the present disclosure, prior to the formation of the non-conductive reflective film 91, the n-side finger electrode 81 is formed on the n-side contact area 31, and the p-side finger electrode 93 is formed either on the p-type semiconductor layer 50 or preferentially on the light transmitting conductive film 60, and these electrodes are then subjected to heat treatment, thereby establishing a stable electrical contact between both sides.

Once the electrical contact portions 94, 82 are formed, it is desirable to form the p-side electrode 92 and the n-side electrode 80. Considering that the p-side electrode 92 and the n-side electrode 80 contribute to reflecting light from the active layer 40 towards the substrate 10, those electrodes are formed over a broad area to be able to cover the entire or nearly the entire upper part of the non-conductive reflective film 91, thereby serving as a conductive reflective film. However, the p-side electrode 92 and the n-side electrode 80 are preferentially formed at a distance from each other on the non-conductive reflective film 91. As such, there exists a part on the non-conductive reflective film 91, which is covered neither by the p-side electrode 92 nor by the n-side electrode 80. While the p-side electrode 92 or the n-side electrode 80 may suitably be made of a material having a good reflectance (e.g., Al, Ag or the like), it is preferential to combine the high-reflectance material (e.g., Al, Ag or the like) with Cr, Ti, Ni, Au or any alloy thereof for obtaining a stable electrical contact. The p-side electrode 92 and the n-side electrode 80 serve to supply current to the p-side finger electrode 93 and the n-side finger electrode 82; to connect the semiconductor light emitting device with external equipment; and to reflect the light from the active layer 40 and/or dissipate the heat, by occupying a broad area. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light emitting device according to the present disclosure is bonded to a mount (e.g., a sub-mount, a package or a COB). This advantage becomes more apparent especially when the eutectic bonding method is applied.

As the p-side electrode 92 and the n-side electrode 80 formed occupy a greater portion on the non-conductive reflective film 91, both the p-side finger electrode 93 and the n-side finger electrode 81 are placed below the non-conductive reflective film 91. Here, the p-side finger electrode 93 is long stretched down by passing through the bottom of the n-side electrode 80 placed directly on the non-conductive reflective film 91, and the n-side finger electrode 81 is long stretched down by passing through the bottom of the p-side electrode 92 placed directly on the non-conductive reflective film 91. The non-conductive reflective film 91 present between the p-side electrode 92 and the n-side electrode 80, and between the p-side finger electrode 93 and the n-side finger electrode 81 prevents a short between the electrodes 92, 80 and between the finger electrodes 93, 81. Further, by introducing the p-side finger electrode 93 and the n-side finger electrode 81 as described above into the formation of a flip-chip, it becomes possible to supply current to the semiconductor layer areas of interest, without restriction.

In general, the p-side electrode 92, the n-side electrode 80, the p-side finger electrode 93 and the n-side finger electrode 81 are made of multiple metal layers. In case of the p-side finger electrode 93, the bottom layer thereof should have a high bonding strength with the light transmitting conductive film 60. To this end, a material such as Cr or Ti is typically used, but other materials such as Ni, Ti or TiW can also be used as there are no particular limitations regarding this matter. A person skilled in the art should understand that Al or Ag having a high reflectance can also be employed for the p-side finger electrode 93 and the n-side finger electrode 81. In case of the p-side electrode 92 and the n-side electrode 80, Au is used for their top layers for wire bonding or for the connection with an external electrode. Meanwhile, in order to reduce the amount of Au used and to offset a relatively low hardness of Au, other material such as Ni, Ti, TiW or W can be employed between the bottom layer and the top layer, depending on the specifications required. Also, when a high reflectance is required, Al or Ag can be employed. In this disclosure, Au could be considered for use as the top layer since the p-side finger electrode 93 and the n-side finger electrode 81 need to be electrically connected to the electrical connections 94, 82. However, the inventors found out that it is not appropriate to use Au as the top layer for the p-side finger electrode 93 and the n-side finger electrode 81, because the Au gets easily peeled off due to a weak bonding strength between the Au and the non-conductive reflective film 91 at the time of deposition of the non-conductive reflective film 91 onto the Au top layer. To resolve this problem, other material such as Ni, Ti, W, TiW, Cr, Pd or Mo was adopted in place of Au to form the top layer of the finger electrodes. In this way, the bonding strength between the top layer with the non-conductive reflective film 91 to be deposited on the top layer is retained and the reliability can thus be improved. Further, one of those metals mentioned above is fully capable of functioning as a diffusion barrier while forming an opening in the non-conductive reflective film 91, for the electrical connection 94, which can be helpful for ensuring the security of the subsequent processes and the electrical connects 94, 82.

Figure 17:
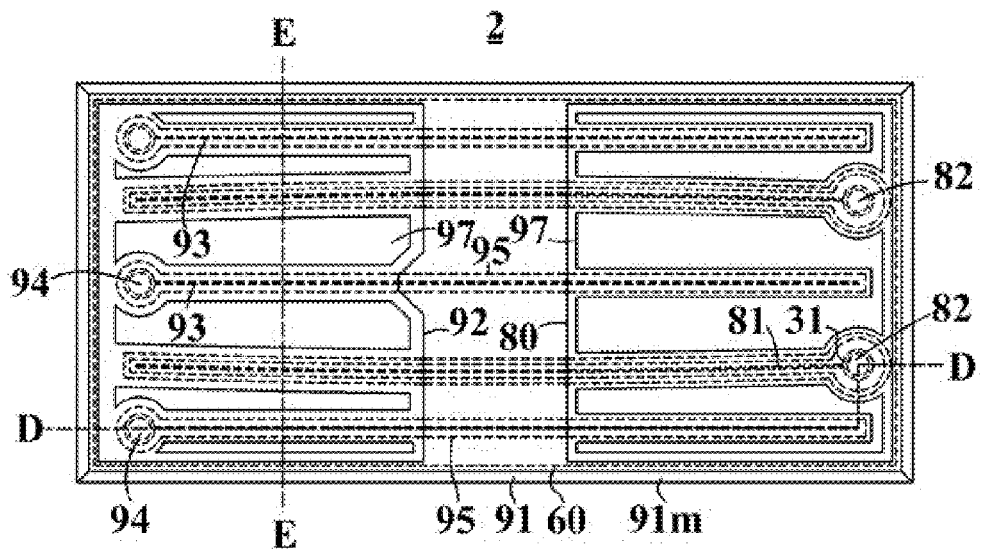
FIG. 17 is a schematic view illustrating a still further exemplary embodiment of a semiconductor light emitting device according to the present disclosure.
Figure 18:
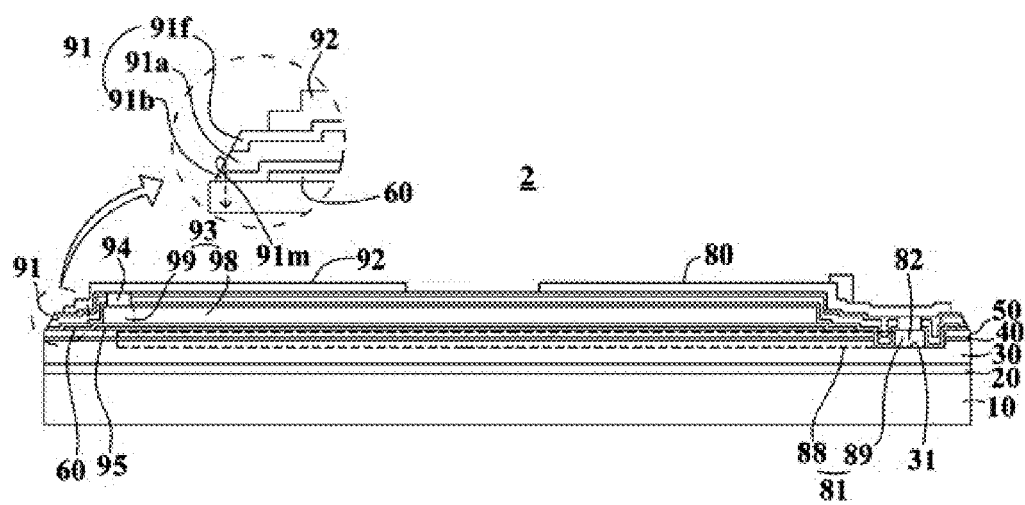
FIG. 18 is a cross-sectional view taken along line D-D in FIG. 17.
Figure 19:
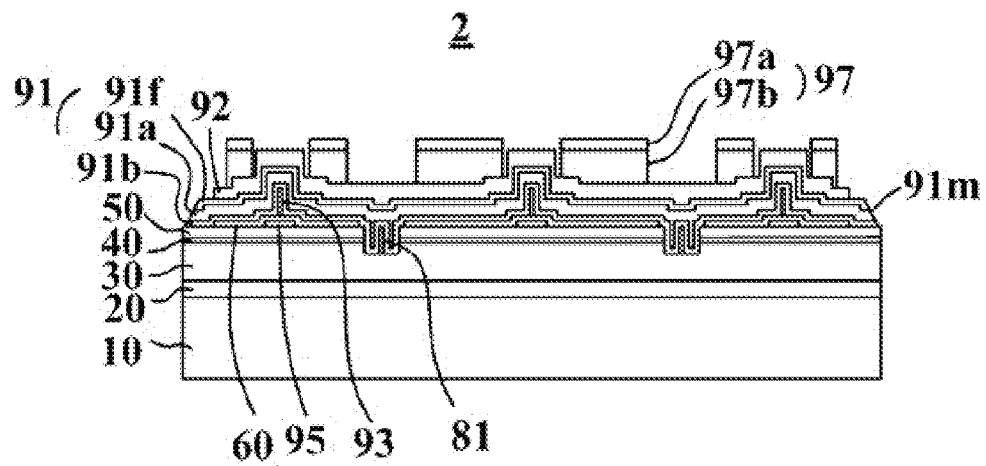
FIG. 19 is a cross-sectional view taken along line E-E in FIG. 17.

FIG. 17 is a view illustrating another exemplary embodiment of the semiconductor light emitting device according to the present disclosure, FIG. 18 is a cutaway portion taken along line D-D of FIG. 17, and FIG. 19 is a cutaway portion taken along line E-E of FIG. 17.

As can be seen in FIG. 18 and FIG. 19, in a semiconductor light emitting device 2 according to the present disclosure, a non-conductive reflective film 91 further includes, in addition to a dielectric film 91b and a DBR 91a, a clad film 91f to be formed on the DBR 91a. Although a large portion of light generated in the active layer 40 is reflected by the dielectric film 91b and the DBR 91a towards an n-side semiconductor layer 30, part of the light is trapped inside the dielectric film 91b and the DBR 91a as they also have a certain thickness, or emitted through the lateral faces of the dielectric film 91b and the DBR 91b. The inventors tried to analyze the relationships among the dielectric film 91b, the DBR 91a and the clad film 91f, from the perspective of an optical waveguide. The optical waveguide is a structure that encompasses the propagation part of light by a material having a lower refractive index than the refractive index of the light propagation part and guides the light utilizing total internal reflection. In this regard, if the DBR 91a is taken as the propagation part, the dielectric film 91b and the clad film 91f can be considered as part of the structure that encompasses the propagation part. When the DBR 91a is made of $SiO_2/TiO_2$, with $SiO_2$ having a refractive index of 1.46 and $TiO_2$ having a refractive index of 2.4, an effective refractive index (which means an equivalent refractive index of light that can travel in a waveguide that is made of materials having different refractive indices, and has a value between 1.46 and 2.4) of the DBR 91a is higher than the refractive index of the dielectric film 91b made of $SiO_2$. The clad film 91f is also made of a material having a lower effective refractive index than the refractive index of the DBR 91a. Preferentially, the clad film 91f has a thickness which desirably ranges from $\lambda/4n$ to 3.0 μm, in which $\lambda$ denotes a wavelength of the light generated in the active layer 40, and n denotes a refractive index of a material constituting the clad film 91f. By way of example, the clad film 91f can be formed of $SiO_2$, a dielectric having a refractive index of 1.46. When $\lambda$ is 450 nm (4500 Å), the clad film 91f can be formed in a thickness of 771 Å (4500/4×1.46=771 Å) or more. Considering that the top layer of the DBR 91a made of multiple pairs of $SiO_2/TiO_2$ can be made of a $SiO_2$ layer having a thickness of $\lambda/4n$, it is desirable that the clad film 91f is thicker than $\lambda/4n$ to be distinguished from the top layer of the DBR 91a that is placed below the clad film 91f. Although it is not desirable for the top layer of the DBR 91a to be too thick (e.g., 3 μm or more), imposing a burden on the subsequent perforation process and only increasing the material cost without contributing to the improvement of the efficiency, it is not impossible, depending on the case, to make the top layer as thick as 3.0 μm or more. When the DBR 91a comes into direct contact with the p-side electrode 92 and the n-side electrode 80, part of the light travelling through the DBR 91a might be affected by the p-side electrode 92 and the n-side electrode 80 and then absorbed. However, inserting the clad film 91f having a lower refractive index than the refractive index of the DBR 91a between the p- and n-side electrodes (92, 80) and the DBR 91a can minimize the partial absorption of the light traveling through the DBR 91a by the p-side electrode 92 and the n-side electrode 80, thereby increasing the efficiency of light absorption. Accordingly, the clad film 91f should generally have at least a thickness corresponding to the wavelength of light to achieve the effect described above, and therefore it preferentially has a thickness of at least $\lambda/4n$. Meanwhile, if there is a big difference between the refractive index of the DBR 91a and the refractive index of the clad film 91f, the DBR 91a may restrict light more strongly such that a thinner clad film 91f could be used to avoid that. However, if the difference between the refractive indices is small, the clad film 91f is needed to be sufficiently thick to obtain the effect described above. Thus, the thickness of the clad film 91f is determined with full consideration of a difference between the refractive index of a material constituting the clad film 91f and the effective refractive index of the DBR 91a. For instance, suppose that the clad film 91f is made of $SiO_2$, and the DBR 91a is made of $SiO_2/TiO_2$. Then a suitable thickness for the clad film 91f will be at least 0.3 μm to be distinguished from the top layer of the DBR 91a made of $SiO_2$. On the other hand, the upper limit of the thickness of the clad film 91f is preferentially between 1 μm and 3 μm, not to impose any burden on the subsequent perforation process.

The clad film 91f is not particularly limited as long as its refractive index is lower than the effective refractive index of the DBR 91a, and can also be made of a metal oxide such as $Al_2O_3$, a dielectric film such as $SiO_2$ or SiON, or other material such as MaF or CaF. If a difference in the refractive indices is small, the clad film should be made thicker to obtain the desired effect. Also, in case of using $SiO_2$ for the clad film, it is desirable to use $SiO_2$ having a refractive index lower than 1.46 to be able to increase the efficiency.

Optionally, the dielectric film 91b may be omitted. Also, although not desirable from the perspective of an optical waveguide, there is no reason to exclude the configuration composed of the DBR 91a and the clad film 91f, when the overall technical idea of this disclosure is taken into consideration. Alternatively, a $TiO_2$ dielectric film may be used in place of the DBR 91a. Further, as an alternative, the clad film 91f may be omitted if the DBR 91a includes a $SiO_2$ layer on the top thereof.

The non-conductive reflective film 91, which is composed of the DBR 91a having a high effective reflectance, and the dielectric film 91b and the clad film 91f, each having a low reflectance, disposed on the top and bottom of the DBR 91a, respectively, serves as an optical waveguide, and preferentially has a combined thickness of 3 to 8 μm. Also, the non-conductive reflective film 91 preferentially has a slant face 91m at the corner. This slant face 91m can be formed, for example, by a dry etching process. Among light rays incident on the non-conductive reflective film 91 that serves as an optical waveguide, the light rays that are incident on the non-conductive reflective film 91 at right angles or almost at right angles are well reflected towards the substrate 10, while some light rays including those that are incident on the non-conductive reflective film 91 at an oblique angle are not reflected towards the substrate 10, but can be trapped inside the DBR 91a that serves as a propagation part and then propagated to the lateral face. As such, the light rays propagated to the lateral surface of the DBR 91a are either emitted to the outside from the slant face 91m at the corner of the non-conductive reflective film 91, or reflected towards the substrate 10. That is to say, the slant face 91m at the corner of the non-conductive reflective film 91 serves as a corner reflector, and contributes to the improved luminance of the semiconductor light emitting device. The slant face 91m is suitably at an angle ranging from 50 to 70 degrees, to facilitate the light reflection towards the substrate 10. The slant face 91m can easily be formed by wet etching, dry etching, or both.

Figure 20:
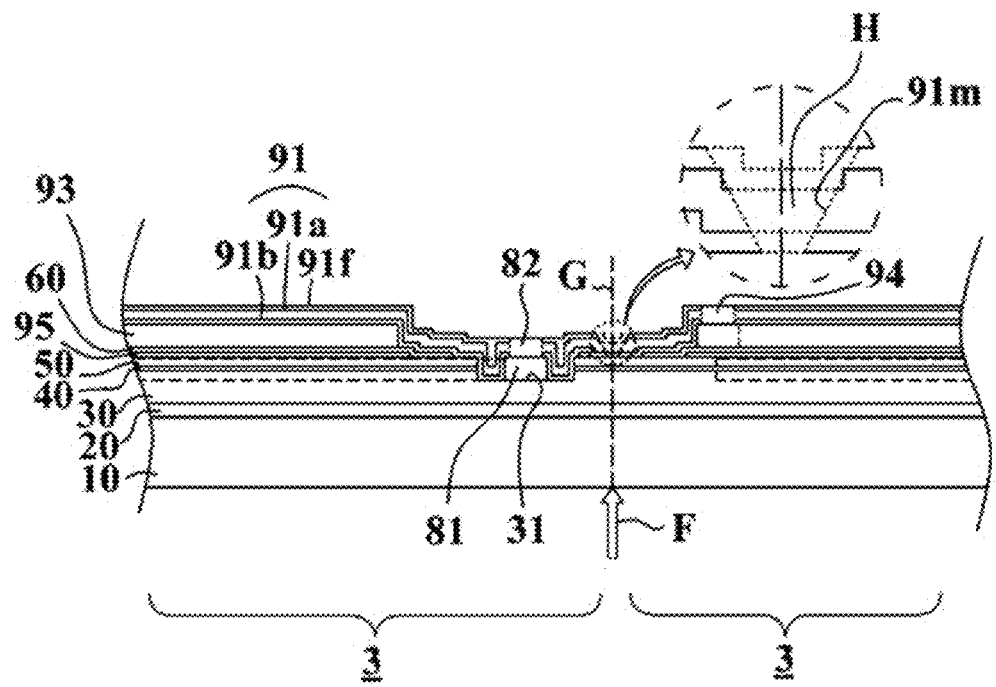
FIG. 20 is a schematic view illustrating a state of two semiconductor light emitting devices before they are split into independent semiconductor light emitting devices during the manufacture of a semiconductor light emitting device.
Figure 21:
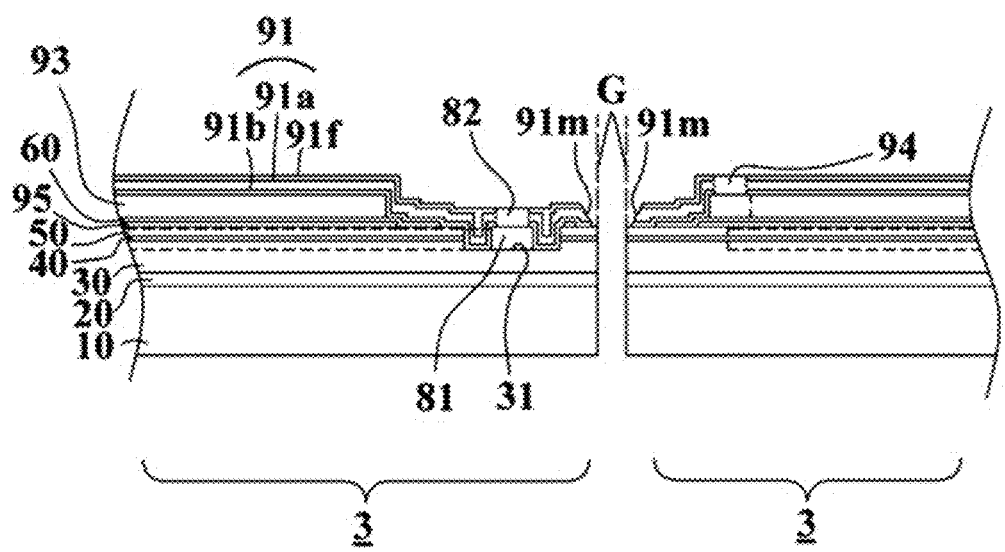
FIG. 21 is a schematic view illustrating a state of two semiconductor light emitting devices after they are split into independent semiconductor light emitting devices during the manufacture of a semiconductor light emitting device.

FIG. 20 is a view illustrating a state of two semiconductor light emitting devices before they are split into separate semiconductor light emitting devices, during the manufacture of a semiconductor light emitting device; and FIG. 21 is a view illustrating a state of two semiconductor light emitting devices after they are split into separate semiconductor light emitting devices, during the manufacture of a semiconductor light emitting device. For one's information, those semiconductor light emitting devices 3, shown in FIG. 20 and FIG. 21 for explaining the fabrication process, are in a state where none of the p-side electrode 92, n-side electrode 80 and bonding pad 97 is formed.

Usually a semiconductor light emitting device is first prepared in a wafer form including a multitude of semiconductor light emitting devices, and then split into separate semiconductor light emitting devices by cutting, such as breaking, sawing, or scribing-and-breaking. In the scribing-and-breaking operation, the scribing process employs a laser and can be performed by focusing the laser onto the substrate of the semiconductor light emitting device, in which the substrate has a surface and an interior. In this scribing process employing the laser, the semiconductor light emitting device 3 is preliminarily cut along the boundary G of the rim of the semiconductor light device 3, i.e., along the boundary G between the semiconductor light emitting device 3 and another neighboring semiconductor light emitting device 3. These preliminarily cut semiconductor light emitting device is completely split into separate semiconductor light emitting devices through the breaking process that is performed following the scribing process. The breaking process is performed by applying an external force along the boundary G between the semiconductor light emitting device 3 and another neighboring semiconductor light emitting device 3, for example, in the direction of the substrate 10 indicated by an arrow F in FIG. 20, or in the opposite direction thereof. In this breaking process, the substrate 10 and the semiconductor layers 20, 30, 40, 50, which are crystalline, can be cut precisely along the boundary G; while the non-conductive reflective film 91 on the p-type semiconductor layer 50, which is amorphous, cannot be cut precisely along the boundary G, and cracks are likely to occur in the areas around the rim of the non-conductive reflective film 91, causing a damage thereto. The damage to the areas around the rim of the non-conductive reflective film 91 leads to poor yields due to those appearance defects. Preferentially, during the manufacture of a semiconductor light emitting device, a plurality of semiconductor light emitting devices is prepared in a wafer form, and then a certain area H of the non-conductive reflective film 91 around the boundary G between a semiconductor light emitting device and another neighboring semiconductor light emitting device is eliminated, prior to the scribing and braking processes using a laser for splitting the semiconductor light emitting device of interest into separate ones. The certain area H of the non-conductive reflective film 91 to be eliminated along the boundary G of the semiconductor light emitting device 3 corresponds to a rim area of the non-conductive reflective film 91, if taken from the viewpoint of the semiconductor light emitting device. The elimination of a certain area H of the non-conductive reflective film 91 around the boundary G can also indicate that the non-conductive reflective film 91 present in one semiconductor light emitting device, and the non-conductive reflective film 91 of another neighboring semiconductor light emitting device are spaced apart from each other, before the semiconductor light emitting device is split into individual ones. With a portion of the area of the rim of the non-conductive reflective film 91 being eliminated, even if the subsequent scribing and breaking processes may be performed using a laser, the appearance defect caused by the damaged rim of the non-conductive reflective film 91 of each semiconductor light emitting device can be avoided, thereby increasing yields. The elimination of a certain area H of the non-conductive reflective film 91 can be carried out by dry etching, and it should be performed prior to the breaking process in the overall semiconductor fabrication process. However, while forming an opening that passes through the non-conductive reflective film 91 to obtain electrical connections 94, 82, it is preferential to form those electrical contacts together with the openings. Although the slant face 91m serving as a corner reflector can be obtained by a separate etching process, those slant faces can be formed simultaneously in a process of eliminating the rim area of the non-conductive reflective film 91 to avoid damage, by etching the rim part of the non-conductive reflective film 91 of an individual semiconductor light emitting device into a slant face 91m.

As can be seen in FIG. 17 and FIG. 19, a bonding pad 97 can be present on the p-side electrode 92 and on the n-side electrode 80, as a part of each of the p-side electrode 92 and the n-side electrode 80. The top face of the bonding pad 97 on the p-side electrode 92 has the same height as the top face of the bonding pad 97 on the n-side electrode 80. That is to say, the top face of the bonding pad 97 on the p-side electrode 92 and the top face of the bonding pad on the n-side electrode 80 are on the same plane. When a semiconductor light emitting device is coupled with external equipment by, for example, the eutectic bonding method, those bonding pads 97 allow the p-side electrode 92 and the n-side electrode 80 to have an equal final height to thus prevent any tilting on the mount, provide a broad, flat coupling face to obtain excellent bonding strength, and dissipates the heat from the inside of the semiconductor light emitting device to the outside. A plurality of bonding pads 97 can be present on the p-side electrode 92 and on the n-side electrode 80, respectively, provided that the bonding pads 97 are preferentially formed on the positions where the n-side finger electrode 81 and the p-side finger electrode 93 are not overlapped, i.e., in-between the n-side finger electrode 81 and the p-side finger electrode 93. In other words, the bonding pads 97 are formed on the areas, except on a part of the p-side finger electrode 93 corresponding to the most protruded portion and a part of the n-side finger electrode 81 corresponding to the lower most recessed portion. In addition, the bonding pad 97 can have a dual layer structure including an underlying spacer layer 97a and a bonding layer 97b overlying the spacer layer 97a, and has a combined thickness of 5 to 6 µm, for example. In one example, the spacer layer 97a may be made of a metal layer including Ni, Cu and a combination thereof, and the bonding layer 97b may be composed of a eutectic bonding layer including a Ni/Sn, Ag/Sn/Cu, Ag/Sn, Cu/Sn or Au/Sn combination such that it has a thickness of about several µm. The spacer layer 97a can serve as a diffusion barrier as well as wetting layer for a solder used in the eutectic bonding, and reduces the cost burden as compared with a case where the bonding pad 97 is entirely formed of a eutectic bonding layer 97b containing expensive Au. To match the final height of the bonding layer during bonding (e.g., eutectic bonding), the bonding pad 97 is preferentially formed to be taller than the most protruded part of the p- and n-side electrodes 92, 80, namely, the height of the upper part of the p-side finger electrode, by 1 to 3 µm. Accordingly, during the bonding operation, excellent bonding results are obtained between the semiconductor light emitting device and the mount, and heat dissipation of the semiconductor light emitting device is facilitated. Here, the spacer layer 97a and the bonding layer 97b can be formed by various methods, such as plating, E-beam evaporation, thermal evaporation or the like.

Referring back to FIG. 14 and FIG. 15, all areas of the n-type semiconductor layer 30, except the n-side contact area 31, is preferentially covered with the active layer 40 and the p-type semiconductor layer 50. That is to say, for the semiconductor light emitting device 100, the target etching area is limited to the n-side contact area 31, and there is no other area including the edges that are to be etched. Those lateral faces around the semiconductor light emitting device 100 are all cut faces obtained by the scribing-and-braking process or the like. As such, the area of the active layer 40 generating light increases and the light extraction efficiency is thus improved. Moreover, a minimal number step faces are produced from the etching process; namely, those step faces are limited to the exposed surface of the active layer 40 that connects the top face of the p-type semiconductor layer 50 with the top face of the n-side contact area 31, and the exposed surface of the p-type semiconductor layer 50. These exposed lateral faces of the active layer 40 and the p-type semiconductor layer 50 are the ones that are difficult, in particular, to deposit the DBR 91a constituting the non-conductive reflective film 91 in the formation of the non-conductive reflective film 91. Consequently, the DBR 91a on the exposed lateral faces of the active layer 40 and the p-type semiconductor layer 50 may have a relatively lower reflection efficiency. By minimizing the exposed lateral faces of the active layer 40 and the p-type semiconductor layer 50, it is possible to reduce areas having a low reflection efficiency in the DBR 91a to a minimum, thereby increasing the overall reflection efficiency.

Figure 22:
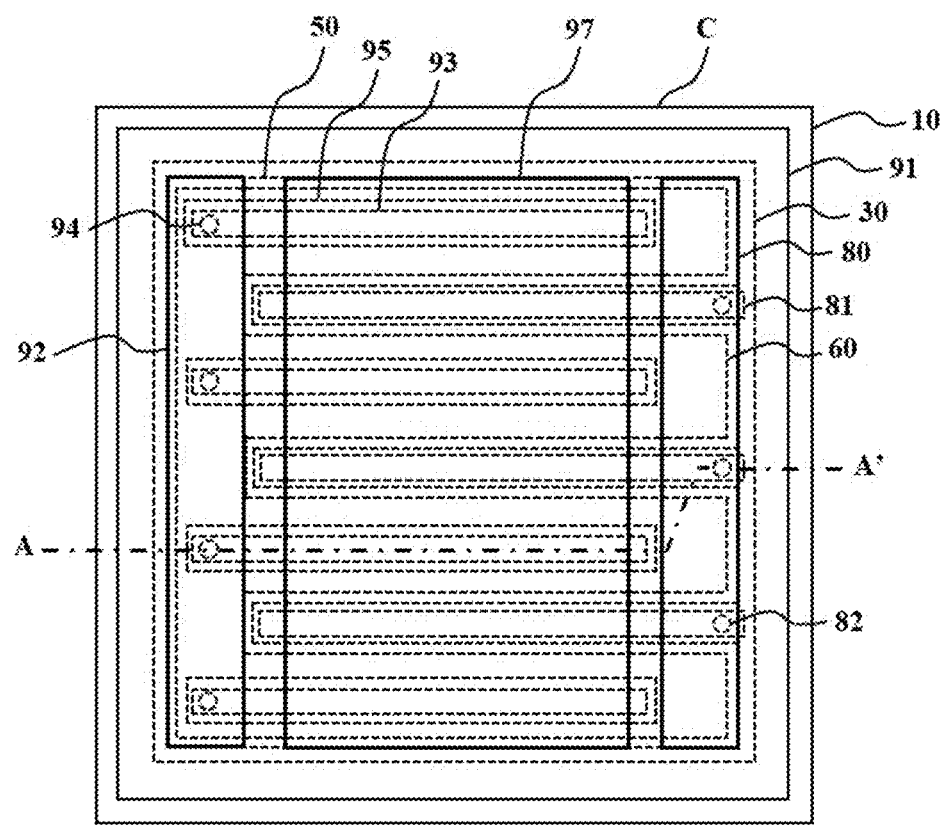
FIG. 22 is a schematic view illustrating a still further exemplary embodiment of a semiconductor light emitting device according to the present disclosure.
Figure 23:
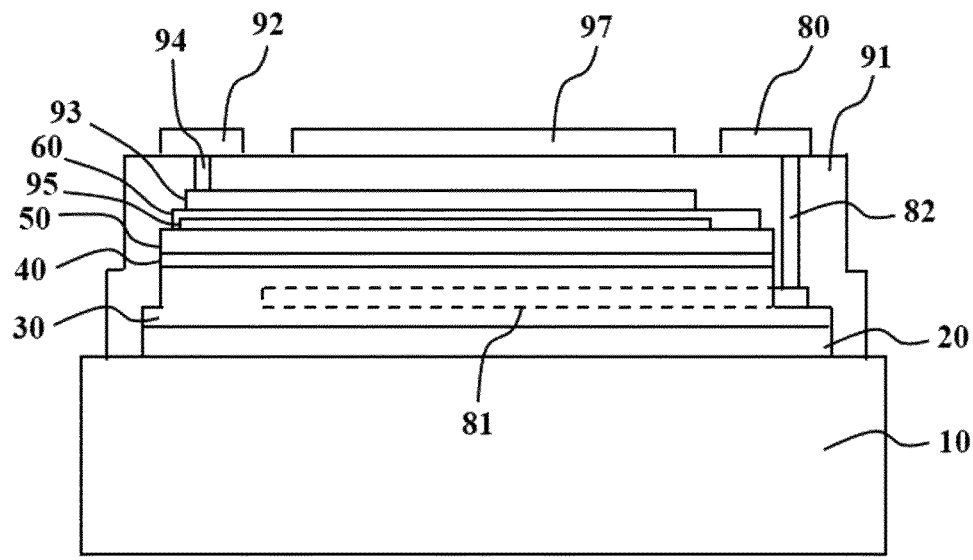
FIG. 23 is a cross-sectional view taken along line A-A' in FIG. 22.

FIG. 22 is a schematic view illustrating a still further exemplary embodiment of a semiconductor light emitting device according to the present disclosure, and FIG. 23 is a cross-sectional view taken along line A-A' in FIG. 22. The first feature of this embodiment is that the finger electrodes 93 above the p-type semiconductor layer 50 are isolated from each other, and connected to each other by an electrode 92 after going through the respective electrical connections 94. Here, the electrode 92 serves to supply current to the finger electrodes 93, to reflect light, to emit heat and/or to connect the device to the outside. Although it would be most desirable if the finger electrodes 93 are all isolated from one another, two or more finger electrodes 93 could be paired up and a branch portion that interconnects the finger electrodes 93 may be removed such that the overall height on top of the device is less irregular. The second feature of this embodiment is that the finger electrodes 93 are stretched along the direction of one lateral face C of the device. For example, in FIG. 22, the finger electrode 93 is extended from the electrode 92 towards the electrode 80. With these stretched finger electrodes 93, the device can be placed on a mount (e.g., a sub-mount, a package, or a COB (Chip on Board)) in an upside-down position without leaning. In this regard, it is preferential to form the finger electrodes 93 as long as possible. According to this embodiment, the finger electrodes 93 are arrayed below a non-conductive reflective film 91, they may be stretched passing the electrode 80. The third feature of this embodiment is that the electrode 80 overlies the non-conductive reflective film 91. The electrode 80 is connected with finger electrodes 81 through an electrical connection 82. The electrode 80 has the same functions as the electrode 92. With this configuration, the region where the electrode 80 is located is raised up as compared with the embodiment of FIG. 3, and thus the height difference between the electrode 92 and the electrode 80 is reduced when the device was coupled with the mount, resulting in more favorable coupling. This effect is magnified when eutectic bonding is used. The fourth feature of this embodiment is that the finger electrodes 81 can be arranged in the same manner as the finger electrodes 93. The fifth feature of this embodiment is that an auxiliary heat-emission pad 97 is provided. The auxiliary heat-emission pad 97 serves to discharge heat from the inside of the device to the outside and/or to reflect light. Moreover, the auxiliary heat-emission pad 97 is electrically isolated from the electrode 92 and/or the electrode 80, and thus it prevents an electrical contact between the electrode 92 and the electrode 80. The auxiliary heat-emission pad 93 might as well be used for bonding. In particular, when the auxiliary heat-emission pad 93 is electrically isolated from both the electrode 92 and the electrode 80, even if one of the electrode 92 and the electrode 80 might accidently have an electrical contact with the auxiliary heat-emission pad 93, this would not cause any problem to the overall electrical operation of the device. A person skilled in the art should understand that it is not mandatory for this embodiment to have all five features described above.

Figure 24:
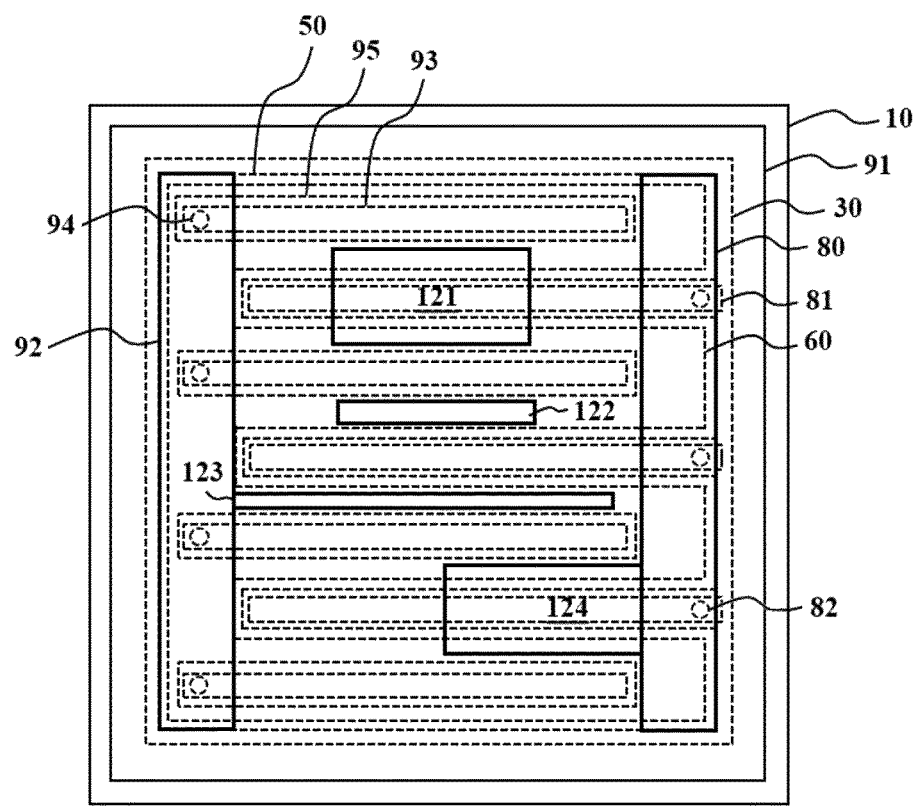
FIG. 24 is a schematic view illustrating a still further exemplary embodiment of a semiconductor light emitting device according to the present disclosure.

FIG. 24 is a schematic view illustrating a still further exemplary embodiment of a semiconductor light emitting device according to the present disclosure, in which different examples of an auxiliary heat-emission pad 121, 122, 123, 124 are arranged between the electrode 92 and the electrode 80. Preferentially, the auxiliary heat-emission pads 121, 122, 123, 124 are arranged between the finger electrodes 92, or between the finger electrode 92 and the finger electrode 81. As the auxiliary heat-emission pads 121, 122, 123, 124 are not formed on the finger electrode 92, the front face of the device may well be bonded to the mount during bonding (e.g. eutectic bonding), thereby facilitating heat emission from the device. The auxiliary heat-emission pad 121 and the auxiliary heat-emission pad 122 are isolated from the electrode 92 and the electrode 80; the auxiliary heat-emission pad 123 is connected with the electrode 92, and the auxiliary heat-emission pad 124 is connected with the electrode 80.

Figure 25:
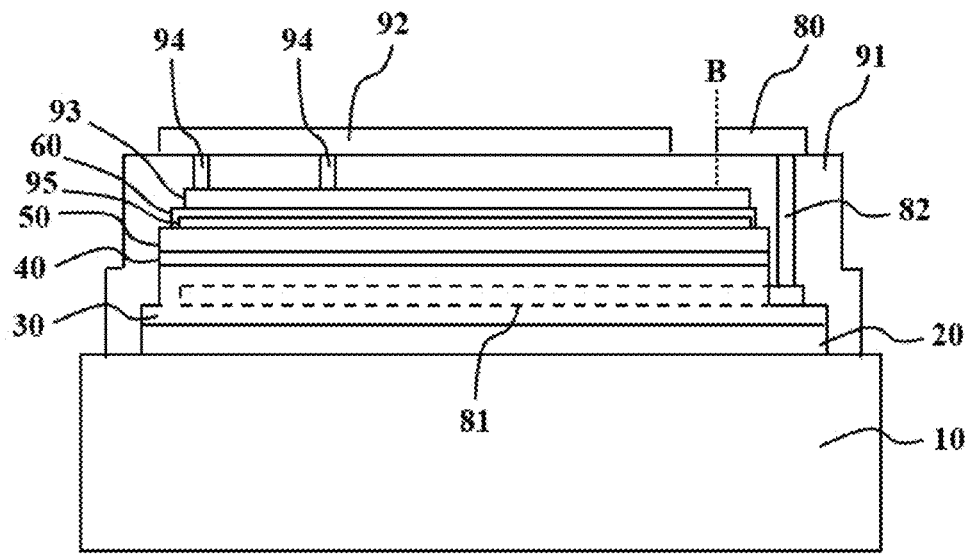
FIG. 25 is a schematic view illustrating a still further exemplary embodiment of a semiconductor light emitting device according to the present disclosure.

FIG. 25 is a schematic view illustrating a still further exemplary embodiment of a semiconductor light emitting device according to the present disclosure, in which the finger electrode 93 is stretched out until it reaches a level below the electrode 80 (passing the reference line B). In the production of a flip chip, introducing the finger electrode 93 onto a p-type semiconductor layer 50 makes it possible to supply current to a desired device region without restriction. Two electrical connections 94, 94 are provided, and they can be put at any necessary place according to requirements for current spreading. The electrical connection on the left hand side may be omitted. The electrode 92 doubles as an auxiliary heat-emission pad 97 (see FIG. 22). Even when the finger electrode 93 is not available, it is still possible to supply current to a light transmitting conductive film 60 by directly connecting the electrical connection 94 directly to the light transmitting conductive film 60, but it is not possible to supply current directly to the p-type semiconductor layer 50 below the electrode 80. By introducing the finger electrode 93, however, it becomes possible to supply current to those below the electrode 80 which supplies current to the n-type semiconductor layer 30. The same applies to the case where the electrical connection 82 is not available.

Figure 26:
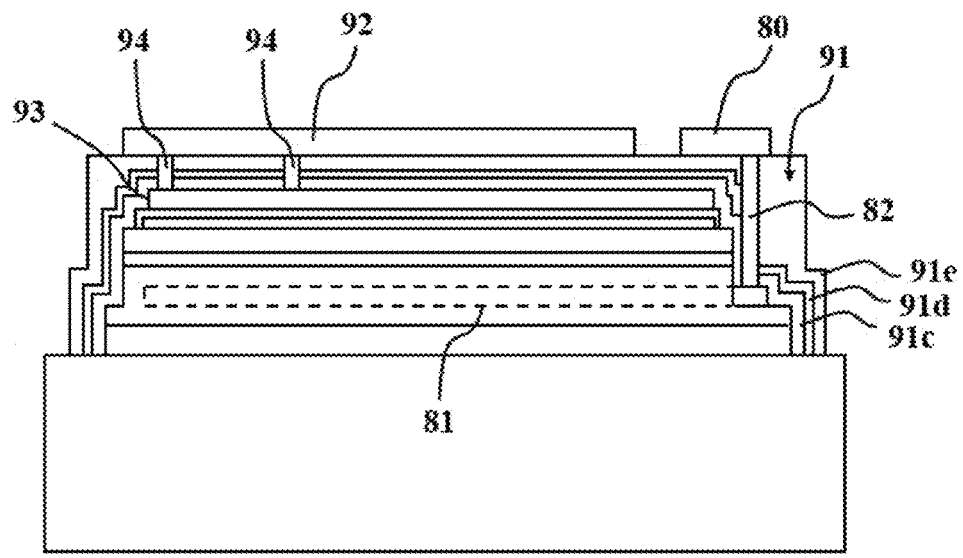
FIG. 26 is a schematic view illustrating a still further exemplary embodiment of a semiconductor light emitting device according to the present disclosure.

FIG. 26 is a schematic view illustrating a still further exemplary embodiment of a semiconductor light emitting device according to the present disclosure, in which a non-conductive reflective film 91 is composed of multilayered dielectric films 91c, 91d and 91e. For example, the non-conductive reflective film 91, which is composed of a $SiO_2$ dielectric film 91c, a $TiO_2$ dielectric film 91d and a $SiO_2$ dielectric film 91e, can serve as a reflective film. Preferentially, the non-conductive reflective film 91 is formed to have a DBR structure. When a semiconductor light emitting device is formed according to the present disclosure, a structure like the finger electrode 93 or the finger electrode 81 is needed, and a process for forming an electrical connection 94 or an electrical connection 82 should be carried out even after the non-conductive reflective film 91 had been formed. Now that the semiconductor light emitting device as a finished product can still experience current leakage and suffer from degraded reliability affected by the $SiO_2$ dielectric film 91c, one should be very careful in forming the $SiO_2$ dielectric film 91c. To this end, first of all, the dielectric film 91c should be made thicker than those subsequent dielectric films 91d and 91e. Secondly, it is necessary to form the dielectric film 91c by a method that is particularly suitable for ensuring the reliability of the device. For instance, CVD, in particular (preferentially) PECVD may be used for obtaining the $SiO_2$ dielectric film 91c, and PVD, in particular (preferentially) E-beam evaporation, sputtering or thermal evaporation may be used for obtaining the dielectric film 91d/dielectric film 91e made of a stack of alternating $TiO_2/SiO_2$ DBR, thereby ensuring the reliability of the resulting semiconductor light emitting device according to the present disclosure and ensuring the dielectric films' function as the non-conductive reflective film 91. This is because CVD is more advantageous than PVD (in particular, E-beam evaporation) for covering steps in a mesa etched region.

Figure 27:
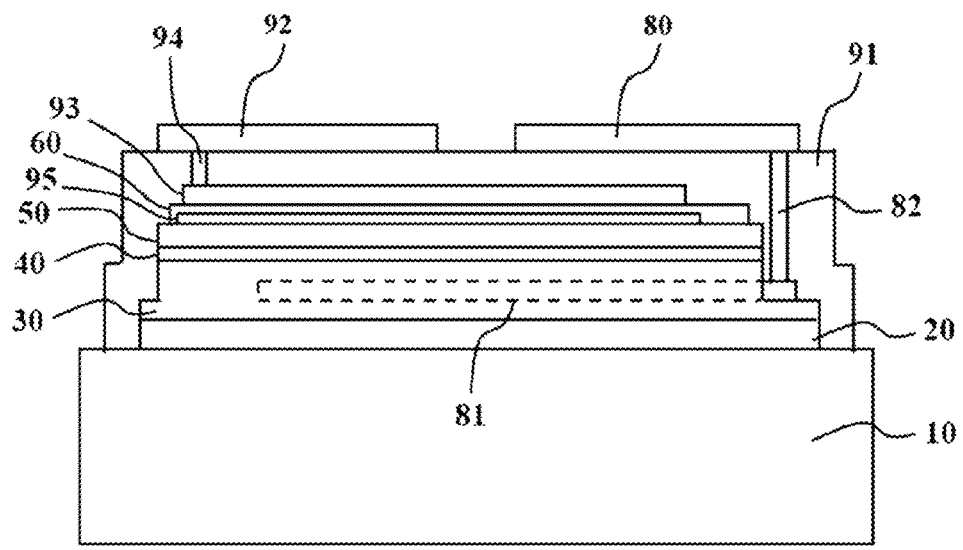
FIG. 27 is a schematic view illustrating a still further exemplary embodiment of a semiconductor light emitting device according to the present disclosure.

FIG. 27 is a schematic view illustrating a still further exemplary embodiment of a semiconductor light emitting device according to the present disclosure. In particular, it shows one example of an electrode part including a lower electrode, an upper electrode and an electrical connection for connecting the electrodes via an opening. At least one of an n-side electrode 80 (one example of the upper electrode in a first electrode part) and a p-side electrode 92 (one example of the upper electrode in a second electrode part), or preferentially both are soldering layers either made of Sn or containing Sn.

Figure 28:
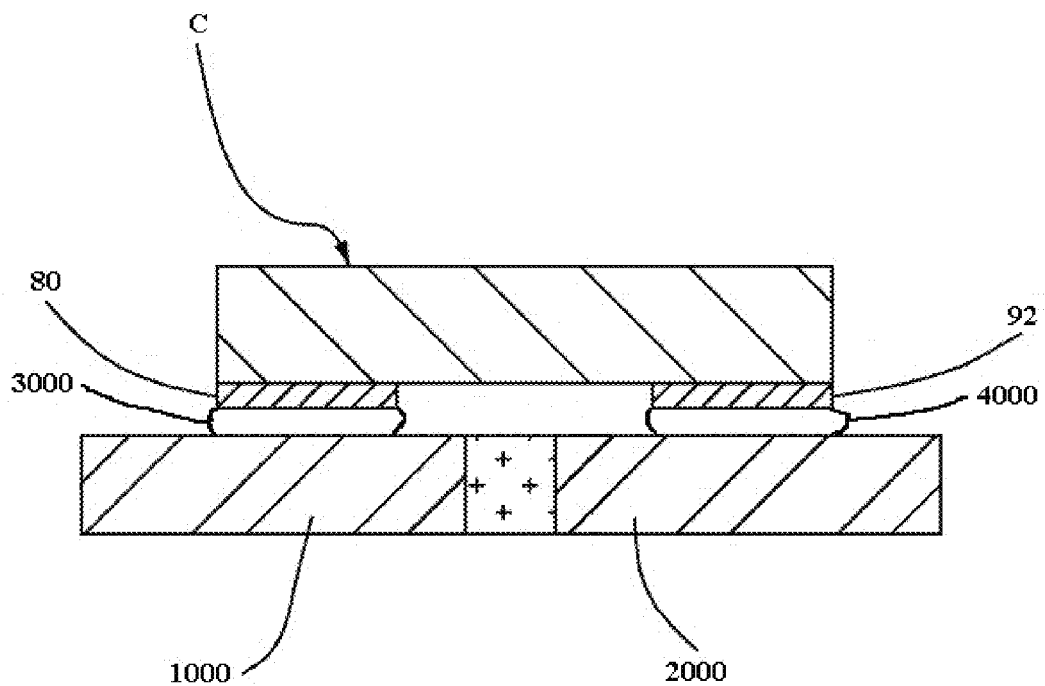
FIG. 28 is a schematic view illustrating an example of a state where the semiconductor light emitting device proposed in FIG. 27 is fixed to an external electrode.

FIG. 28 is a schematic view illustrating an example of a state where the semiconductor light emitting device proposed in FIG. 27 is fixed to an external electrode. Here, an n-side electrode 80 and a p-side electrode 92 of the semiconductor light emitting device or of a chip C of the semiconductor light emitting device shown in FIG. 27 are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C. The external electrodes 1000, 2000 are provided with solder materials 3000, 4000, respectively, and thus the n-side electrode 80 and the p-side electrode 92 are fixed to the external electrodes 1000, 2000 by soldering. As such, in the embodiment proposed in FIG. 28, the n-side and p-side electrodes are fixed to the external electrodes 1000, 2000 by soldering.

Meanwhile, the semiconductor light emitting device can be broken during eutectic bonding. This embodiment is intended to provide a solution for bonding processes in general including eutectic bonding by using a solder (a Sn solder, a Pb solder or the like). However, considering that a semiconductor light emitting device is manufactured using Au for top layers of the n-side and p-side electrodes 80, 90, Au or Ag may optionally be used in consideration of conductivity, with Au being usually chosen over oxidation-sensitive Ag. The inventors surprisingly discovered that when Au is used for a soldering layer of the electrode 80 or 92 of the semiconductor light emitting device to be soldered with a solder material 3000, 4000 provided in the external electrode 1000, 2000, bonding strength during soldering is not uniform. However, this problem was solved by using a Sn-based soldering layer.

Figure 29:
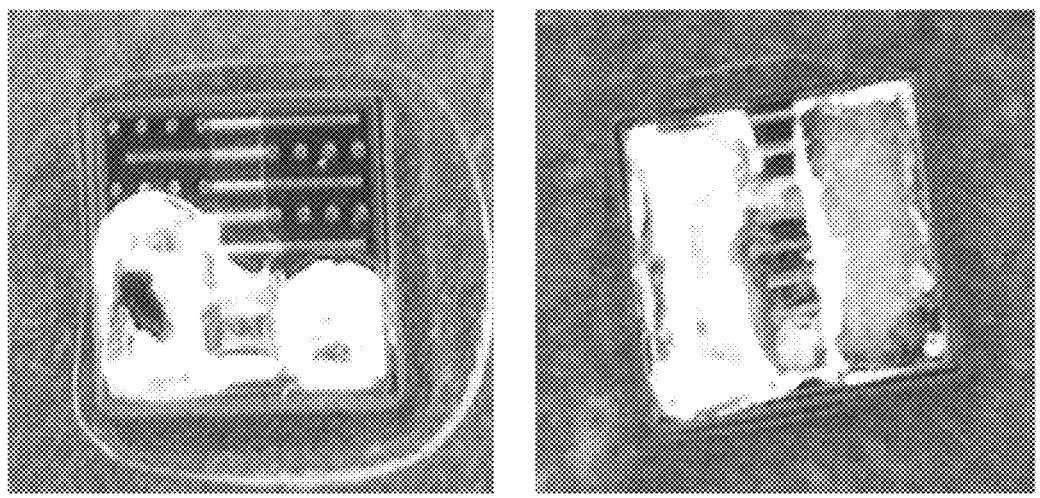
FIG. 29 shows photos of liquid tin spread on gold and tin at their own respective degrees.

FIG. 29 shows photos of liquid tin spread on gold and tin at their own respective degrees, in which the photo on the left hand side shows liquid tin spread on gold, and the photo on the right hand side shows liquid tin spread on tin. As can be seen in both photos, the degree of spread between Sn and Sn is greater than the degree of spread between Sn and Au. For an experiment, the reflow temperature (temperature for melting a solder) was set at 275° C., the reflow time was set at no more than 3 seconds, and an amount of a solder material was ⅓ of the area of a bump (electrode)).

While there is no particular limitation on the thickness of the soldering layers 80a and 92a, it is preferential to have a thickness of at least 5000 Å, more preferentially at least 1 μm, for secure joint with the solder material 3000, 4000. For example, the soldering layers 80a and 92a may have a thickness of 1.8 μm or 2.4 μm.

Figure 36:
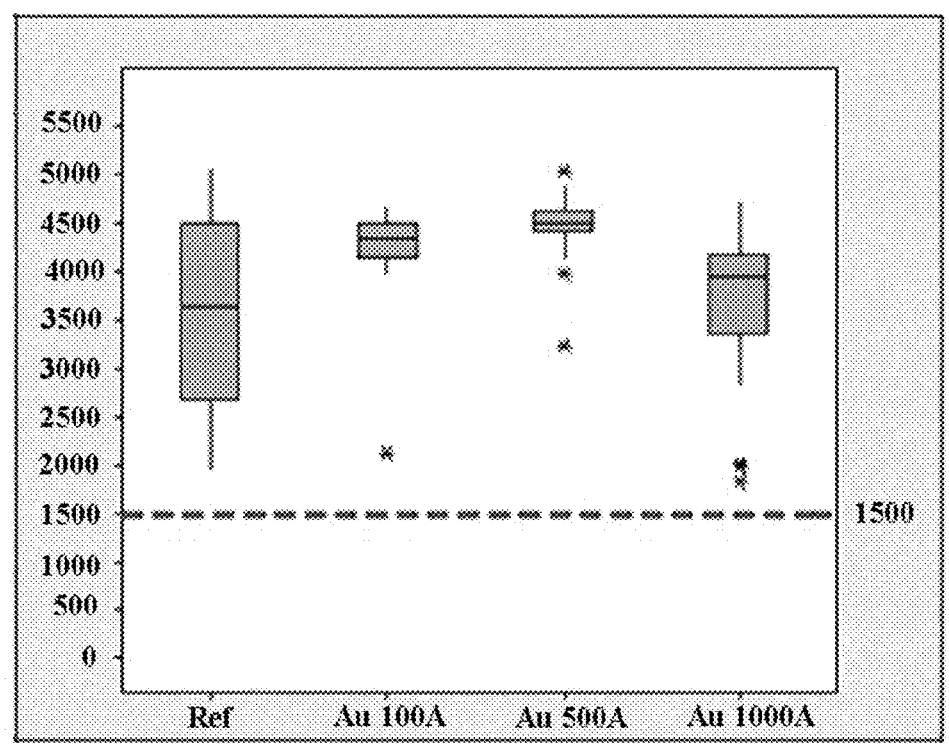
FIG. 36 is a graph showing the change in bonding strength with the thickness of an anti-oxidation layer.

Different bonding strengths of soldering layers are illustrated in FIG. 36. In the DTS (die shear test) used, the bonding strength of an Au soldering layer free of Sn was obtained and used as a reference value Ref. Then a Sn soldering layer 80, 92 made of Sn only, and Sn soldering layers with an overlaid thin anti-oxidation layer 80b, 92b made of Au of different thicknesses were tested to find out how the bonding strength changes with the thickness of Au. It turned out that the bonding strength keeps increasing until Au thickness reaches 500 Å, and then it gets decreased when Au thickness exceeds this level. Therefore, the bonding strength of the soldering layers which are made of Sn only or contain Sn falls between Ref and the bonding strength of 100 Å Au-overlaid Sn soldering layer. That is, a Sn soldering layer or Sn-based soldering layer showed an increased bonding strength as compared with the Au soldering layer.

When at least one of the n-side electrode 80 and the p-side electrode 92 is provided with the (thick) soldering layer 80a, 92a, a smaller amount of the solder material 3000, 4000 may be used, and the solder material 3000, 4000 may not burst much from between the n-side electrode 80 and the p-side electrode 92, or from the sides of the semiconductor light emitting device during soldering. From these perspectives, it would be preferential to make the soldering layer 80a, 90a thicker, but not too thick up to the point where thermal resistance can be increased. Therefore, a suitable range that is acceptable in the semiconductor process is between 1 and 5 μm. While the soldering layer 80a, 92a may contain Sn as a single ingredient, it may as well contain other additional materials besides Sn as an active ingredient, which are considered to be necessary in consideration of the solder material 3000, 4000. Example of the solder material 3000, 4000 may include Sn, PbSn, PbSnAg, PbInAb, PbAg, SnPbAg, PbIn, CdZn and so on. In terms of a melting point, solder materials having a melting point between 250 and 300° C. may be used.

In FIG. 27, the n-side electrode 80 and the p-side electrode 92 are formed on the non-conductive reflective film 91 in a manner that they cover at least 50% of the area of the non-conductive reflective film 91 in order to increase the soldering efficiency. Needless to say, the n-side electrode 80 and the p-side electrode 92 of this structure may be used as the top layer structure of the electrode including conductive reflective films 901, 902 and 903. Further, the n-side electrode and the p-side electrode 92 having this electrode structure may be applied to the top layer structure for all of the semiconductor light emitting devices illustrated in FIG. 1 through FIG. 26. Those parts indicated with the same reference numerals but not mentioned here will not be explained again to avoid redundancy.

Figure 30:
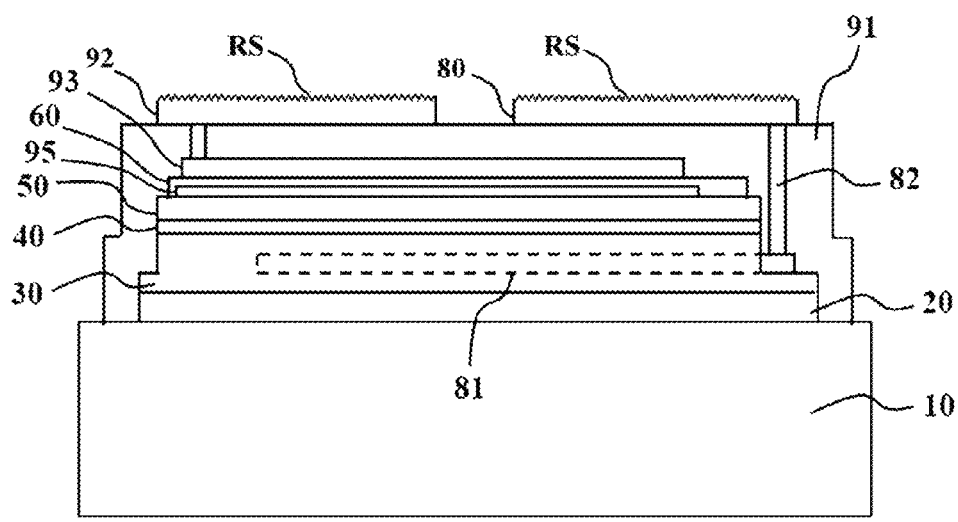
FIG. 30 is a schematic view illustrating a still further exemplary embodiment of a semiconductor light emitting device according to the present disclosure.

FIG. 30 is a schematic view illustrating a still further exemplary embodiment of a semiconductor light emitting device according to the present disclosure, in which soldering layers 80 and 92 have a rough surface RS instead of a flat surface. During soldering, the RS will have an increased contact area with the solder materials 3000, 4000 and promote fast energy transfer to the soldering layers 80 and 92. The RS may be obtained during the formation of the soldering layers 80 and 92 without a separate process. In this embodiment, the soldering layers 80 and 92 are formed by E-beam evaporation.

Figure 31:
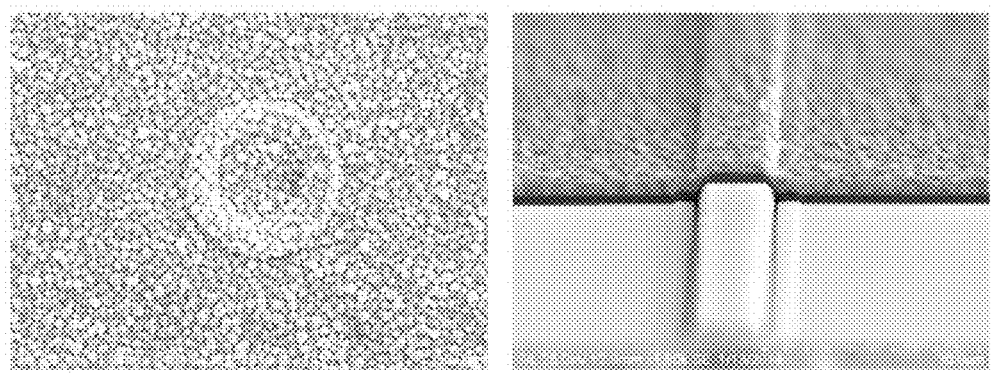
FIG. 31 shows photos of rough surfaces formed on the electrode according to the present disclosure.

FIG. 31 shows photos of rough surfaces formed on the electrode according to the present disclosure, in which the photo on the left hand side was taken from the top, and the photo on the right hand side was taken from the side. These photos show surfaces when the deposition thickness was about 4 μm, and each projection has a size of 15-25 μm. Roughness may be modified by adjusting deposition conditions such as deposition rate (e.g. 10 Å/sec).

Figure 32:
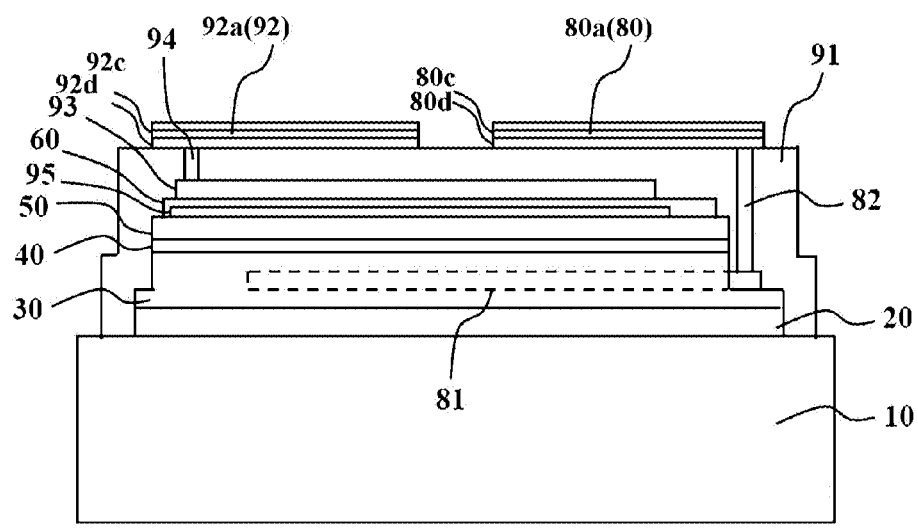
FIG. 32 is a schematic view illustrating a still further exemplary embodiment of a semiconductor light emitting device according to the present disclosure.

FIG. 32 is a schematic view illustrating a still further exemplary embodiment of a semiconductor light emitting device according to the present disclosure, in which at least one of the n-side electrode 80 and the p-side electrode 92 has a diffusion barrier layer 80c, 92c below a solder layer 80a, 92a in order to prevent a solder material 3000, 4000 from permeating into a plurality of semiconductor layers 30, 40, 50. This diffusion barrier layer 80c, 92c may be made of Ti, Ni, Cr, W, TiW or the like. If necessary, at least one of the n-side electrode 80 and the p-side electrode 92 may have an additional layer 80d, 92d. On the non-conductive reflective film 91, the n-side electrode 80 and the p-side electrode 92 may be formed simultaneously with electrical connections 82 and 94, and the additional layers 80d and 92d may be formed as light reflection layers such that light generated in the active layer 40 is reflected from the top of the non-conductive reflective film 91 and the electrical connections 82 and 94. Here, the additional layers 80d and 92d may be made of Al, Ag or the like. Moreover, the additional layers 80d and 92d, which are the lowermost layers of the n-side electrode 80 and the p-side electrodes 92, may have a contact layer such as Cr or Ti, so as to have an increased contact force. Alternatively, both the light reflection layer and the contact layer may be provided.

The soldering layers 80a and 92a, the diffusion barrier layers 80c and 92c and the additional layers 80d and 92d may have the same area in their stacked structure as in FIG. 32, they may also be stacked as shown in the semiconductor light emitting devices in FIG. 19 and FIG. 24. That is, after the diffusion barrier layers 80c and 92c and the additional layers 80d and 92d are formed all over the surface, the soldering layers 80a and 92a may be partially formed thereon. The diffusion barrier layers 80c and 92c and/or the additional layers 80d and 92d (in case the additional layers are light reflection layers) may be designed to have a certain minimum thickness such that the non-conductive reflective film 91 and/or the plurality of semiconductor layers 30, 40, 50 are prevented from breaking during soldering. However, some Al and Ag light reflection layers tend to spread out if they are too thick. To be able to protect the non-conductive reflective film 91 and/or the plurality of semiconductor layers 30, 40, 50 from breakage, the light reflection layers and the diffusion barrier layers 80c, 92c are therefore stacked alternately one on top of the other. For instance, they can be alternately stacked (Al (5000 Å)-Ni (3000 Å)-Al (5000 Å)-Ni (3000 Å)), each layer at a thickness of at least 1 μm. Breakage can be prevented better by increasing the thickness of each layer in the stack to 2 μm or more.

Figure 33:
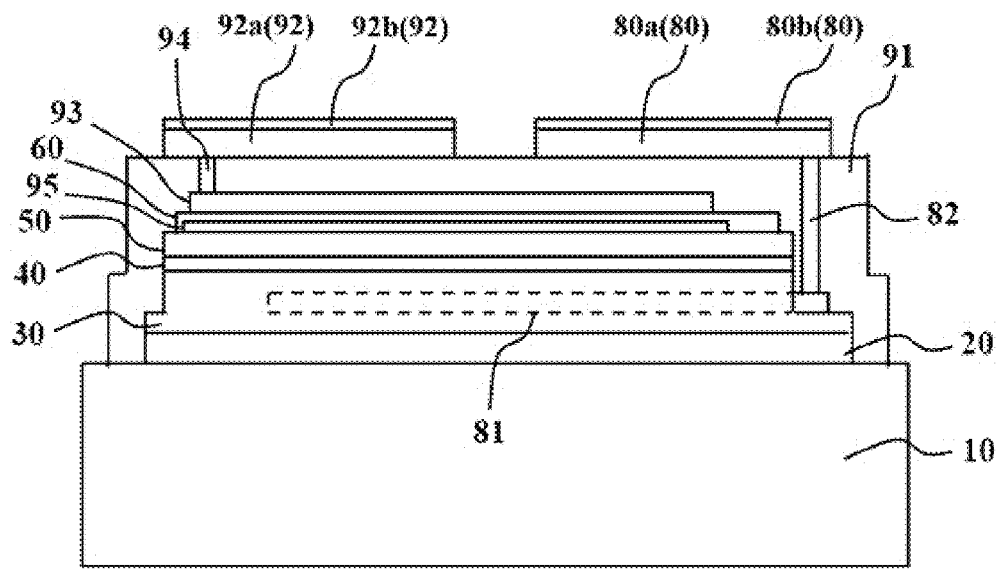
FIG. 33 is a schematic view illustrating a modified form of the semiconductor light emitting device proposed in FIG. 27.
Figure 34:
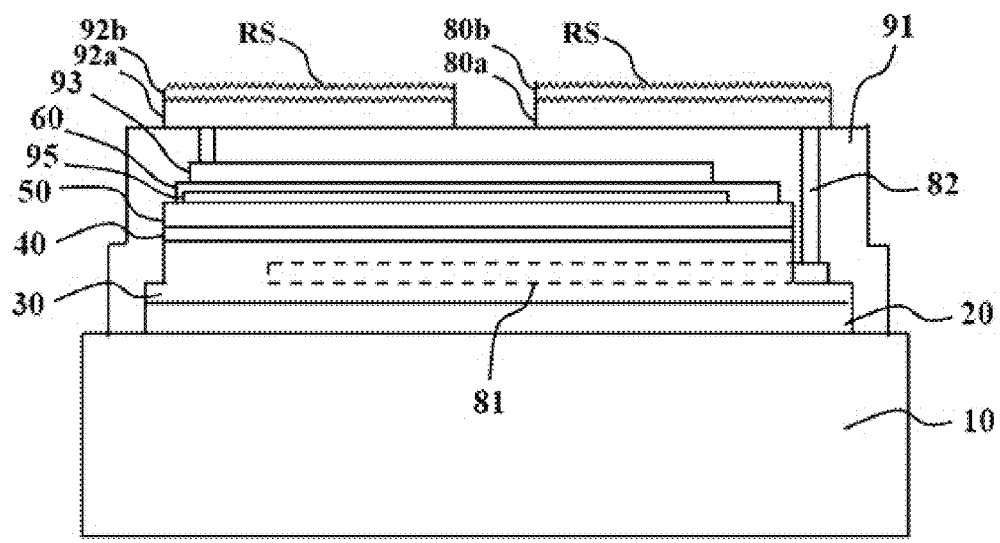
FIG. 34 is a schematic view illustrating a modified form of the semiconductor light emitting device proposed in FIG. 30.
Figure 35:
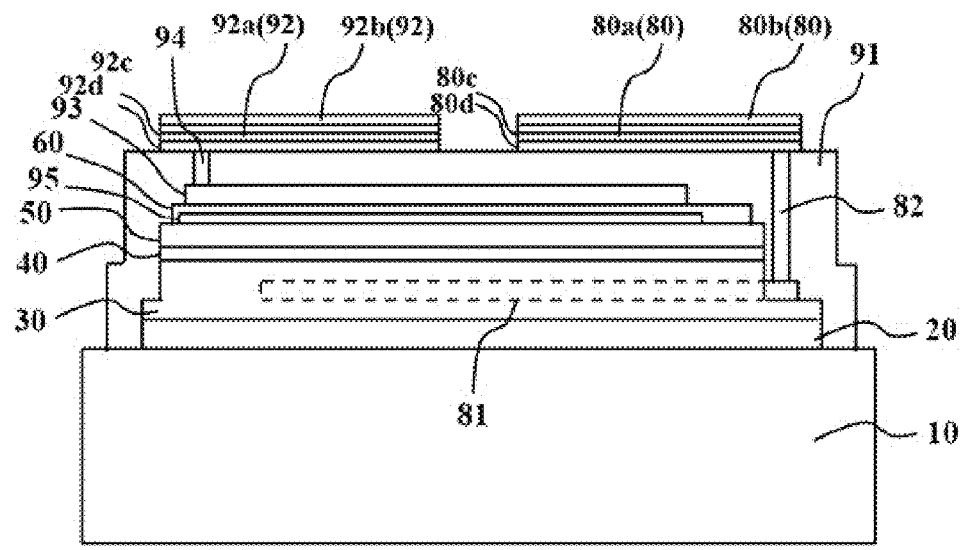
FIG. 35 is a schematic view illustrating a modified form of the semiconductor light emitting device proposed in FIG. 32.

FIG. 33 is a schematic view illustrating a modified form of the semiconductor light emitting device proposed in FIG. 27, FIG. 34 is a schematic view illustrating a modified form of the semiconductor light emitting device proposed in FIG. 30, and FIG. 35 is a schematic view illustrating a modified form of the semiconductor light emitting device proposed in FIG. 32. If one prepares the top layer of an electrode of a semiconductor light emitting device using Sn and then tries to solder it on site where it is attached the an external electrode 1000, 2000, impurities produced from oxidation for example may be present on Sn, causing problems in soldering and electrical conductivity. To resolve this, one may complete the manufacture of a semiconductor light emitting device first, coat a corresponding metal such as Sn or Au with a solder material while bringing the completely manufactured device into contact with the external electrode 1000, 2000, and solder them immediately on the spot. As an alternative way, as can be seen in FIGS. 33, 34, 35, a thin anti-oxidation layer 80b, 92b may be applied onto the Sn-based soldering layer 80a, 92a, and thereby preventing oxidation of Sn.

The anti-oxidation layer 80b, 92b may be made of a highly antioxidant and highly conductive metal such as Au or Pt. However, since soldering is carried out between the solder material 3000, 4000 and the soldering layer 80a, 92a, the anti-oxidation layer 80b, 92b should be sufficiently thick (but not too thick) enough to prevent oxidation of the soldering layer 80a, 92a. This may vary depending on a metal used. For example, when 1 μm-thick Au is used and serves as a soldering layer, the aforementioned problem may still occur. Therefore, the anti-oxidation layer 80b, 92b preferentially has a thickness of 5000 Å or less.

Referring back to FIG. 36, the change in bonding strength with the thickness of the anti-oxidation layer 80b, 92b is graphically shown. In the DTS (die shear test) used, the bonding strength of an Au soldering layer free of Sn was obtained and used as a reference value Ref. Then a Sn soldering layer 80a, 92b made of Sn only, and Sn soldering layers with an overlaid thin anti-oxidation layer 80b, 92b made of Au of different thicknesses were tested to find out how the bonding strength changes with the thickness of Au. It turned out that the bonding strength keeps increasing until Au thickness reaches 500 Å, and then it gets decreased when Au thickness exceeds this level. Therefore, the bonding strength of the soldering layers which are made of Sn only or contain Sn falls between Ref and the bonding strength of 100 Å Au-overlaid Sn soldering layer. That is, a Sn soldering layer or a Sn-based soldering layer showed an increased bonding strength as compared with the Au soldering layer. The best bonding strength was found in 500 Å Au-overlaid Sn soldering layer, but then the bonding strength has decreased as the thickness of Au increases. Based on this experiment, and in consideration of the material (e.g. Au, Pt or the like) of the anti-oxidation layer and the solder material used, it is more preferential that the anti-oxidation layer 80b, 92b would have a thickness of 1000 Å or less.

Referring back to FIG. 28, FIG. 28 is a schematic view illustrating an example of a state where the semiconductor light emitting device is fixed to an external electrode. In particular, the n-side electrode 80 and the p-side electrode 92 of the semiconductor light emitting device C are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C.

Figure 37:
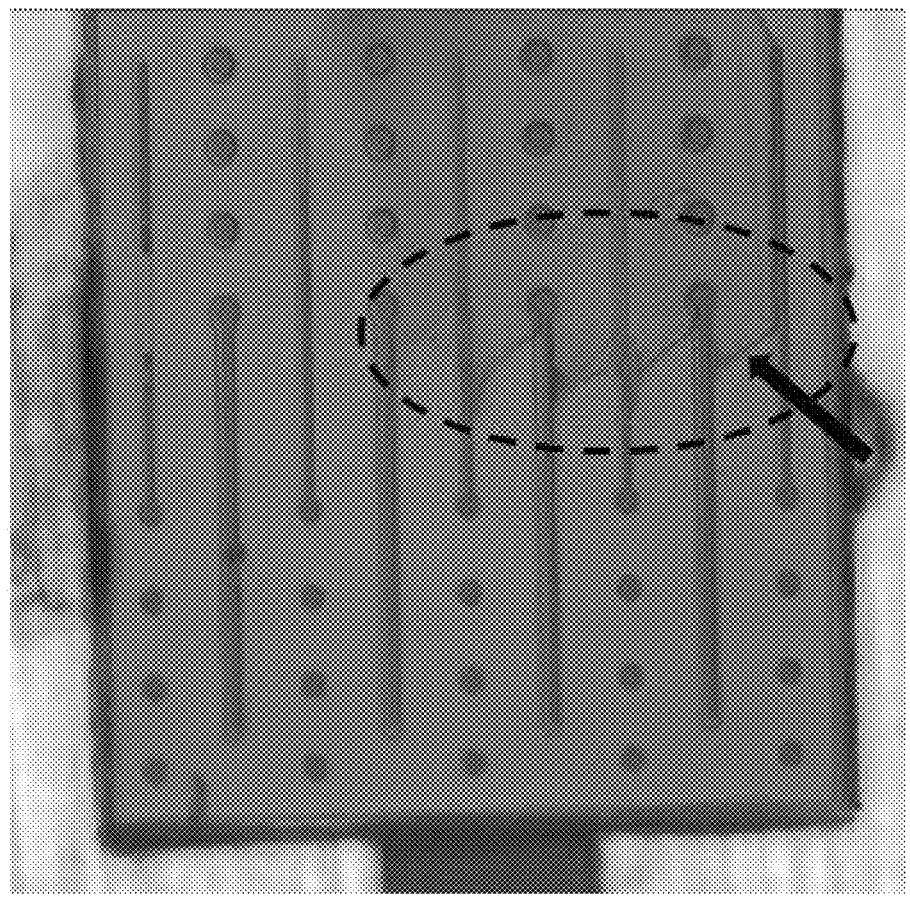
FIG. 37 is a photo showing cracks occurred in the semiconductor light emitting device bonded to an external electrode.

The electrode 80, 92 and the external electrode 1000, 2000 may be bonded together in various ways known in the art, including bonding using paste or ACF (anisotropic conductive film), eutectic bonding (e.g. AuSn, AnCu, CuSn), soldering, etc. Unfortunately however, as can be seen in FIG. 37, during this fixing or bonding process the semiconductor light emitting device may possibly be cracked (indicated with an arrow) due to a thermal shock. Meanwhile, Au is generally used for the top layer of the electrode 80, 92, but as shown in the left side of FIG. 29, Au does not show a favorable spreading condition with Sn which is usually used as a solder material during soldering. As such, when the top layer of the electrode 80, 92 is made of Au, high-yield soldering may not be accomplished (For an experiment, the reflow temperature (temperature for melting a solder) was set at 275° C., the reflow time was set at no more than 3 seconds, and an amount of a solder material was ⅓ of the area of a bump (electrode)).

Figure 38:
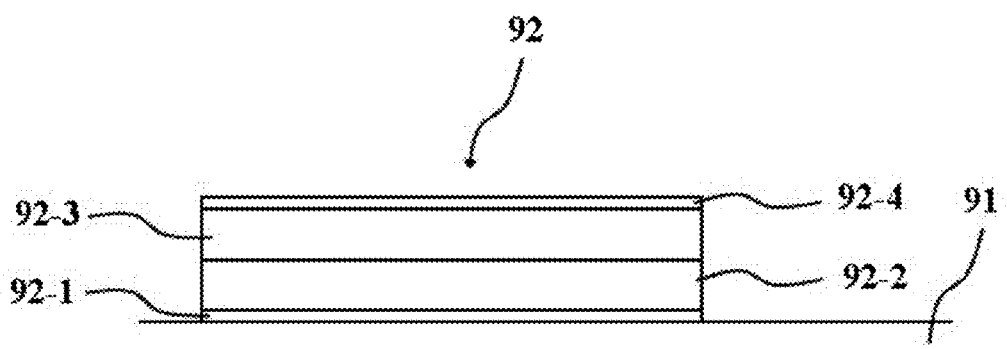
FIG. 38 is a schematic view illustrating an example of the structure of an n-side electrode and/or p-side electrode according to the present disclosure.

FIG. 38 is a schematic view illustrating an example of the structure of an n-side electrode and/or p-side electrode according to the present disclosure, in which a p-side electrode 92 (one example of the upper electrode in a second electrode part) is provided on a non-conductive reflective film 91. The p-side electrode 92 includes a lower electrode layer 92-2 and an upper electrode layer 92-3. The lower electrode layer 92-2 may be provided as a stress relief layer or a crack resistant layer for preventing cracks when a semiconductor light emitting device is fixed to an external electrode, and the upper electrode layer 92-3 may be provided as an anti-burst layer for preventing the bursting of the lower electrode 92-2. In addition, the lower electrode layer 92-2 may be provided as a reflective layer for reflecting light that has passed through the non-conductive reflective film 91. Also, the upper electrode layer 92-3 may be provided a diffusion barrier layer for preventing a solder material from permeating into the semiconductor light emitting device during a bonding operation such as soldering. The upper electrode layer 92-3 and the lower electrode layer 92-2 may be formed to have a combination of various functions described above.

For example, the lower electrode 92-2 may be formed of a highly reflective metal such as Al or Ag. In view of a crack resistant function, materials like Al and Ag are again useful as they have a high thermal expansion coefficient (linear thermal expansion coefficients: Al=22.2, Ag=19.5, Ni=13, Ti=8.6, unit: $10^{-6}$ m/mK). In many respects, Al is most desirable.

Likewise, the upper electrode 92-3 may be formed of a material such as Ti, Ni, Cr, W or TiW, in view of an anti-burst function and/or diffusion barrier function. Any metal having these functions may be employed without particular limitation.

Preferentially, the electrode 92 may further include a contact layer 92-1. With the contact layer 92-1, the electrode 92 may have an increased bonding strength towards the non-conductive reflective film 92. The contact layer 92-1 may be formed of a metal (e.g. Cr, Ti, Ni or the like) or any suitable material as there is no specific limitation thereof, given that the contact layer thus formed has a greater bonding strength than the lower electrode layer 92-2. The contact layer 92-1 is usually made thin (e.g. 20 Å-thick Cr) because light absorption by the contact layer 92-1 should be discouraged. The contact layer may be taken away if the lower electrode can have a bonding strength. The contact layer 92-1 may be omitted, and the bonding strength between the non-conductive reflective layer 91 and the lower electrode layer 92-3 may be increased by properly controlling deposition conditions (deposition method, deposition pressure, deposition temperature etc.) of the electrode 92. If the light reflection efficiency is taken into consideration, the contact layer should not be provided at all.

Preferentially and generally, the p-side electrode 92 includes a top layer 92-4. The top layer 92-4 is typically made of a metal having excellent adhesion, high electrical conductivity and high resistance to oxidation. Examples of the metal may include Au, Sn, AuSn, Ag, Pt, any alloy thereof or any combination thereof (e.g. Au/Sn, Au/AuSn), but are not particularly limited thereto as long as the aforementioned requirements are satisfied.

Figure 39:
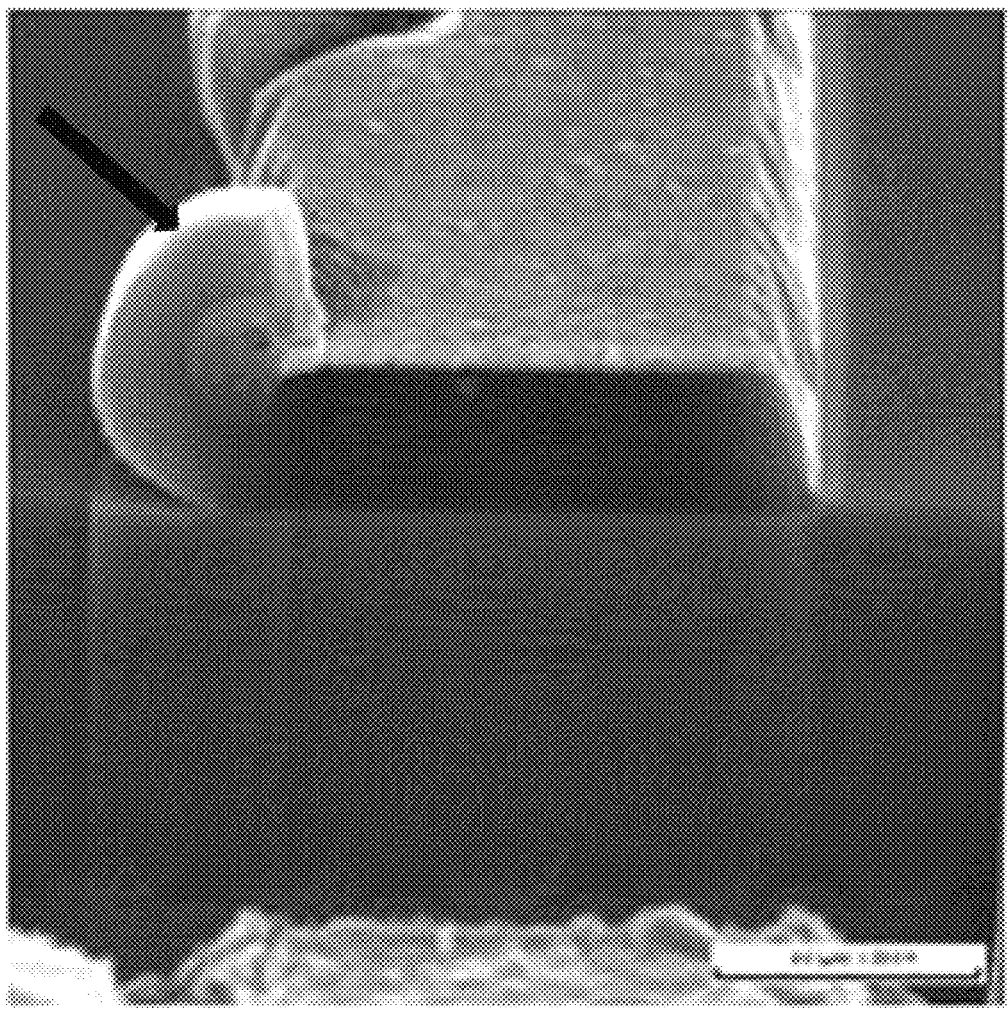
FIG. 39 is a photo showing that a lower electrode got burst after a current has been applied for an extended period of time.
Figure 43:
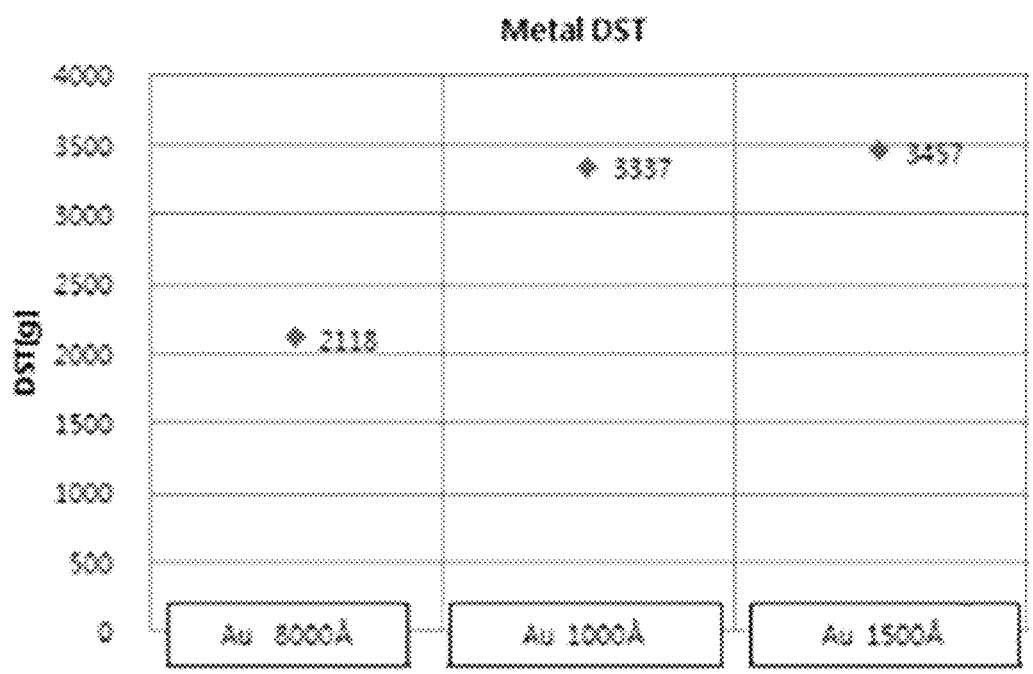
FIG. 43 is a graph showing DST results as a function of the thickness of top layer.

In a preferential embodiment, the p-side electrode 92 has the lower electrode 92-2 which has a thickness of at least 1000 Å or preferentially at least 5000 Å and serves as a crack resistant layer (a metal layer (e.g. Al) having a high thermal expansion coefficient), and the upper electrode layer 92-3 which prevents cracking of the semiconductor light emitting device when it is bonded to an external electrode by soldering for example and has a lower thermal expansion coefficient to prevent bursting and sticking out thereof caused by a higher thermal expansion coefficient (see FIG. 39 where the Al electrode at least 1000 thick burst out during the operation of the device (indicated with an arrow)). Here, the upper electrode layer 92-3 preferentially doubles as a diffusion barrier layer, and Ni or Ti is particularly suitable to meet such a need. For example, 1 μm Al and 2 μm Ni may be used. While there is no specific upper limit on the thickness of the lower electrode layer 92-2, it is preferential for the lower electrode layer 92-2 to be 1 μm thick or less because the upper electrode layer 92-3 will not be able to control the lower electrode layer 92-2 easily if the lower electrode layer 92-2 is too thick. On the other hand, if the thickness is reduced to 1000 Å or less, the lower electrode layer as a crack resistant layer may be degraded. As will be described later, when the p-side electrode 92 has a plurality of lower electrode layers 92-2, a smaller thickness is allowed. The thickness of the upper electrode layer 92-3 can be selected in consideration of the thickness of the lower electrode layer 92-2, and any value above 3 µm could be excessive and unnecessary, or electrical properties of the semiconductor light emitting device would possibly be degraded because of that. When a top layer 92-4 is provided and should be fixed to an external electrode by soldering, excessively voids can be formed if the top layer 92-4 is too thick, leading to a weaker bonding strength at the joint. Because of this, the top layer 92-4 preferentially has a thickness less than 5000 Å. DST results as a function of the thickness of the top layer 92-4 is provided in FIG. 43. It turned out that excellent performance was demonstrated when the thickness is in a range from 1000 Å to 1500 Å, and relatively poor performance was demonstrate when the thickness is 8000 Å. Hence, to maintain a DST value between 2500 Å and 3000 Å, it is preferential that the top layer has a thickness less than 5000 Å. On the other hand, if the top layer is provided and expected to demonstrate excellent performance, it should be at least 100 Å thick.

Figure 40:
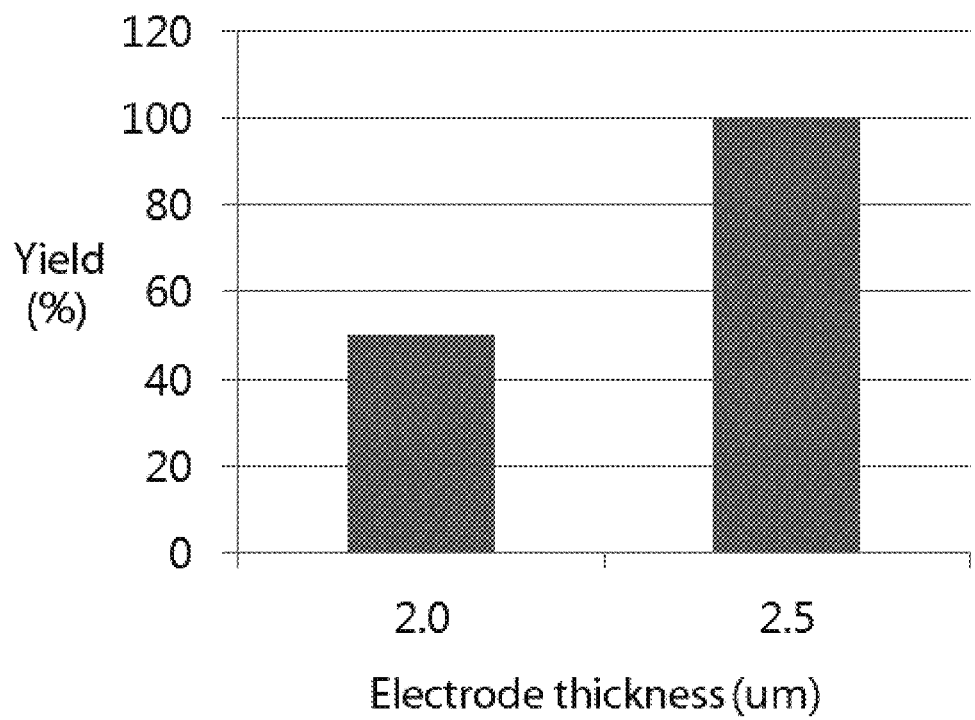
FIG. 40 graphically shows the change in the production yield with the thickness of an electrode or bump according to the present disclosure.

FIG. 40 graphically shows the change in the production yield with the thickness of an electrode or bump according to the present disclosure, for which an experiment was carried out by varying the thickness of sub-layers from the basic Cr (10 Å)-n-pair(s) Al (5000 Å)/Ni (3000 Å)-Au (8000 Å) structure, and solders (lead-free) were tested. When the electrode 80, 92 has a thickness of 2 µm, the production yield was 50%. When the electrode 80, 92 has a thickness of 2.5 µm, the production yield was approximately 100%. The pattern of electrodes used for this test was the same as the patterns of electrodes 80, 92 illustrated in FIG. 13 and FIG. 29, but other types of patterns equally hold a significant meaning as well. In terms of an area occupied by the electrode 80, 92, at least 50% of the area of the non-conductive reflective film 91 should be occupied by the electrode 80, 92 to be able to provide effective countermeasures against a thermal shock that occurs during bonding.

Figure 41:
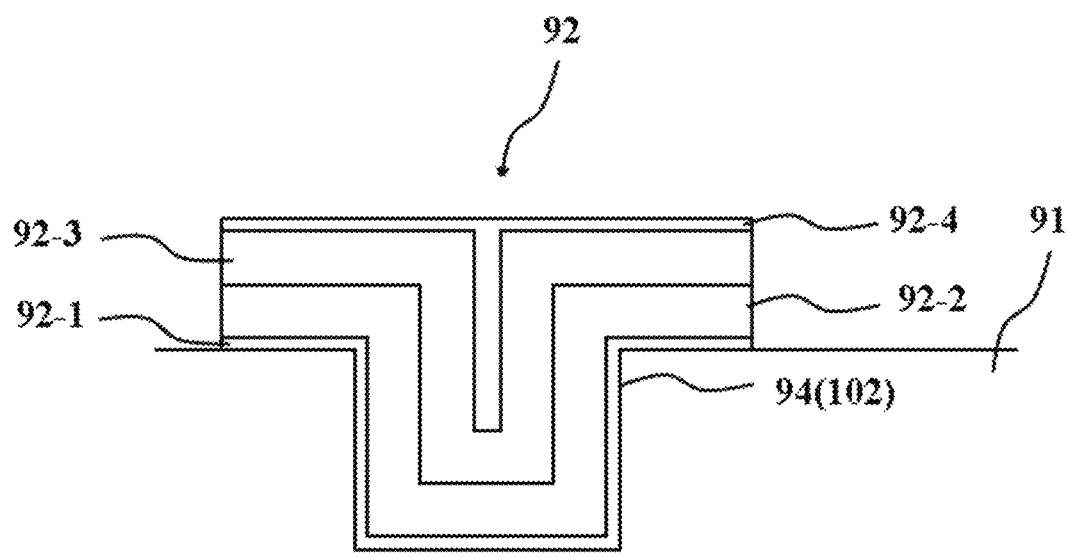
FIG. 41 is a schematic view illustrating a further example of the structure of an n-side electrode and/or p-side electrode according to the present disclosure.

FIG. 41 is a schematic view illustrating a further example of the structure of an n-side electrode and/or p-side electrode according to the present disclosure, in which an opening 102 is filled with a p-side electrode 92 to form an electrical connection 94 by the p-side electrode 92.

With this configuration, a lower electrode layer 92-2 may reflect light that has passed a non-conductive reflective film 91, and thus, light absorption by an electrical connection 94 can be reduced. For information, if a contact layer 92-1 is provided, the thickness thereof is so small that the lower electrode layer 92-2 may serve as a reflective film. Meanwhile, the electrical connection 94 may be formed separately from the p-side electrode 92 by deposition, plating and/or using a conductive paste.

Figure 42:
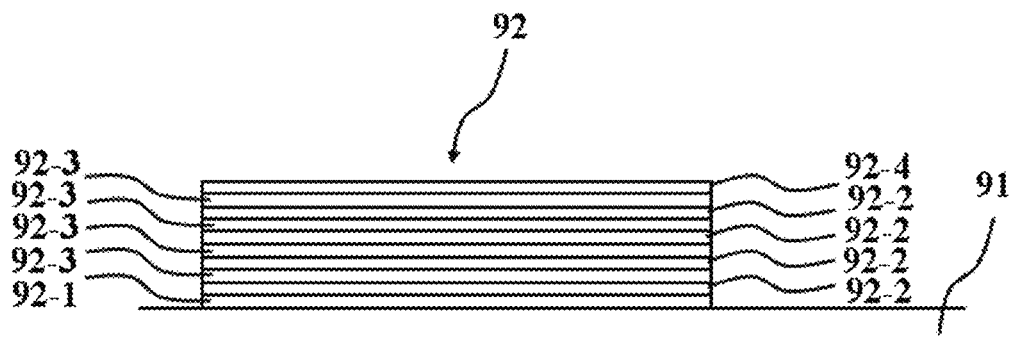
FIG. 42 is a schematic view illustrating a still further example of the structure of an n-side electrode and/or p-side electrode according to the present disclosure.

FIG. 42 is a schematic view illustrating a still further example of the structure of an n-side electrode and/or p-side electrode according to the present disclosure, in which a stack of several periods (repetitions) of alternating layers of a lower electrode layer 92-2 and an upper electrode layers 92-3 is provided. For instance, a p-side electrode 92 may include a contact layer 92-1 (20 Å-thick Cr), 4 pairs of the lower contact layers 92-2 (5000 Å-thick Al)/upper contact layers 92-3 (3000 Å-thick Ni) and a top layer 92-4 (1 µm-thick Au). Alternatively, only one of the lower electrode layer 92-2 and the upper electrode layer 92-3 may be provided in several periods (repetitions). Further, all of the lower and upper electrode layers 92-2, 92-3 do not necessarily have to be made of the same material. For instance, the lower electrode layer 92-2 may be made of a combination of Al and Ag. Also, one lower electrode 92-2 may be made of plural kinds of metals. Needless to say, there may be an additional layer besides the contact layer 92-1, the lower electrode layer 92-2, the upper electrode layer 92-3 and the top layer 92-4. Moreover, the structure shown in FIG. 41 is also applicable. Through the stack of alternating layers, one can assure that the lower electrode layer 92-2 will not stick out or burst.

Figure 44:
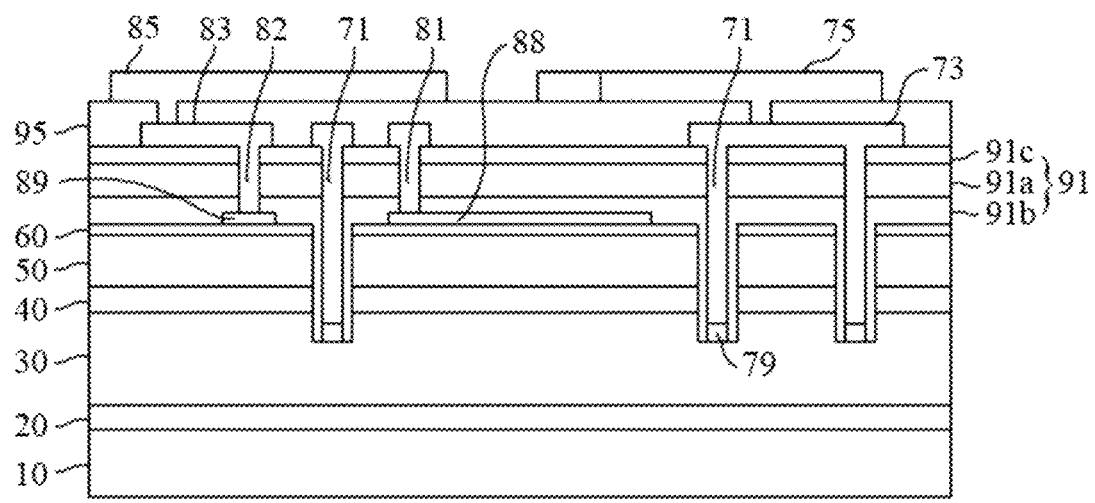
FIG. 44 is a schematic view illustrating an exemplary embodiment of a semiconductor light emitting device according to the present disclosure.

FIG. 44 is a schematic view illustrating an exemplary embodiment of a semiconductor light emitting device according to the present disclosure.

The semiconductor light emitting device includes a substrate 10, a plurality of semiconductor layers, a non-conductive reflective film 91, a p-side finger electrode 88, ohmic contact pads 89, 79, a first electrical connection 71, a second electrical connection 81, a third electrical connection 82, a first connection electrode 73, a second connection electrode 83, an insulation layer 95, a first electrode 75 and a second electrode 85. FIG. 44 is a cutaway view taken along line A-A in FIG. 50. The following description will be given in connection with a Group III-nitride semiconductor light emitting device as an example.

The substrate 10, which may eventually be removed, is typically made of sapphire, SiC, Si, GaN or the like. The plurality of semiconductor layers include a buffer layer 20 formed on the substrate 10, a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interpositioned between the first semiconductor layer 30 and the second semiconductor layer 50 and generates light by electron-hole recombination. Each of the plurality of semiconductor layers 30, 40, 50 may have a multilayered structure, and the buffer layer 20 may be omitted.

The non-conductive reflective film 91 reflects light from the active layer 40 towards the plurality of semiconductor layers 30, 40, 50. In this embodiment, the non-conductive reflective film 91 is made of a non-metallic material for reducing light absorption by a metal reflective film. The non-conductive reflective film 91 includes a DBR 91a, a dielectric film 91b and a clad film 91c, for example. The dielectric film 91b or the clad film 91c may be omitted. When the DBR 91a is non-conductive, the dielectric film 91b, the DBR 91a and the clad film 91c all or collectively serve as the non-conductive reflective film 91.

The DBR 91a reflects light from the active layer 40 towards the substrate 10. The DBR 91a is preferentially made of a light transmitting material (e.g. $SiO_2/TiO_2$) to avoid light absorption.

The dielectric film 91b is located between the DBR 91a and the plurality of semiconductor layers 30, 40, 50, and may be made of a dielectric (e.g. $SiO_2$) having a refractive index lower than the effective refractive index of the DBR 91a. Here, the effective refractive index means an equivalent refractive index of light that can travel in a waveguide made of materials having different refractive indices. The dielectric film 91b may also be helpful for light reflection and serve as an insulating film for electrically blocking the first electrical connection 71 from the second semiconductor layer 50 and the active layer 40.

The clad film 91c is formed on the DBR 91a. The clad film 91c can also be made of a material (e.g. $Al_2O_3$, $SiO_2$, SiON, MgF, CaF) having a lower refractive index than the effective refractive index of the DBR 91a.

A large portion of the light generated in the active layer 40 is reflected towards the first semiconductor layer 30 by the dielectric film 91b and the DBR 91a. The relationships among the dielectric film 91b, the DBR 91a and the clad layer 91c can be explained from the perspective of an optical waveguide. The optical waveguide is a structure that encompasses the propagation part of light by a material having a lower refractive index than the refractive index of the light propagation part and guides the light using total internal reflection. In this regard, if the DBR 91a is taken as the propagation part, the dielectric film 91b and the clad film 91f can be considered as part of the structure that encompasses the propagation part.

The non-conductive reflective film 91 is provided with a plurality of first semiconductor layer-side openings 63 and a plurality of second semiconductor layer-side openings 65, each opening being used as an electrical connecting pass. In this embodiment, the plurality of first semiconductor layer-side openings 63 is formed, passing through the non-conductive reflective film 91, the second semiconductor layer 50, the active layer 40, and until reaching down to part of the first semiconductor layer 30; and the plurality of second semiconductor layer-side openings 65 is formed, passing through the non-conductive reflective film 91. In this embodiment, the dielectric film 91b extends from between a current spreading conductive film 60 and the DBR 91a to the inner face of the first semiconductor layer side, thereby insulating the first electrical connection 71 from the second semiconductor layer 50, the active layer 40 and the second connection electrode. On the other hand, a separate insulating film may be formed between the DBR 91b and the current spreading conductive film 60.

The semiconductor light emitting device may include the current spreading conductive film 60 between the non-conductive reflective film 91 and the plurality of semiconductor layers 30, 40, 50, for example, between the dielectric film 91b and the second semiconductor layer 50. The current spreading conductive film 60 may be formed of a current spreading electrode (ITO or the like), an ohmic metal layer (Cr, Ti or the like), a reflective metal layer (Al, Ag or the like), or a combination thereof. In order to reduce light absorption by a metal layer, the current spreading conductive film 60 is preferentially made of a light transmitting conductive material (e.g. ITO).

A plurality of p-side finger electrodes 88 is provided between the current spreading conductive film 60 and the dielectric film 91b, stretching on the current spreading conductive film 60. The p-side finger electrodes 88 promote current spreading towards the second semiconductor layer 50 (e.g. Mg-doped GaN) that corresponds to a p-type semiconductor layer more resistant to current spreading as compared with the first semiconductor layer 30 (e.g. Si-doped GaN) that corresponds to an n-type semiconductor layer. The shape and array of the plurality of p-side finger electrodes 88 may vary depending on the shape, size or the like of the semiconductor light emitting device. In this embodiment, the plurality of p-side finger electrodes 88 stretch side by side from below the second electrode 85 to below the first electrode 75 (see FIG. 50).

A plurality of p-side ohmic contact pads 89 is arranged below the second electrode 85 along an extension line of the p-side finger electrode 88. The ohmic contact pads 89 are interpositioned between the current spreading conductive film 60 and a third electrical connection 82, for improving an electrical contact. The ohmic contact pads 89 may be made of the same material as the p-side finger electrodes 88.

A plurality of n-side ohmic contact pads 79 is arranged on an exposed part of the first semiconductor layer 30 through the opening 63, each being positioned below the first electrode 75, below the second electrode 85 and therebetween. The plurality of n-side ohmic contact pads 79 are arranged between the p-side finger electrodes 88, in parallel with them (see FIG. 46 and FIG. 50). The n-side ohmic contact pads 79 are interpositioned between the first semiconductor layer 30 and the first electrical connection 71 for improving an electrical contact and preventing an increase in the operating voltage. The n-side ohmic contact pads 79 may be made of the same material as the p-side ohmic contact pads 89.

A light absorption barrier film or a current blocking layer may be additionally provided between the second semiconductor layer 50 and the current spreading conductive film 60, corresponding to the p-side ohmic contact pad 89 and the p-side finger electrode 88.

The first electrical connection 71 is led into the first semiconductor layer-side opening 63 and becomes electrically conductive with the first semiconductor layer 30 through the n-side ohmic contact pad 79. The second electrical connection 81 is led into some of the second semiconductor layer-side openings 65 and becomes electrically conductive with the p-side finger electrode 88. The third electrical connection 82 is led into the second semiconductor layer-side opening 65 and becomes electrically conductive with the p-side ohmic contact pad 89. The third electrical connection 82 becomes electrically conductive with the second semiconductor layer 50, independently of the p-side finger electrode 88, through the second semiconductor layer-side opening 65.

The plurality of p-side finger electrodes 88 arrayed side by side are stretched from below the second electrode 86 to below the first electrode 75 for current spreading, and a plurality of the first semiconductor layer-side openings 63 is provided between the plurality of p-side finger electrodes 88, each being formed along the p-side finger electrode 88. In a region below the second electrode 85, which is capable of spreading current to the second semiconductor layer 50 relatively easily, the p-side finger electrodes 88 are connected only with the second electrical connection 81, and the third electrical connection 82, on the other hand, is connected with the second semiconductor layer 50 through the p-side ohmic contact pad 89, independently of the p-side finger electrodes 88. As such, additional p-side finger electrodes 88 is no longer necessary, and the light absorption loss is therefore reduced.

Figure 50:
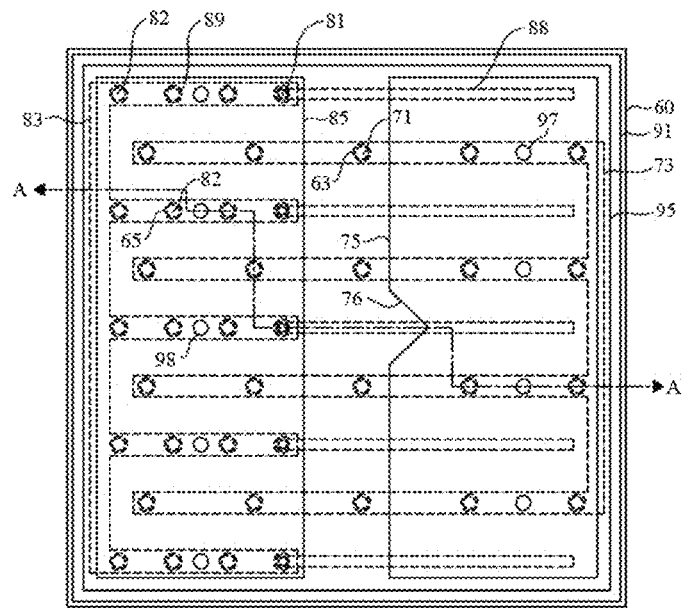

Because the first semiconductor layer 30 is relatively more receptive to current spreading than the second semiconductor layer 50, instead of using those n-side finger electrodes, a plurality of first electrical connections 71 are distributed across the light emitting face without regional limitation, and adapted to conduct with the first semiconductor layer 30 through the n-side ohmic contact pad so as to supply electrodes (see FIG. 50.). Therefore, the absence of the n-side finger electrodes for interconnecting the first electrical connections 71 helps to avoid a decrease in the light emitting face. Moreover, the absence of the n-side finger electrodes allows to reduce the light absorption loss due to the n-side finger electrodes.

A first connection electrode 73 and a second connection electrode 83 are formed on the non-conductive reflective film 91, for example, on the clad film 91c. The first connection electrode 73 connects a plurality of the first electrical connections 71, thereby contributing to uniform current supply to the first electrical connections 71. The second connection electrode 83 interconnects a plurality of the second electrical connections 81 with a plurality of the third electrical connections 82, contributing to uniform current supply to the second and third electrical connections 81, 82.

The first connection electrode 72 may have a different shape depending on the layout of the plurality of first electrical connections 71. In this embodiment, the first connection electrode 73 has a finger shape. The second connection electrode 83 may have a different shape depending on the layout of the plurality of second electrical connections 81 and third electrical connections 82. In this embodiment, the second connection electrode 83 has a finger shape. The first connection electrode 73 and the second connection electrode 83 are arrayed in an interdigitate finger shape (see FIG. 50).

The number, spacing and layout of the first and second semiconductor layer-side openings 63, 65 may suitably modified, depending on the size of the semiconductor light emitting device, and for accomplishing current spreading, uniform current supply and homogeneous emission of light.

In this embodiment, the semiconductor light emitting device includes an insulating layer 95 covering the first and second connection electrodes 73, 83. The insulating layer 95 has a first electrode-side opening 97 and a second electrode side opening 98. The insulating layer may be made of $SiO_2$.

The first and second electrodes 75, 85 are formed on the insulating layer 95.

The first electrode 75 is electrically connected with the first connection electrode 73 via the first electrode-side opening 97 and supplies electrons to the first semiconductor layer 30. The second electrode 85 is electrically connected with the second connection electrode 83 via the second electrode-side opening 98 and supplies electrons to the second semiconductor layer 50. The first electrode 75 and the second electrode 85 may be eutectic bonding electrodes. A groove or notch 76 for identifying the p-side or the n-side is formed at one of edges of the first and second electrodes 75, 85, which are facing each other (in this embodiment, at the edge of the first electrode 75) (see FIG. 50).

In the semiconductor light emitting device, instead of a metal reflective film, the non-conductive reflective film 91 including the DBR 91a is used for reducing light absorption. The first semiconductor layer receives sufficient current through the plurality of first electrical connections 71, the light absorption loss is reduced because of the absence of separate n-side finger electrodes interconnecting the first electrical connections 71, and a light emitting area can be reduced. Moreover, current spreading through the p-side finger electrodes 88 that are connected with the second electrical connections 81 is improved, leading to an enhanced homogenous emission of light. Further, with the third electrical connections 82 conducting with the second semiconductor layer independently of the p-side finger electrodes 88, it is possible to avoid unnecessary extension of the p-side finger electrodes 88, thereby reducing the light absorption loss.

FIG. 45 through FIG. 50 are schematic views illustrating an exemplary embodiment of a manufacturing method of a semiconductor light emitting device according to the present disclosure.

Figure 45:
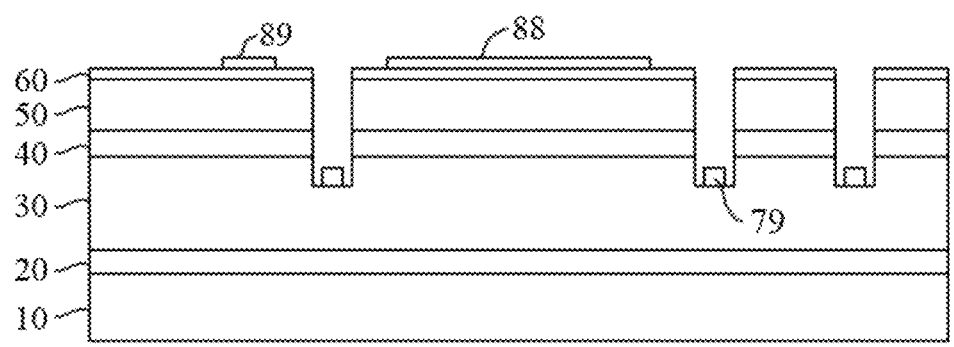
FIG. 45 through FIG. 50 are schematic views illustrating an exemplary embodiment of a manufacturing method of a semiconductor light emitting device according to the present disclosure.

First of all, a plurality of semiconductor layers 30, 40, 50 is grown on a substrate 10. For instance, as can be seen in FIG. 45, on the substrate 10 (e.g. $Al_2O_3$, Si, SiC), a buffer layer (e.g. an AlN or GaN buffer layer), an un-doped semiconductor layer (e.g. un-doped GaN), a first semiconductor layer 30 having a first conductivity type (e.g. Si-doped GaN), an active layer 40 for generating light by electron-hole recombination (InGaN/(In)GaN, a multiple quantum well structure), and a second semiconductor layer 50 having a second conductivity type different from the first conductivity type (e.g. Mg-doped GaN) are grown.

The buffer layer 20 may be omitted, and each of the plurality of semiconductor layers 30, 40, 50 may have a multilayered structure. Although the first semiconductor layer 30 and the second semiconductor layer 50 may have opposite conductivity type, this is not desirable in the case of a Group III-nitride semiconductor light emitting device.

Afterwards, a current spreading conductive film 60 is formed on the second semiconductor layer 50. The current spreading conductive film 60 may be made of a light transmitting conductor (e.g. ITO) for reducing light absorption. Alternatively, the current spreading conductive film 60 may be omitted, but it is usually included for current spreading towards the second semiconductor layer 50.

An opening 63 is formed on the first semiconductor layer side, by mesa etching. The mesa etching process may be carried out prior to the formation of the current spreading conductive film 60.

Figure 46:
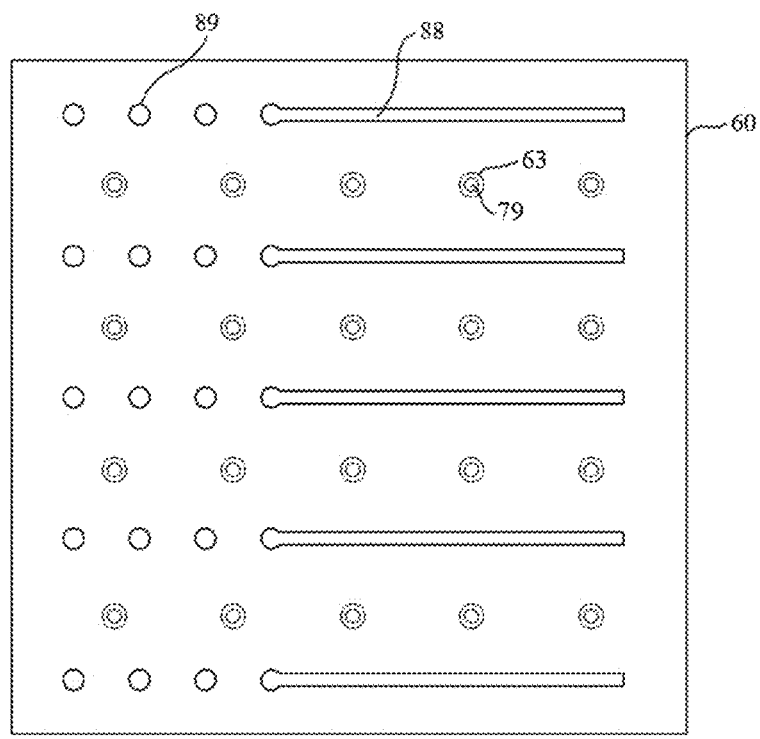

Next, referring to FIG. 46, a plurality of p-side finger electrodes 88 and a plurality of p-side ohmic contact pads 89 are formed on the current spreading conductive film 60. Together, or through a separate process, n-side ohmic contact pads are formed. The plurality of p-side finger electrodes 88 is patterned in a manner that they are stretched down side by side, from below the second electrode 85 to below the first electrode 75. The p-side finger electrode 88 may have a different shape for enhancing the shape of the semiconductor light emitting device and for improving the uniformity of current distribution. A plurality of p-side ohmic contact pads 89 is arranged distant from one end of the p-side finger electrode 88. Each of the p-side finger electrode 88 and the p-side ohmic contact pad 89 may be composed of a multilayered structure. This will be described further later.

Figure 47:
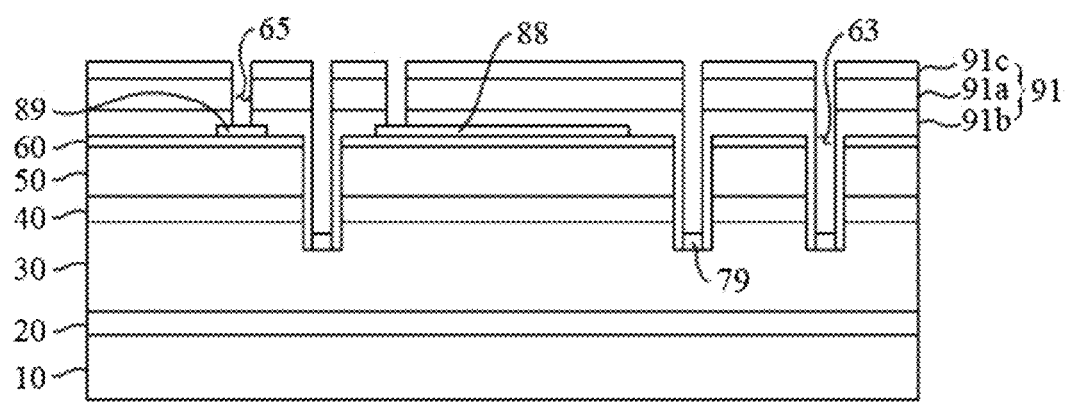

Now referring to FIG. 47, a non-conductive reflective film 91 is formed. For example, a dielectric film 91b covering the current spreading conductive film 60 and the plurality of p-side finger electrodes 88, and covering the p-side ohmic contact pad 89 and the n-side ohmic contact pad 70; a DBR 91a; and a clad film 91c are formed. The dielectric film 91b or the clad film 91c may be omitted.

The DBR 91a is composed of a stack of several periods (repetitions) of alternating layers of $SiO_2$ and $TiO_2$, for example. In addition, the DBR 91a may be a combination of a highly reflective material such as $Ta_2O_5$, HfO, ZrO or SiN, and a dielectric thin film (typically $SiO_2$) having a lower refractive index than the material. When the DBR 91a is made of $TiO_2/SiO_2$, it is preferentially subjected to an optimum process designed in consideration of the reflectivity as a function of the incident angle and the wavelength, using the ¼ optical thickness of the wavelength of light coming out of the active light as a reference. It is not absolutely required for each layer to have a thickness corresponding to ¼ of the optical thickness of the wavelength. The number of combinations is suitably in a range from 4 to 20 pairs.

For reflecting and guiding light, the DBR 91a preferentially has an effective refractive index larger than a refractive index of the dielectric film 91b. When the DBR 91a is made of $SiO_2/TiO_2$, with $SiO_2$ having the refractive index of 1.46 and $TiO_2$ having the refractive index of 2.4, the effective refractive index of the DBR 91a has a value between 1.46 and 2.4. Therefore, the dielectric film 91b may be made of $SiO_2$, and it preferentially has a thickness ranging from 0.2 μm to 1.0 μm. As the deposition of the DBR 91a needs to be done with high precision, the dielectric film 91b having a uniform thickness may be formed before the deposition such that the DBR 91b can be prepared in a stable manner, and light reflection can also benefit therefrom.

The clad film 91c can also be made of a metallic oxide such as $Al_2O_3$, or a dielectric film 91b such as $SiO_2$ or SiON, or a material such as MgF, CaF or the like. The clad film 91c may also be formed of $SiO_2$ having the refractive index of 1.46 that is smaller than the effective refractive index of the DBR 91a. Preferentially, the clad film 91c has a thickness which desirably ranges from $\lambda/4n$ to 3.0 μm, in which $\lambda$ denotes a wavelength of the light generated in the active layer 40, and n denotes a refractive index of a material of the clad film 91c. When $\lambda$ is 450 nm (4500 Å), the clad film 91c can be formed in a thickness of 771 Å (4500/4×1.46=771 Å) or more.

Considering that the top layer of the DBR 91a made of multiple pairs of $SiO_2/TiO_2$ can be composed of a $SiO_2$ layer having a thickness of $\lambda/4n$, it is desirable that the clad film 91c is thicker than $\lambda/4n$ to be distinguished from the top layer of the DBR 91a that is underlaid beneath the clad film 91c. However, it is not desirable for the top layer of the DBR 91a to be too thick (e.g., 3 μm or more) because this would impose a burden on the subsequent processes for forming a plurality of first semiconductor layer-side openings 63 and a plurality of second semiconductor layer-side openings 65 and only increase the material cost without contributing to the improvement of the efficiency. Therefore, an appropriate upper limit of the thickness of the clad film 91c would be between 1 μm and 3 μm, so as to relieve the burden on the subsequent processes for forming the plurality of first semiconductor layer-side openings 63 and the plurality of second semiconductor layer-side openings 65. But still, it is not totally prohibited to make the top layer as thick as 3.0 μm or more.

When the DBR 91a comes into direct contact with the p-side finger electrode 88, the first connection electrode 73 and the second connection electrode 83, part of the light travelling through the DBR 91a might be absorbed by the p-side finger electrode 88, the first connection electrode 73 and the second connection electrode 83. As described above, by introducing the clad film 91c and the dielectric film 91b having a lower refractive index than the refractive index of the DBR 91a, it becomes possible to significantly reduce an amount of light being absorbed.

Optionally, the dielectric film 91b may be omitted. Also, although not desirable in terms of an optical waveguide, there is no reason to exclude the configuration composed of the DBR 91a and the clad film 91c, when the overall technical idea of this disclosure is taken into consideration. Alternatively, a $TiO_2$ dielectric film 91b may also be used in place of the DBR 91a. Further, as an alternative, the clad film 91f may be omitted if the DBR 91a includes a $SiO_2$ layer on the top thereof.

Accordingly, the dielectric film 91b, the DBR 91a and the clad film 91c form the non-conductive reflective film 91 and serve as an optical waveguide, and they preferentially have a combined thickness of 1 to 8 μm.

Referring next to FIG. 47, a plurality of first semiconductor layer-side openings 63 and a plurality of second semiconductor layer-side openings 65 are formed in the non-conductive reflective film 91 by dry etching or wet etching or a combination thereof, for example.

The first semiconductor layer-side opening 63 is formed, passing through the non-conductive reflective film 91, the second semiconductor layer 50, the active layer and until reaching down to part of the first semiconductor layer 30, thereby exposing the n-side ohmic contact pad 79. The second semiconductor layer-side opening 63 is formed, passing through the non-conductive reflective film 91, thereby exposing a part of the p-side finger electrode 88 and a part of the p-side ohmic contact pad 89. In this embodiment, one lateral end of the p-side finger electrode 88 is exposed through the second semiconductor layer-side opening 65. Although the first semiconductor layer-side opening 63 and the second semiconductor layer-side opening 65 may be formed following the formation of the non-conductive reflective film 91, as an alternative, the first semiconductor layer-side opening 63 may partly be formed in the plurality of semiconductor layers 30, 40, 50 prior to the formation of the current spreading conductive film 60. Once the non-conductive reflective film 91 is formed to cover the first semiconductor layer-side opening 63 having been formed, the remaining, first semiconductor layer-side opening 63 is completely formed by an additional process for perforating the non-conductive reflective film 91. Simultaneously with an additional process or in a different process, the second semiconductor layer-side opening 65 may be formed.

During dry etching for forming the plurality of first semiconductor layer-side openings 63 and the plurality of second semiconductor layer-side openings 65, halogen gases containing an F group (e.g. $CF_4$, $C_2F_6$, $C_3F_8$, $SF_6$ or the like) may be used as an etching gas.

Figure 48:
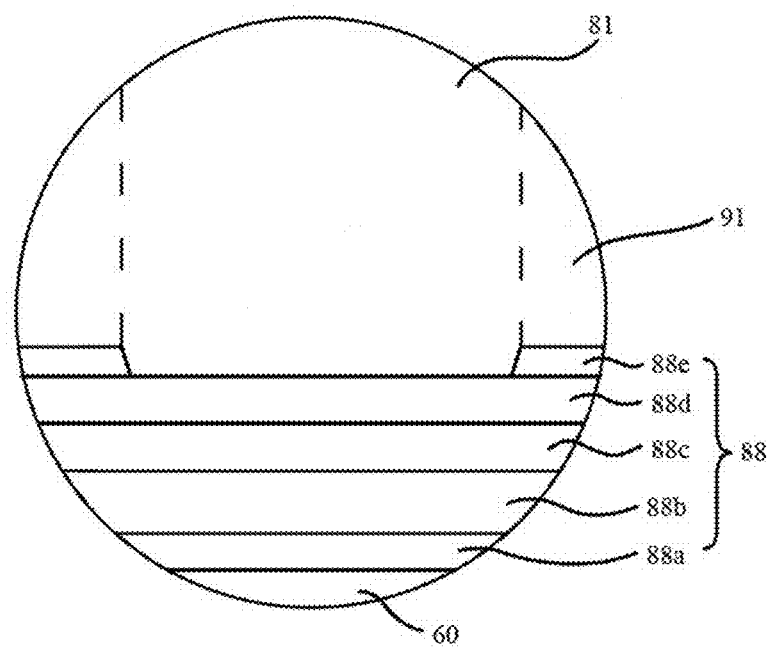

FIG. 48 is a schematic view illustrating an exemplary embodiment of the p-side finger electrode included in a semiconductor light emitting device according to the present disclosure.

The p-side finger electrode 88 may have multiple layers, as described above. For example, the p-side finger electrode 88 includes a contact layer 88a electrically connected with the second semiconductor layer 50, an anti-oxidation layer 88d formed on the contact layer 88a, and an anti-etching layer 88e formed on the anti-oxidation layer 88d. In this embodiment, the p-side finger electrode 88 includes a contact layer 88a, a reflective layer 88b, a diffusion barrier layer 88c, an anti-oxidation layer 88d and an anti-etching layer 88e, which are formed sequentially on the current spreading conductive film 60. The n-side ohmic contact pad 79 and the p-side ohmic contact pad 89 can also have the same layer structure as the p-side finger electrode 88.

The contact layer 88a is preferentially made of a material establishing a satisfactory electrical contact with the current spreading conductive film 60. A material such as Cr or Ti is typically used for the contact layer 88a. Other materials such as Ni, TiW or the like, or highly reflective materials such as Al, Ag or the like may also be used.

The reflective layer 88b may be made of a highly reflective metal (e.g. Ag, Al or a combination thereof). The reflective layer 88b reflects light generated in the active layer 40 towards the plurality of semiconductor layers 30, 40, 50. The reflective layer 88b may be omitted.

The diffusion barrier layer 88c prevents the material of the reflective layer 88b or the material of the anti-oxidation layer 88d from diffusing into other layers. The diffusion barrier layer 88c may be made of at least one selected from Ti, Ni, Cr, W, TiW or the like. If the diffusion barrier layer 88c needs to be highly reflective, Al, Ag or the like may be used.

The anti-oxidation layer 88d may be made of Au, Pt or the like, and any material that would not be oxidized easily when exposed to the outside and brought into contact with oxygen is also useful. Au, a highly electrically conductive material, is typically used for the anti-oxidation layer 88d.

The anti-etching layer 88e is a layer exposed during dry etching for forming the second semiconductor layer-side opening 65. In this embodiment, the anti-etching layer 88e is the top layer of the p-side finger electrode 88. When the anti-etching layer 88e is made of Au, it shows weak bonding strength towards the non-conductive reflective film 91, and part of Au may be damaged or ruined during etching. Hence, the anti-etching layer 88e is preferentially made of a material such as Ni, W, TiW, Cr, Pd, Mo or the like, instead of Au, in order to retain the bonding strength towards the non-conductive reflective layer 91, thus improving reliability.

During dry etching, the anti-etching layer 88e protects the p-side finger electrodes 88, and in particular it prevents damages on the anti-oxidation layer 88d. During dry etching, halogen gases containing an F group (e.g. $CF_4$, $C_2F_6$, $C_3F_8$, $SF_6$ or the like) may be used as an etching gas. To avoid any damage on the anti-oxidation layer 88d during dry etching, the anti-etching layer 88e is preferentially made of a material having high etching selectivity. If the anti-etching layer 88e has poor etching selectivity, the anti-oxidation layer 88e may be damaged or ruined during dry etching. Therefore, from the perspective of etching selectivity, Cr or Ni is a suitable choice of materials for the anti-etching layer 88e. Ni or Cr does not or only slightly reacts with the etching gas during dry etching, thereby remaining in a non-etched condition, which enables the anti-etching layer to protect the p-side finger electrode 88.

Meanwhile, the etching gas used in dry etching for forming the second semiconductor layer-side openings 65 may produce a material such as an insulation material or impurities on the top layer of the p-side finger electrode 88. For example, the material may be produced by a reaction between the halogen etching gas containing an F group and the top layer metal of the p-side finger electrode 88. For instance, Ni, W, TiW, Cr, Pd, Mo and the like, which are the materials of the anti-etching layer 88e, may at least partly react with the etching gas used in dry etching, and produce the material (e.g. NiF). However, the material thus produced can cause deterioration of the electrical properties (e.g. an increased operating voltage) of the semiconductor light emitting device. Another part of Ni, W, TiW, Cr, Pd, Mo and the like, which are the materials of the anti-etching layer 88e, may react with the etching gas but will not produce the material at all or produce a very small amount of the material. It is desirable to suppress the production of the material, or allow only a very small amount to be produced. From this perspective, Cr is preferred to Ni as a material for the anti-etching layer 88e.

In this embodiment, due to the material being produced, the top layer of the p-side finger electrode 88, i.e. a part of the anti-etching layer 88e in correspondence to the second semiconductor layer-side opening 65 is subjected to wet etching (a second etching process) and removed such that, as shown in FIG. 48, a part of the anti-oxidation layer 88d in correspondence to the second semiconductor layer-side opening 65 is exposed. As such, the material as well as the anti-etching layer 88e are etched and removed. With the material having been removed, the p-side finger electrode 93 and the second electrical connection 81 may have a better electrical contact between them, and deterioration of the electrical properties of the semiconductor light emitting device is avoided.

Alternatively, the first semiconductor layer-side openings 63 and the second semiconductor layer-side openings 65 may be formed by wet etching. In this case, the etchant for the non-conductive reflective film 91 may be HF, BOE, $NHO_3$, or HCl, which is used singly or in combination at a suitable concentration. Similar to dry etching mentioned above, the anti-etching layer 88e preferentially has high etching selectively for protecting the anti-oxidation layer 88d. From this perspective, Cr is a suitable material for the anti-etching layer 88e. Then a part of the anti-etching layer 88e in correspondence to the second semiconductor layer-side opening 65 can be removed by another subsequent wet etching.

As a result of the processes of forming the second semiconductor layer-side opening 65 and removing a part of the anti-etching layer 88e in correspondence to the second semiconductor layer-side opening 65, the non-conductive reflective film 91 and the anti-etching layer 88e having excellent bonding strength in other parts except for the second semiconductor layer-side opening 65 are brought into contact with each other, and, for example, the p-side finger electrode 88 will have a stack of Cr (contact layer)/Al (reflective layer)/Ni (diffusion barrier layer)/Au (anti-oxidation layer)/Cr (anti-etching layer) arranged sequentially. Also, having removed a part of the anti-etching layer 88e in correspondence to the second semiconductor layer-side opening 65 to avoid deterioration of electrical properties, the p-side finger electrode 88 will have a stack of Cr (contact layer)/Al (reflective layer)/Ni (diffusion barrier layer)/Au (anti-oxidation layer) arranged sequentially, in which the anti-oxidation layer 88d may come into contact with a second electrical connection 81 (to be described). The ohmic contact pad 89, 79 can also have the same layer structure as the p-side finger electrode 88, and in the part in correspondence to the second semiconductor layer-side opening 65, the anti-oxidation layer 88d of the p-side ohmic contact pad 89 may come into contact with a third electrical connection 82 (to be described).

Unlike the embodiment shown in FIG. 48, in the part in correspondence to the second semiconductor layer-side opening 65, the anti-etching layer 88e may be partly wet etched down to a certain thickness, leaving the other part of the anti-etching layer 88e non-etched; and the material centered on the top face of the anti-etching layer 88e can be removed.

Figure 49:
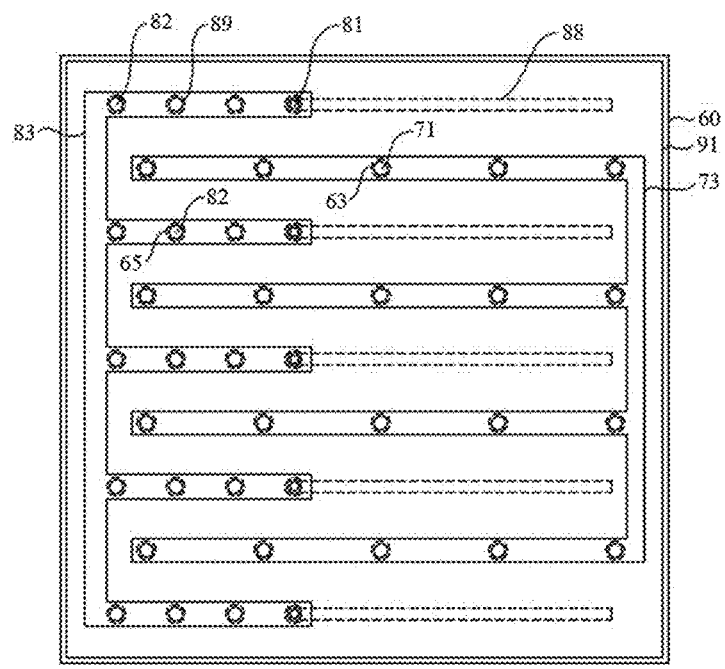

Referring next to FIG. 49, first electrical connections 71 are formed in the first semiconductor layer-side openings 63, second electrical connections 81 and third electrical connections 82 are formed on the second semiconductor layer-side openings 65, and a first connection electrode 73 and a second connection electrode 83 are formed on the non-conductive reflective film 91. The first and second connection electrodes 73, 83 may be formed in a separate process or during the same process for forming the first, second and third electrical connections 71, 81, 82. In general, materials of the first and second connection electrode 73, 83 are plated, deposited or filled in the first and second semiconductor layer-side openings 63, 65, and thus, the first, second and third electrical connections 71, 81, 82 can be formed together with the first and second connection electrodes 73, 83.

For example, the first connection electrode 73 and the second connection electrode 83 may be deposited using sputtering equipment, E-beam equipment or the like. For a stable electrical contact, the first electrical connection 71, the second electrical connection 81 and the third electrical connection 82 may be formed using Cr, Ti, Ni or an alloy thereof, and may include a reflective metal layer such as Al or Ag.

In this embodiment, the first connection electrode 73 interconnects the plurality of first electrical connections 71 and has a finger shape. The second connection electrode 83 connects the plurality of second and third electrical connections 82, has a finger shape and is arranged in an interdigitate finger shape with the first electrical connection 71. The first electrical connection 71 is arranged between the p-side finger electrodes 88, and between the fingers of the second connection electrode 83. The third electrical connection 82 is positioned on the opposite side of the p-side finger electrode 88 with respect to the second electrical connection 81. Below the second electrode 85, the p-side finger electrode 88 is connected with the second electrical connection 81 close to the first electrode 75 and stretches down below a first electrode 75.

Next, as can be seen in FIG. 50, an insulating layer 95 covering the first and second connection electrodes 73, 83 is formed. The insulating material 95 is typically made of $SiO_2$. Other examples may include SiN, TiO2, Al2O3 and Su-8, but are not limited thereto. Then at least one first electrode-side opening and at least one second electrode-side electrode 98 are formed in the insulating layer 95.

Referring again to FIG. 50, a first and a second electrode 75, 85 may be deposited on the insulating layer 95 using, for example, sputtering equipment, E-beam equipment or the like. The first electrode 75 is connected to the first connection electrode 73 through the at least one first electrode-side opening 97, and the second electrode 85 is connected to the second connection electrode 83 through the at least one second electrode-side opening 98.

The first electrode 75 and the second electrode 85 can be electrically connected with an electrode prepared in the outside (package, COB, sub-mount, or the like) by means of a stud bump, conductive paste or eutectic bonding. In the case of eutectic bonding, it is important that the first electrode 75 and the second electrode 85 have comparable heights without much difference. In the semiconductor light emitting device according to this embodiment, the first electrode 75 has almost the same height as the second electrode 85 since they can be formed on the insulating layer 95 through the same process. In this regard, eutectic bonding is useful. When the semiconductor light emitting device is electrically connected to the outside through eutectic bonding, the top part of the first and second electrodes 75, 85 may be formed of a eutectic bonding material such as an Au/Sn alloy or an Au/Sn/Cu alloy.

A light absorption barrier film or a current blocking layer may be additionally provided between the second semiconductor layer 50 and the light transmitting conductive film 60, in correspondence to the p-side ohmic contact pad 89 and the p-side finger electrode 88.

The semiconductor light emitting device illustrated in FIG. 44 through FIG. 50 includes a first electrode part electrically communicating with the first semiconductor layer 30, and a second electrode part electrically communicating with the second semiconductor layer 50. At least one of the first electrode part and the second electrode part includes a lower electrode, an upper electrode, and an electrical connection for connecting them. For example, in FIG. 44, the second electrode part includes a lower electrode 88, 89, an upper electrode 83, and electrical connections 81, 82. The second electrode 85 becomes the upper electrode 83 and a separate bonding pad. Meanwhile, the electrical connections 81, 83, and the second connection electrode 83 can be taken as the electrical connections extended from the opening up to the upper face of the non-conductive reflective film, and the second electrode 85 can be taken as the upper electrode. In FIG. 44 and FIG. 50, the first electrode part includes a lower electrode 79, an upper electrode 73 and an electrical connection 71. Meanwhile, the electrical connection 71 and the first connection electrode 73 can be taken as the electrical connections extended from the opening up to the upper face of the non-conductive reflective film, and the first electrode 75 can be taken as the upper electrode.

Figure 51:
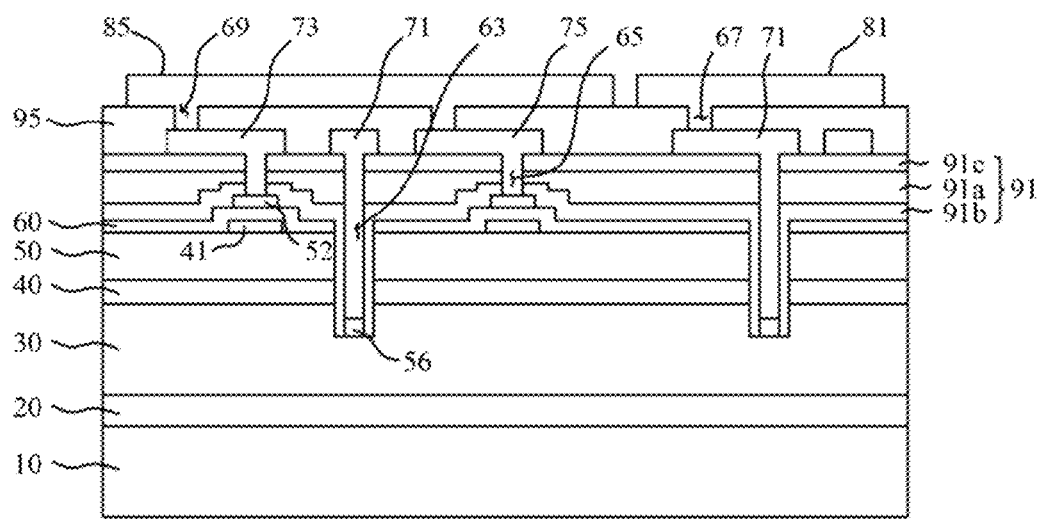
FIG. 51 is a schematic view illustrating an exemplary embodiment of a semiconductor light emitting device according to the present disclosure.

FIG. 51 is a schematic view illustrating an exemplary embodiment of a semiconductor light emitting device according to the present disclosure.

In this embodiment, the semiconductor light emitting device includes a substrate 10, a plurality of semiconductor layers, a light absorption barrier film 41, a current spreading conductive film 60, a first ohmic contact pad 56, a second ohmic contact pad 52, a non-conductive reflective film 91, a first connection electrode 71, a second connection electrode 73, a third connection electrode 75, a first electrode 81 and a second electrode 85. FIG. 51 is a schematic view illustrating a cutaway portion, taken along line A-A in FIG. 59.

In the following, a Group III-nitride semiconductor light emitting device will be explained as an example.

In the embodiment, a non-conductive reflective film 91 is provided with a plurality of first openings 63 and a plurality of second openings 65, each opening being used as an electrical connecting pass. The plurality of first openings 63 is formed, passing through the non-conductive reflective film 91, the second semiconductor layer 50, the active layer 40, and until reaching down to part of the first semiconductor layer 30; and the plurality of second openings 65 is formed, passing through the non-conductive reflective film 91.

The first connection electrode 71, the second connection electrode 72 and the third connection electrode 75 are formed on the non-conductive reflective film 91, e.g. on the clad film 91c. The first connection electrode 71 is led into the plurality of first opening 63 and electrically connected with the first semiconductor layer 30. The second connection electrode 73 and the third connection electrode 75 are electrically connected with the second semiconductor layer 50 through the plurality of second openings 65. For a stable electrical contact, the first connection electrode 71, the second connection electrode 73 and the third connection electrode 75 may be formed using Cr, Ti, Ni or an alloy thereof, and may include a reflective metal layer such as Al or Ag.

The second connection electrode 73 and the third connection electrode 75 are led into the plurality of second opening 65 and electrically connected with the current spreading conductive film 60. In this embodiment, the dielectric film 91b extends from between the current spreading conductive film 60 and the DBR 91a to the inner face of the first opening 63, thereby insulating the first electrical connection 71 from the second semiconductor layer 50, the active layer 40. On the other hand, a separate insulating film may be formed between the DBR 91b and the current spreading conductive film 60.

The light absorption barrier film 41 is formed between the second semiconductor layer 50 and the current spreading conductive film 60, at the position in correspondence to each of the plurality of second openings 65. The light absorption barrier film 41 may be made of $SiO_2$, $TiO_2$ or the like, and it may as well be omitted. The light absorption barrier film 41 prevents current concentration directly downwards from the second opening 65, which in turn helps current diffusion or current spreading and prevents deterioration of the device due to the current concentration.

The first ohmic contact pad 56 is formed on the first semiconductor layer 30 exposed through the plurality of first openings 63, and makes a contact with the first semiconductor layer 30 and with the first connection electrode 71 led into the first opening 63. When the first semiconductor layer 30 is made of Si-doped GaN, the first ohmic contact pad 56 may be made of a combination of Cr, Ti, Al, Ag, Ni, Pt, W or Au. For example, the first ohmic contact pad 56 may include an ohmic contact layer (e.g. Cr, Ti or the like)/a reflective metal layer (e.g. Al, Ag or the like)/a first barrier layer (e.g. Ni, Cr, Ti, W, Pt, TiW or the like)/an anti-oxidation layer (e.g. Au, Pt or the like)/a second barrier layer (e.g. Cr, Ti, Ni, Pt, Al or the like), which are stacked sequentially. The ohmic contact layer is made of a metal having a low work function and establishes an ohmic contact with the first semiconductor layer 30 (e.g. n-GaN). The reflective metal layer reduces the absorption loss by reflecting light. The first barrier layer prevents spreading between a reflective metal layer and an anti-oxidation layer. The anti-oxidation layer can prevent oxidation of the first barrier layer, and establish a satisfactory electrical contact with the first connection electrode 71. Although the second barrier layer may come into contact with the first connection electrode 71, it may serve as a protecting metal layer for protecting the anti-oxidation layer during the manufacturing process, and preferentially part of the second barrier layer may be removed to allow an electrical contact between the first connection electrode 71 and the anti-oxidation layer.

The first ohmic contact layer may have a thickness of 5 Å-500 Å, the reflective metal layer may have a thickness of 500 Å-10000 Å, the first barrier layer may have a thickness of about 100 Å-5000 Å, and the second barrier layer may have a thickness of about 10 Å-1000 Å. If necessary, some layers of the multilayered first ohmic contact pad 56 may be omitted, or a new layer may be added.

Figure 52:
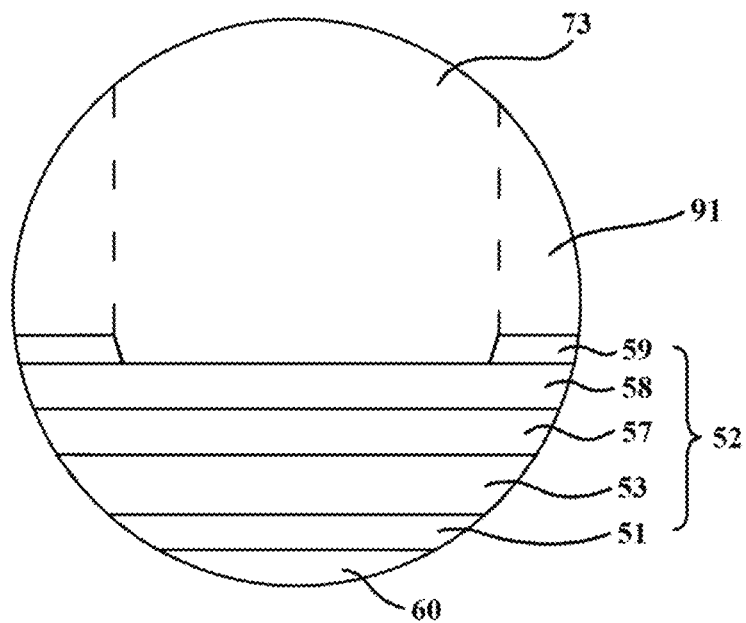
FIG. 52 is a schematic view illustrating an example of a second ohmic electrode.
Figure 53:
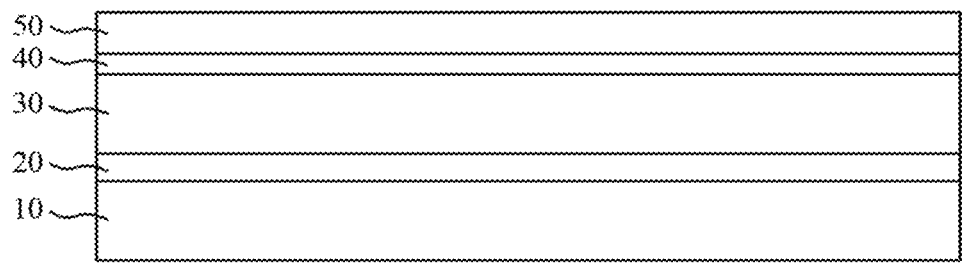
FIG. 53 through FIG. 59 are schematic views illustrating an exemplary embodiment of a manufacturing method of a semiconductor light emitting device according to the present disclosure.
Figure 54:
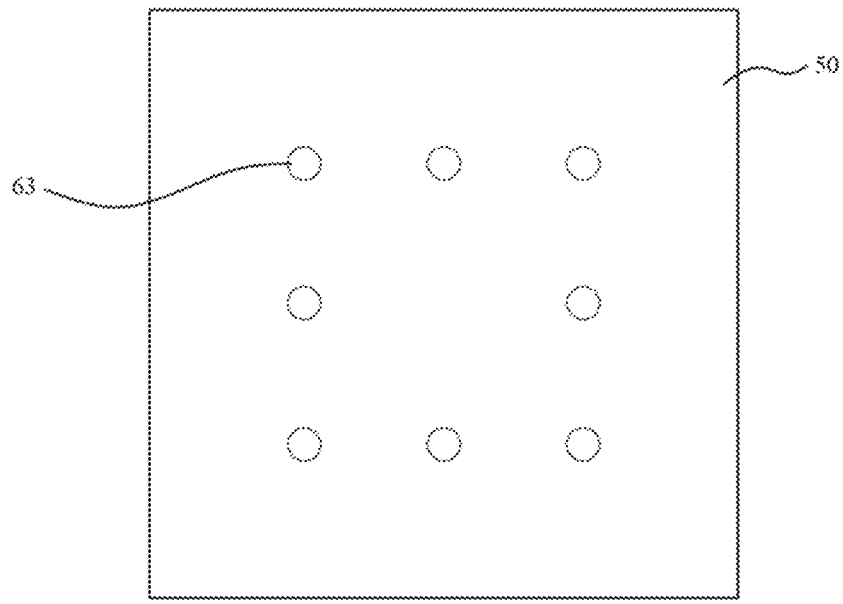
Figure 55:
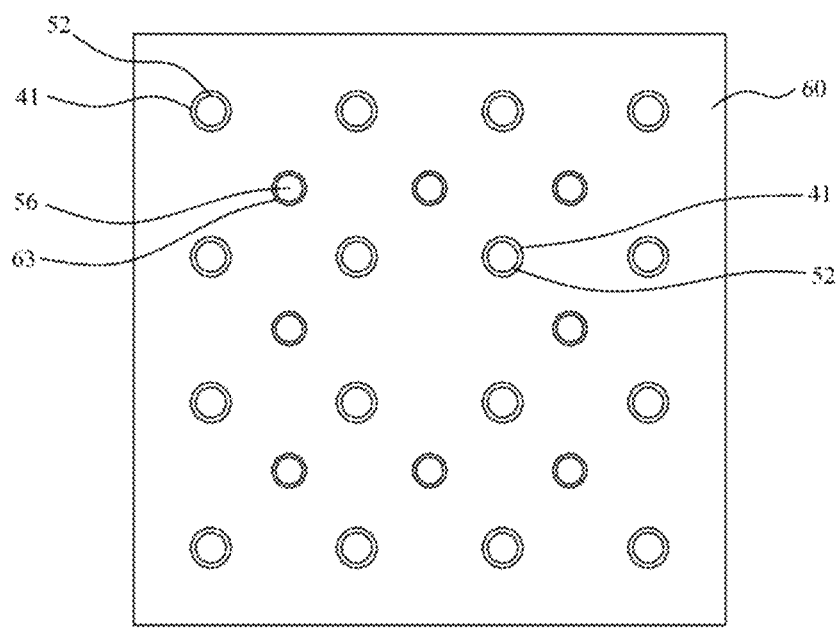
Figure 56:
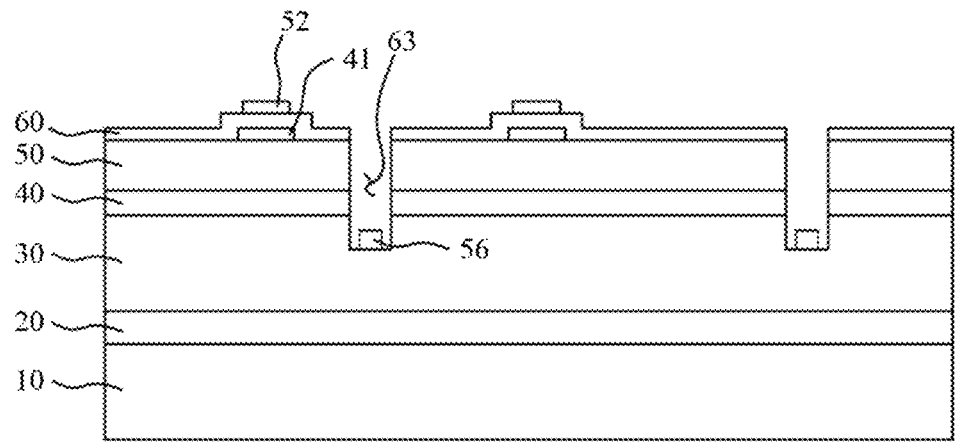

FIG. 52 is a schematic view illustrating an example of the second ohmic electrode.

Figure 58:
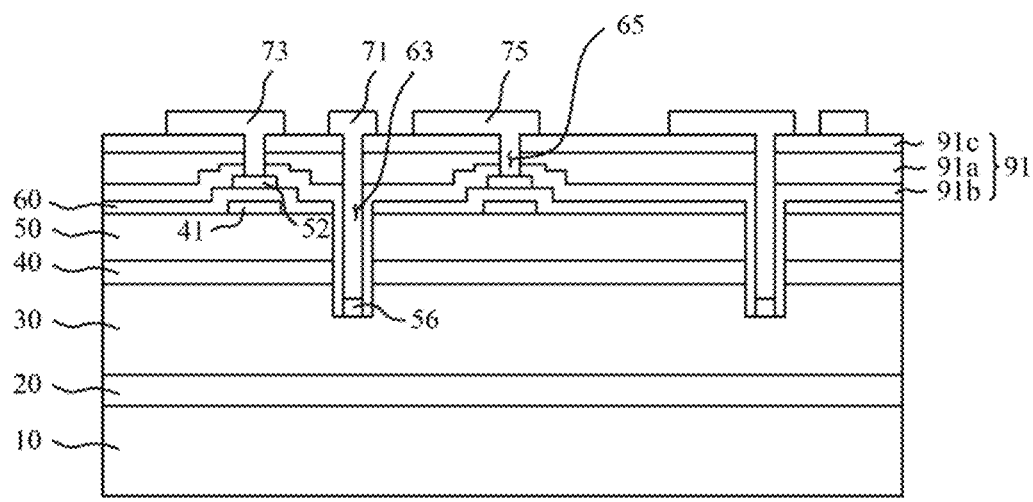

The second ohmic contact pad 52 is formed between the current spreading conductive film 60 and the dielectric film, in correspondence with the light absorption barrier film 41. As can be seen in FIG. 51 and FIG. 58, the second ohmic contact pad 52 is partly exposed through the second opening 65, and the non-conductive reflective film 91 is raised up on the edges of the second ohmic contact pad 52. The second ohmic contact pad 52 comes into contact with the current spreading conductive film 60, and with the second and third connection electrodes 73, 75 led into the respective second openings 65.

Unlike this embodiment, if the second ohmic contact pad 52 is omitted, if the current spreading conductive film 60 is made of ITO, and if the lowermost layer Cr or Ti of the second electrode 73 and the third connection electrode 75 is brought into contact with the lowermost layer Cr or Ti, a contact resistance may not be favorable. This is because it is highly possible that the surface of ITO may be damaged while forming openings in a non-conductive reflective film 91 (to be described), thereby increasing the contact resistance.

The second ohmic contact pad 52 may be formed into multilayers of a combination of Cr, Ti, Al, Ag, Ni, Pt, W or Au. Although the second ohmic contact pad 52 is not required to have the same structure as the first ohmic contact pad 56, it may have a similar multilayer structure. For example, the second ohmic contact pad 52 may have sequentially alternating layers of the contact layer 51/the reflective metal layer 53/the first barrier layer 57/the anti-oxidation layer 58/the second barrier layer 59.

The contact layer 51 is provided on top of the current spreading conductive film 60, and can be made of a material having a lower contact resistance with the current spreading conductive film 60 (e.g. Cr, Ti, Ni or the like). The reflective metal layer 53 is made of a highly reflective metal (e.g. Al, Ag or the like) and lowers the absorption loss by reflecting light. The first barrier layer 57 may be made of Ni, Cr, Ti, W, Pt, TiW or the like, and prevent spreading between the reflective metal layer 53 and the anti-oxidation layer 58. The anti-oxidation layer 58 may be made of Au, Pt or the like, prevent the oxidation of the first barrier layer 57, and establish a satisfactory electrical contact with the second and third connection electrodes 73, 75. The second barrier layer 59 may be made of Cr, Ti, Ni, Pt, Al or the like. The second barrier layer 59 should demonstrate high bonding strength with the non-conductive reflective film 91 and have a function as a protecting metal film since it is exposed during forming an opening in the non-conductive reflective film 91. It is preferentially made of a material having high etching selectivity as it may be partly etched when needed. Cr, Pt and Al will be suitable choices for the second barrier layer 59 considering these requirements, and Ni is also acceptable. Although the second barrier layer may come into contact with the second and third connection electrodes 73, 75, it may also serve as a protecting metal layer for protecting the anti-oxidation layer during the manufacturing process. Preferentially, the second barrier layer is partly removed, allowing an electrical contact between the second and third connection electrodes 73, 75 with the anti-oxidation layer 58.

The contact layer 51 may have a thickness of 5 Å-500 Å, the reflective metal layer 53 may have a thickness of 500 Å-10000 Å, the first barrier layer 57 may have a thickness of about 100 Å-5000 Å, and the second barrier layer 59 may have a thickness of about 10 Å-1000 Å. If necessary, some layers of the multilayered second ohmic contact pad 52 may be omitted, or a new layer may be added.

The second ohmic contact pad 52 has a plurality of islands in correspondence to the plurality of second openings 65. In other words, the second ohmic contact pad 52 is formed into a plurality of islands in correspondence to the plurality of second openings 65. To promote current spreading, an additional metal layer (e.g. finger electrode) may be provided for connecting the plurality of islands of the second ohmic contact pad 52. However, from the perspective of reducing light absorption, it is desirable to have as less metal layers as possible between the plurality of semiconductor layers 30, 40, 50 and the non-conductive reflective film 91. In this embodiment, the plurality of first openings 63 and the plurality of second openings 65 are provided as current supply passes; the first ohmic contact pad 56 and the second ohmic contact pad 52 have a plurality of islands in correspondence to the plurality of first openings 63 and the plurality of second openings 65, respectively; and current spraying is done by preventing current concentration by the light absorption barrier film 41. In addition, the first ohmic contact pad 56 and the second ohmic contact pad 52 facilitate the supply of current, thereby lowering an operating voltage.

In this embodiment, as described above, the plurality of first openings 63 and the plurality of second openings 65 are formed as electrical connection passes of the first, second and third connection electrodes 71, 73, 75, for current spreading or uniform current supply. Alternatively, the plurality of semiconductor layers 30, 40, 50 may be mesa etched, and for current spreading a finger electrode may be arranged on the exposed first semiconductor layer 30 by mesa etching. However, this approach results in a reduced light emitting surface due to mesa etching. Meanwhile, in this embodiment, current is supplied through the plurality of first openings 63 having a very small etching area. Moreover, the number of the plurality of second openings 65 may be greater than or equal to the number of the plurality of first openings 63, so as to balance spreading of holes and electrons. As this structure has a number of electrical connections through the plurality of first and second openings 63, 65, it is important to have improved electrical contact properties. In this embodiment, the first ohmic contact pad 56 and the second ohmic contact pad 52 are formed in correspondence with the plurality of first openings 63 and the plurality of second openings 65, given that the first ohmic contact pad 56 and the second ohmic contact pad 52 are formed in a plurality of islands so as to use less metal layers as possible between the plurality of semiconductor layers 30, 40, 50 and the non-conductive reflective film 91, as described above.

Figure 57:
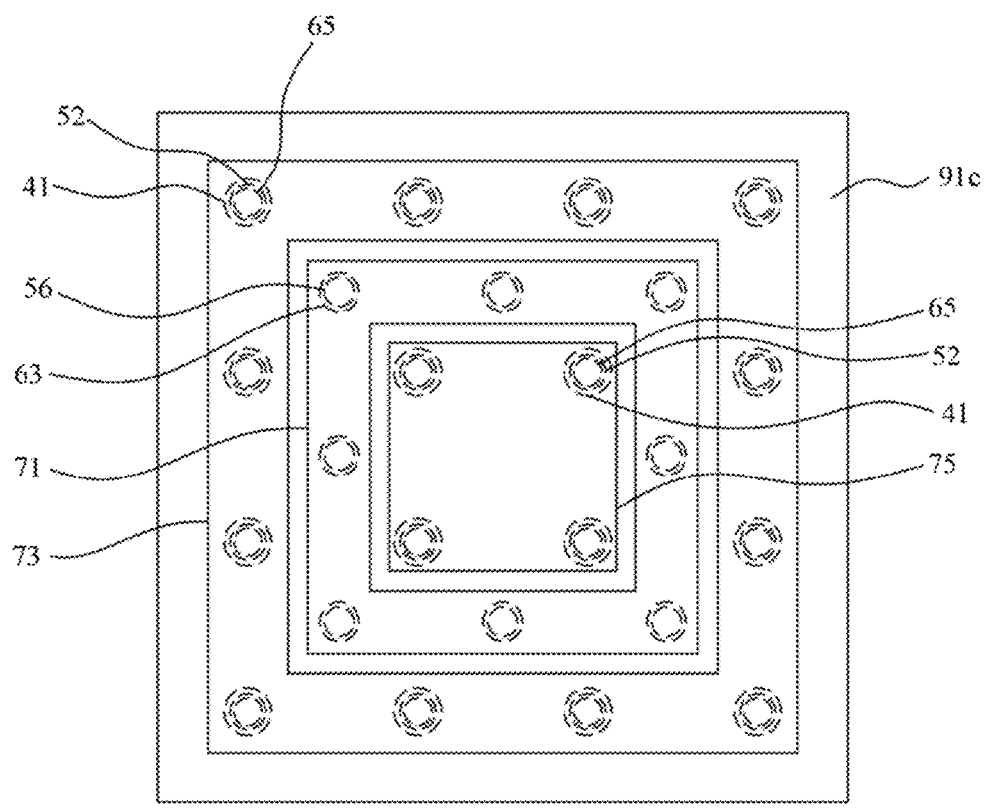

The number, spacing and layout of the first and second openings 63, 65 may suitably modified, depending on the size of the semiconductor light emitting device, and for accomplishing current spreading, uniform current supply and homogeneous emission of light. In this embodiment, the plurality of first openings 63 and the plurality of second openings 65 are arranged symmetrically around the center of the semiconductor light emitting device (see FIG. 57). As current is supplied through the plurality of first and second openings 63, 65, it is possible that current may be concentrated more in some of the first and second openings 63, 65 especially if the current is not uniform, and this can lead to deterioration at those locations having concentrated current. In this embodiment, at least one of the first connection electrode 71, the second connection electrode 73 and the third connection electrode 75 is formed on the non-conductive reflective film 91 in a closed loop shape such that a higher current uniformity is obtained across the light emitting face (see FIG. 57). Here, the closed loop shape encompasses a fully closely loop shape as well as a partially open loop shape. In this embodiment, the second connection electrode 73 has a closed loop shape, the first connection electrode 71 has a closed loop shape in the inside of the second connection electrode 73, and the third connection electrode 75 has a quadrangular plate shape in the inside of the first connection electrode 71 (see FIG. 57). In this embodiment, the first and second openings 63, 65 are not provided in the inside of the third connection electrode 75, i.e. at the center. As such, heat emission from the interior area where a relatively large amount of heat is emitted can be reduced.

The insulating layer 95 above the non-conductive reflective film 91 covers the first connection electrode 71, the second connection electrode 73 and the third connection electrode 75. The insulating layer 95 has at least one, third opening 68; and at least one, fourth opening 69. The insulating layer 95 may be made of SiO$_2$.

The first electrode 81 and the second electrode 85 are formed on the insulating layer 95. The first electrode 81 is electrically connected with the first connection electrode 71 through the third opening 67, and supplies electrodes to the first semiconductor layer 30. The second electrode 85 is electrically connected with the second and third connection electrodes 73, 75 through the fourth opening 69, and supplies holes to the second semiconductor layer 50. The first electrode 81 and the second electrode 85 may be eutectic bonding electrodes.

In the semiconductor light emitting device, light absorption is reduced using a non-conductive reflective film (the non-conductive reflective film 91) including a DBR 91a in place of a metal reflective film. In addition, the presence of the plurality of first openings 63 and the plurality of second openings 65 facilitates current spreading towards the plurality of semiconductor layers 30, 40, 50. Moreover, as the plurality of first openings 63 and the plurality of second openings 65 are connected to those closed loop-shaped, first connection electrode 71 or second and third connection electrodes 73, 75, uniform current supply is achieved, thereby preventing deterioration due to current concentration. Also, with of the first ohmic contact pad 56 and the second ohmic contact pad 52 being available, current supply is facilitated and the operating voltage is lowered.

Figure 60:
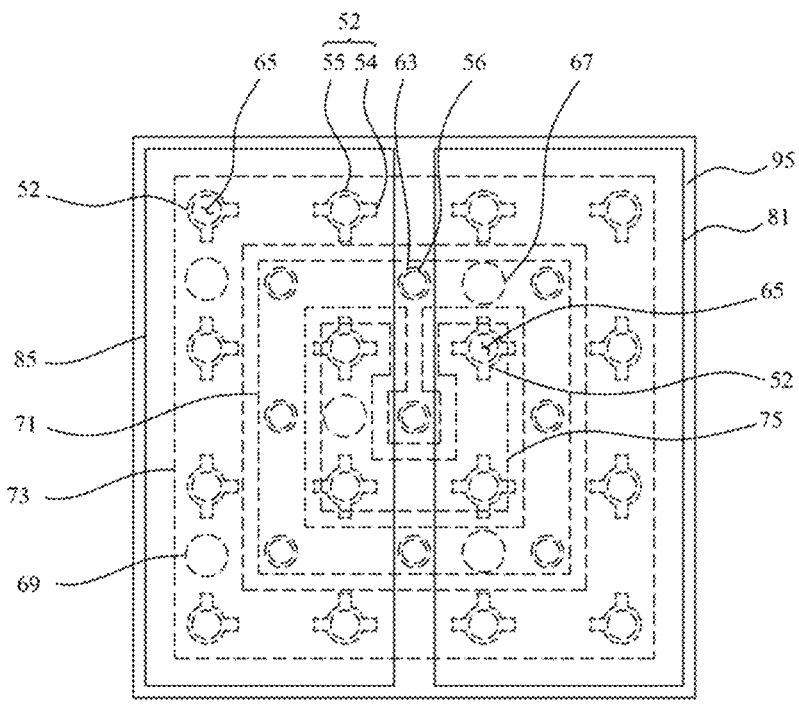
FIG. 60 is a schematic view illustrating a further exemplary embodiment of a semiconductor light emitting device according to the present disclosure.

FIG. 60 is a schematic view illustrating a further exemplary embodiment of a semiconductor light emitting device according to the present disclosure.

This semiconductor light emitting device is substantially identical with the semiconductor light emitting device illustrated in FIG. 51 through FIG. 59, except that a light absorption barrier film is omitted, the second ohmic contact pad 52 has an ohmic contact branch 54, and the first opening 63 is additionally formed at the center of the light emitting face.

Although a light absorption barrier film is optional, this embodiment does not have the light absorption barrier film. Hence, there is a possibility that the first ohmic contact pad 56 and the second ohmic contact pad 52 might absorb light. However, as described with reference to FIG. 52, when the first and second ohmic contact pads 56, 52 has a highly reflective metal layer (e.g. Al, Ag or the like), the level of light absorption by these pads will be insignificant. Meanwhile, this is well compromised by a smaller number of process steps and a lowered operating voltage.

As the first opening 63 is added to the center of the light emitting face, the balance between electrons and holes at the central region can be improved and light emission can be enhanced.

The first ohmic contact pad 56 and the second ohmic contact pad 52 are provided in the form of a plurality of islands in one-to-one correspondence with the plurality of first openings 63 and the plurality of second openings 65. For current spreading and uniform supply, the first ohmic contact pads 56 and the second ohmic contact pads 52 are arranged symmetrically around the center of the light emitting face. The second ohmic contact pad 52 includes an ohmic contact pad 55 and an ohmic contact branch 54. The ohmic contact pad 55 corresponds to the second opening 65, and comes into contact with the second and third connection electrodes 73, 75 lead into the second opening 65. The ohmic contact branch 54 is projected from the ohmic contact pad 55 in a branch form with a width smaller than the width of the ohmic contact pad 55. Although a light absorption barrier film is omitted, the ohmic contact branch 54 can serve to promote current spreading in the lateral direction, to facilitate current flow, and to improve the uniformity of current distribution. Further, the second ohmic contact pad 52 and the first ohmic contact pad 56 are closer to each other by the ohmic contact branch 54, and may contribute to a drop in the operating voltage.

Figure 61:
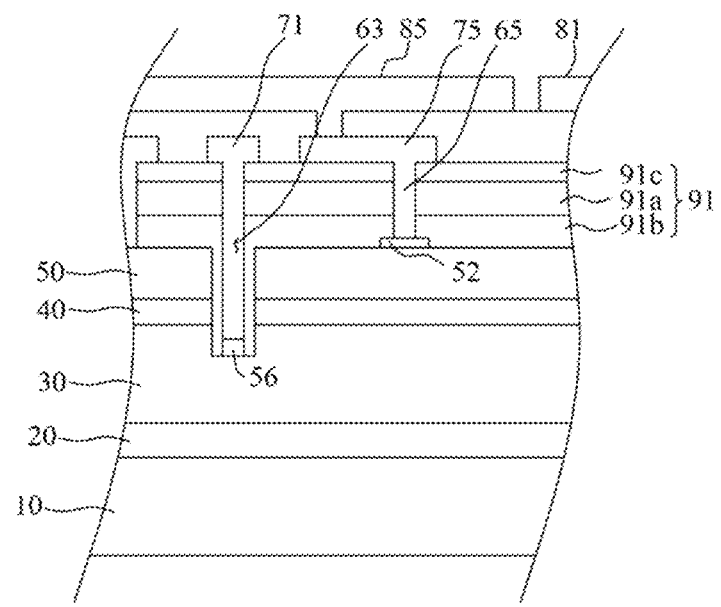
FIG. 61 is a schematic view illustrating a still further exemplary embodiment of a semiconductor light emitting device according to the present disclosure.

FIG. 61 is a schematic view illustrating a still further exemplary embodiment of a semiconductor light emitting device according to the present disclosure.

This semiconductor light emitting device is substantially identical with the semiconductor light emitting device illustrated in FIG. 51 through FIG. 57, except that the former is not provided with a current spreading conductive film and a light absorption barrier film. Hence, common features will not be described to avoid redundancy.

The second ohmic contact pad 52 comes into contact with the second semiconductor layer 50. The second ohmic contact pad 52 may be made of a metal (e.g. Ni, Au, Pt) having a work function greater than the work function of the second semiconductor layer 50 to establish an ohmic contact between the second semiconductor layer 50 as the p-type semiconductor layer (e.g. Mg-doped GaN) and the metal. In addition, the ohmic contact can be enhanced even more by a subsequent thermal process.

Since the current spreading conductive film also absorbs light, it may as well be omitted to reduce an amount of light absorbed. The absence of a light absorption barrier film may be advantageous for reducing a step in the formation of a non-conductive reflective film 91, in particular, in the formation of a DBR.

Meanwhile, as in this embodiment, if a current spreading conductive film (e.g. ITO) for current spreading is not provided, it can be an option to apply the structure described above to GaAs, InP semiconductor light emitting devices which can be p-doped at a very high concentration, instead of applying the structure to those having p-GaN second semiconductor layer 50.

In this embodiment, the first electrode part includes a lower electrode 56 (the first ohmic contact pad), an electrical connection 71 (the first connection electrode) and an upper electrode 81 (the first electrode). The second electrode part includes a lower electrode (52: the second ohmic contact pad; 75: the second connection electrode, the third connection electrode), and an upper electrode 85 (the second electrode). Seeing that the first, second and third connection electrodes, together with the electrical connection, form the upper electrode, the first electrode and the second electrode may be taken as a bonding pad, independent of the upper electrode.

Figure 62:
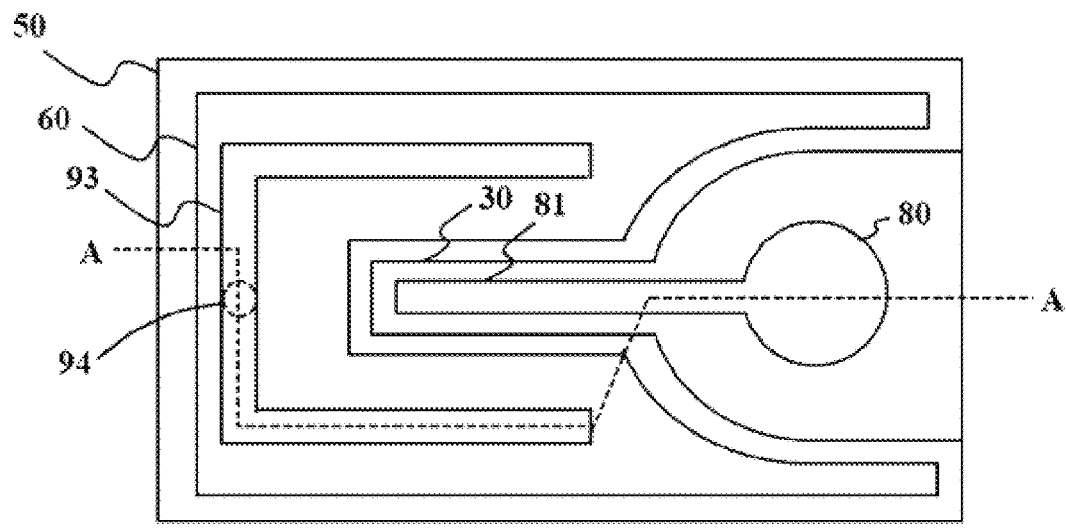
FIG. 62 is a schematic view illustrating a still further exemplary embodiment of a semiconductor light emitting device according to the present disclosure.
Figure 63:
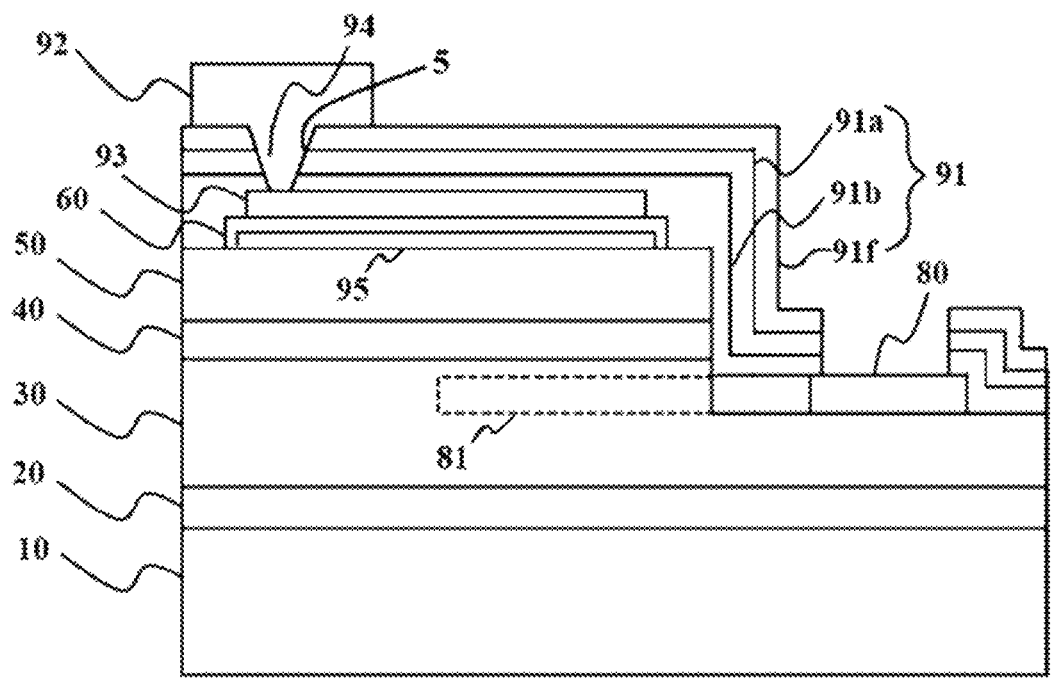
FIG. 63 is a schematic view illustrating a cutaway portion, taken along line A-A in FIG. 62.

FIG. 62 is a schematic view illustrating a still further exemplary embodiment of a semiconductor light emitting device according to the present disclosure, and FIG. 63 is a schematic view illustrating a cutaway portion, taken along line A-A in FIG. 62.

The semiconductor light emitting device includes a substrate 10, a plurality of semiconductor layers 30, 40, 50, a dielectric film 91b, a DBR 91a, a clad film 91f, a first electrode 80 and a second electrode 92. The dielectric film 91b or the clad film 91f may be omitted. For brevity of description, the dielectric film 91b, the DBR 91a, the clad film 91f and the second electrode 92 are not illustrated in FIG. 62.

The plurality of semiconductor layers formed on the substrate 10 includes a first semiconductor layer 30 having a first conductivity type, a second semiconductor layer 50 having a second conductivity type different from the first conductivity type, and an active layer 40 which is interpositioned between the first semiconductor layer 30 and the second semiconductor layer 50 and generates light by electron-hole recombination.

For example, a buffer layer 20 is grown on the substrate 10, and then, on the buffer layer 30, an n-type semiconductor layer 30 (the first semiconductor layer), an active layer 40 and a p-type semiconductor layer 50 (the second semiconductor layer) are sequentially grown.

The substrate 10, which may eventually be removed, is typically made of sapphire, SiC, Si, GaN or the like, and the buffer layer 20 may be omitted.

The p-type semiconductor layer 50 and the active layer 40 are mesa-etched, thereby exposing a part of the n-type semiconductor layer. The mesa etching may be carried out in different orders.

A light absorption barrier film 95 is formed on a part of the p-type semiconductor layer 50. The light absorption barrier film 95 may be formed in correspondence with a p-side finger electrode 93 (to be described). While the light absorption barrier film 95 may be introduced to reduce light absorption by the p-side finger electrode 83, it may as well be omitted in some cases. The light absorption barrier film 95 may be composed of a single layer (e.g. $SiO_2$) that is made of a light transmitting material having a lower refractive index than the refractive index of the p-type semiconductor layer 50, or a multilayered structure (e.g. $SiO_2/TiO_2/SiO_2$), or a DBR, or a combination of the single layer and the DBR. In addition, the light absorption barrier film 95 may be made of a non-conductive material (e.g. a dielectric film such as $SiO_x$, $TiO_x$ or the like).

A current spreading conductive film 60 covering the light absorption barrier film 95 is preferentially formed on the p-type semiconductor layer 50, for current spreading into the p-type semiconductor layer 150. For example, the current spreading conductive film 60 may be made of a material such as ITO, Ni/Au or the like.

Next, a p-side finger electrode 93 is formed on the current spreading conductive film 60. The p-side finger electrode 93 is electrically connected with the p-type semiconductor layer 50 by the current spreading conductive film 60. In this embodiment, the p-side finger electrode 93 may be provided in island form, unlike other finger electrodes. Optionally, the p-side finger electrode 93 may be omitted, and the p-side electrode 92 (the second electrode) may be brought into direct contact with the current spreading conductive film 60.

During the formation of the p-side finger electrode 93, an n-side bonding pad 80 (the first electrode) and an n-side finger electrode 81, which serve to supply electrons to the n-type semiconductor layer 30, may also be formed on an exposed part of the n-type semiconductor layer 30. The n-side bonding pad 80 and the n-side finger electrode 81 may be formed together with the p-side electrode 92. The n-side finger electrode 81 may be omitted.

When the substrate 10 has been removed or is conductive, the n-side bonding pad 80 may be formed either on the n-type semiconductor layer 30 side after the substrate 10 had been removed, or on the conductive substrate 10 side. The positions of the n-type semiconductor layer 30 and p-type semiconductor layer 50 may be exchanged, and these semiconductor layers are typically made of GaN in case of Group III-nitride semiconductor light emitting devices. Each of the semiconductor layers 20, 30, 40, 50 may have a multilayered structure, and an additional layer may optionally be added thereto.

Figure 1:
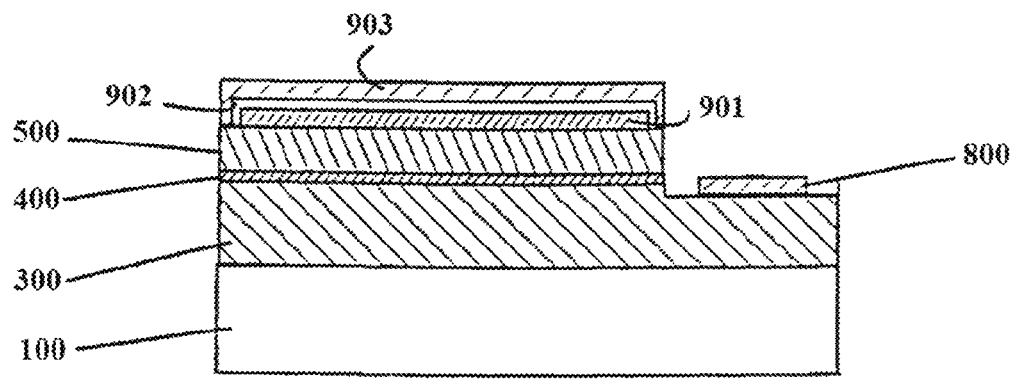
FIG. 1 is a schematic view illustrating an exemplary embodiment of the semiconductor light emitting device disclosed in U.S. Pat. No. 7,262,436.
Figure 2:
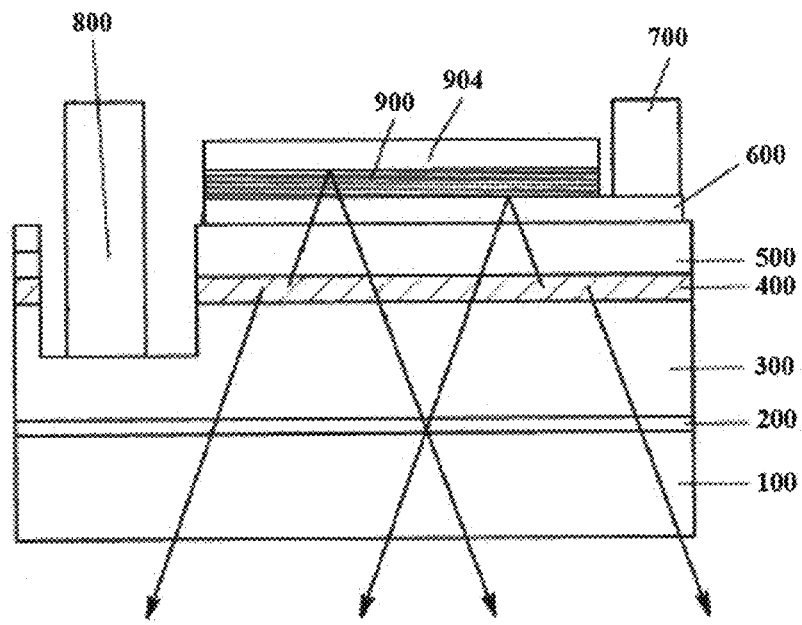
FIG. 2 is a schematic view illustrating an exemplary embodiment of the semiconductor light emitting device proposed in JP Laid-Open Pub. No. 2006-120913.

The n-side bonding pad 80 may have a height that is sufficient to be bonded with a package by means of a separate bump, or may have a certain deposition height for itself to be bonded with the package as shown in FIG. 2.

In this embodiment, a stable electrical contact is established between the current spreading conductive film 60 and the p-side electrode 92, by the p-side finger electrode 93. Cr, Ti, Ni or an alloy thereof may be used for the stable electrical contact.

Figure 64:
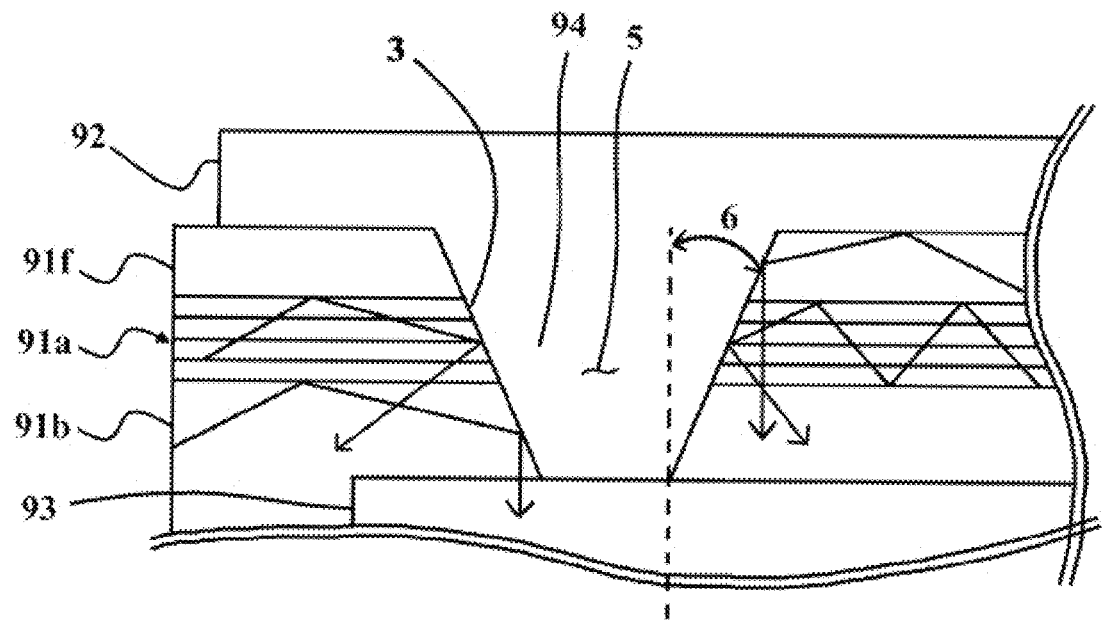
FIG. 64 is an enlarged view of a part of the semiconductor light emitting device shown in FIG. 63.

FIG. 64 is an enlarged view of a part of the semiconductor light emitting device shown in FIG. 63.

A dielectric film 91b covering the p-side finger electrode 83, a DBR 91a and a clad film 91f are formed. The dielectric film 91b or the clad film 91f may be omitted. When the DBR 91a is non-conductive, the dielectric film 91b, the DBR 91a and the clad film 91f all or collectively serve as the non-conductive reflective film 91.

The dielectric film 91b, the DBR 91a and the clad film 91f may also be formed on an exposed part of the n-type semiconductor layer 30 and of the n-side bonding pad 80 after the p-type semiconductor layer 50 and the active layer 40 had been etched. It is not necessary that the dielectric film 91*b*, the DBR 91*a* and the clad film 91*f* should cover all of the areas on the semiconductor layer 30 and the p-type semiconductor layer 50.

The DBR 91*a* serves as a reflective film, yet it preferentially is made of a light transmitting material to prevent light absorption. The DBR 91*a* is composed of a stack of several periods (repetitions) of alternating layers of $SiO_2$ and $TiO_2$, for example. In addition, the DBR 91*a* may be a combination of a highly reflective material such as $Ta_2O_5$, HfO, ZrO or SiN, and a dielectric thin film (typically $SiO_2$) having a lower refractive index than the material. When the DBR 91*a* is made of $TiO_2/SiO_2$, it is preferentially subjected to an optimum process designed in consideration of the reflectivity as a function of the incident angle and the wavelength, using the ¼ optical thickness of the wavelength of light coming out of the active light as a reference. It is not absolutely required for each layer to have a thickness corresponding to ¼ of the optical thickness of the wavelength. The number of combinations is suitably in a range from 4 to 20 pairs.

As the deposition of the DBR 91*a* needs to be done with high precision, the dielectric film 91*b* having a uniform thickness may be formed before the deposition such that, despite those deposits 50, 60, 80, 81, 93 of different natures and different forms, the DBR 91*b* can be prepared in a stable manner, and light reflection can also benefit therefrom. The dielectric film 91*b* is suitably made of $SiO_2$, and it preferentially has a thickness ranging from 0.2 μm to 1.0 μm.

In the light semiconductor light emitting device according to this embodiment, the non-conductive reflective film 91 further includes, in addition to the dielectric film 91*b* and the DBR 91*a*, a clad film 91*f* formed on the DBR 91*a*, as can be seen in FIG. 63 and FIG. 64.

The dielectric film 91*b*, the DBR 91*a* and the clad film 91*f* will be further described later.

Figure 65:
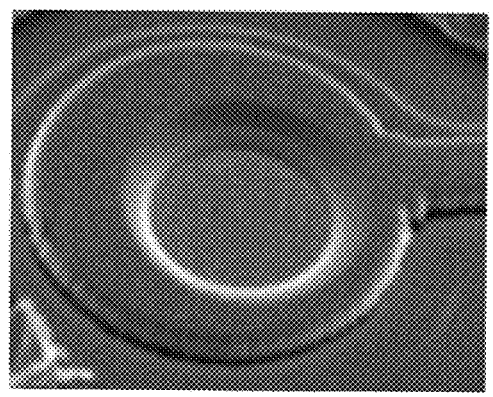
FIG. 65 is a photo showing an example of a first opening formed in a non-conductive reflective film.

FIG. 65 is a photo showing an example of a first opening formed in the non-conductive reflective film.

A first opening 5 exposing a part of the p-side finger electrode 193 is formed, passing through the dielectric film 91*b*, the DBR 91*a* and the clad film 91*f*. A combined thickness of the dielectric film 91*b*, the DBR 91*a* and the clad film 91*f* may be not more than 10 μm and not less than 0.5 μm. To form the first opening (5) passing through the film of a thickness in the above range, a process such as dry etching or wet etching may be carried out. For example, when the non-conductive reflective film 91 undergoes photolithographic processing followed by thermal processing, a resulting photoresist pattern at the location in correspondence to an opening to be formed is slanted at an angle. Then dry etching (e.g. ICP, RIE, RIBE, CAIBE or the like) is carried out using the photoresist pattern as a mask, and the first opening 5 having a slant face as shown in FIG. 65 is obtained.

The first opening 5 has an increasing width as it gets farther away from the plurality of semiconductor layers 30, 40, 50. Therefore, as can be seen in FIG. 63 and FIG. 64, the slant face 3 formed on the dielectric film 91*b*, the DBR 91*a* and the clad film 91*c* by the first opening is arranged at an angle with the top face of the DBR 91*a*. The slant face 3 makes an oblique angle with the vertical line orthogonal to the top face of the DBR 91*a*.

After that, a p-side electrode 92 is formed on the clad film 91*f*, and electrically connected to the p-side finger electrode 93 by an electrical connection 94 formed in the first opening 5.

A large portion of the light generated in the active layer 40 is reflected towards the n-type semiconductor layer 30 by the dielectric film 91*b* and the DBR 91*a*. However, part of the light is trapped inside the dielectric film 91*b* and the DBR 91*a* as they also have a certain thickness, or emitted through the lateral faces of the dielectric film 91*b* and the DBR 91*b*.

The relationships among the dielectric film 91*b*, the DBR 91*a* and the clad film 91*f* can be explained from the perspective of an optical waveguide. The optical waveguide is a structure that encompasses the propagation part of light by a material having a lower refractive index than the refractive index of the light propagation part and guides the light utilizing total internal reflection. In this regard, if the DBR 91*a* is taken as the propagation part, the dielectric film 91*b* and the clad film 91*f* can be considered as part of the structure that encompasses the propagation part.

When the DBR 91*a* is made of $SiO_2/TiO_2$, with $SiO_2$ having the refractive index of 1.46 and $TiO_2$ having the refractive index of 2.4, the DBR 91*a* is preferentially formed to have a higher effective refractive index than the refractive index of the dielectric film 91*b* made of $SiO_2$. Here, the effective refractive index means an equivalent refractive index of light that can travel in a waveguide that is made of materials having different refractive indices, and has a value between 1.46 and 2.4.

The clad film 91*f* can also be made of a material having a refractive index lower than the effective refractive index of the DBR 91*a*. Examples of the material may include a metallic oxide such as $Al_2O_3$, a dielectric film such as $SiO_2$ or SiON, or a material such as MgF, CaF or the like. Preferentially, the clad film 91*f* has a thickness which desirably ranges from λ/4n to 3.0 μm, in which λ denotes a wavelength of the light generated in the active layer 40, and n denotes a refractive index of a material of the clad film 91*f*. When λ is 450 nm (4500 Å), the clad film 91*f* can be formed in a thickness of 771 Å (4500/4×1.46=771 Å) or more.

Considering that the top layer of the DBR 91*a* made of multiple pairs of $SiO_2/TiO_2$ can be composed of a $SiO_2$ layer having a thickness of λ/4n, it is desirable that the clad film 91*c* is thicker than λ/4n to be distinguished from the top layer of the DBR 91*a* that is underlaid beneath the clad film 91*f*. However, it is not desirable for the top layer of the DBR 91*a* to be too thick (e.g., 3 μm or more) because this would impose a burden on the subsequent processes for forming a first opening 5 and only increase the material cost without contributing to the improvement of the efficiency. Therefore, an appropriate upper limit of the thickness of the clad film 91*f* would be between 1 μm and 3 μm, so as to relieve the burden on the subsequent processes for forming the first opening 5. But still, it is not totally prohibited to make the top layer as thick as 3.0 μm or more.

When the DBR 91*a* comes into direct contact with the p-side electrode 92 and the n-side bonding pad 80, part of the light travelling through the DBR 91*a* might be affected by the p-side electrode 92 and the n-side bonding pad 80 and then absorbed. However, inserting the dielectric film 91*b* and the clad film 91*f* having a lower refractive index than the refractive index of the DBR 91*a* between the p-side electrode and the n-side bonding pad 80 and between the p-side electrode 92 and the DBR 91*a* can minimize the partial absorption of the light traveling through the DBR 91*a* by the p-side electrode 92 and the n-side bonding pad 80, thereby increasing the efficiency of light absorption.

Optionally, the dielectric film 91*b* may be omitted. Also, although not desirable from the perspective of an optical waveguide, there is no reason to exclude the configuration composed of the DBR 91*a* and the clad film 91*f*, when the overall technical idea of this disclosure is taken into consideration. Alternatively, TiO$_2$ dielectric film may be used in place of the DBR 91a. Further, as an alternative, the clad film 91f may be omitted if the DBR 91a includes a SiO$_2$ layer on the top thereof.

The dielectric film 91b, the DBR 91a and the clad film 91f serve as an optical waveguide, and they preferentially have a combined thickness of 1 to 8 μm.

Among light rays incident on the non-conductive reflective film 91 that serves as an optical waveguide, the light rays that are incident on the non-conductive reflective film 91 at right angles or almost at right angles are well reflected towards the substrate 10, while some light rays including those that are incident on the non-conductive reflective film 91 at an oblique angle are not reflected towards the substrate 10, but can be trapped inside the DBR 91a that serves as a propagation part, and then propagated to the lateral face as shown in FIG. 64.

Therefore, part of the light being propagated to the lateral face of the DBR 91a is guided towards the substrate 10 from the slant face 3 formed by the first opening 5. To facilitate guiding of the light towards the substrate 10, the slant face 3 preferentially has a slant angle 6 ranging from 10 degrees to 80 degrees, for example. If the slant angle 6 is smaller than 10 degrees or larger than 80 degrees, the advantageous effect of guiding the light toward the substrate 10 is weak; and if the slant angle is greater than or equal to 80 degrees, it can impose a burden on the formation of the slant face 3. Therefore, a preferential angle would range from 25 degrees to 75 degrees, in order to increase the effect of guiding the light toward the substrate 10 and not to impose any burden on the formation of the first opening 5.

In FIG. 64, the light is drawn on a 2D plane, but in reality, there are lights that are reflected or guided from a 3D slant face 3 and travels back and forth from the ground at an oblique angle. While part of the reflected or guided light from the slant face 3 is incident on the p-side finger electrode 93, most of the reflected or guided light transmits through the current spreading conductive film 60.

As such, the slant face 3 serves as a guiding plane or a reflecting plane, and contributes to improved brightness of the semiconductor light emitting device.

Figure 66:
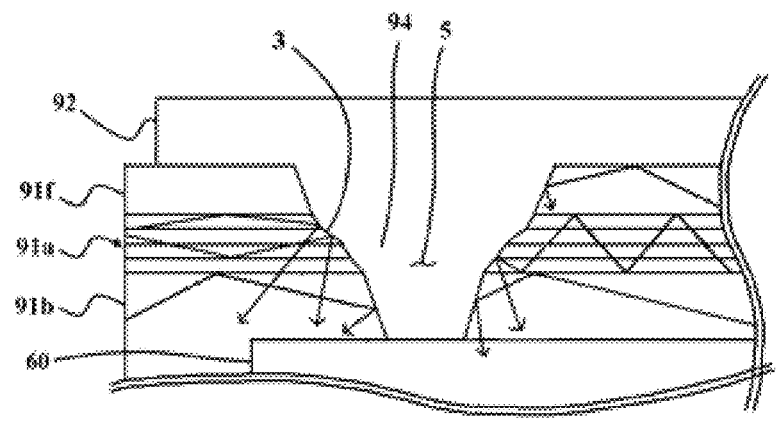
FIG. 66 is a schematic view illustrating a still further exemplary embodiment of a semiconductor light emitting device according to the present disclosure.

FIG. 66 is a schematic view illustrating a still further exemplary embodiment of a semiconductor light emitting device according to the present disclosure.

This semiconductor light emitting device is substantially identical with the semiconductor light emitting device illustrated in FIG. 62 through FIG. 65, except that in this semiconductor light emitting device, p-side finger electrodes are not provided, a p-side electrode 92 is brought into contact with a current spreading conductive film 60 through a first opening 5, and a slant face 3 created from the first opening 5 includes a plurality of sub-slant faces. Hence, common features will not be described to avoid redundancy.

The semiconductor light emitting device may or may not include a light absorption barrier film 95.

To form the slant face 5, for example, a process such as dry etching or wet etching may be carried out. In one example, when the non-conductive reflective film 91 undergoes photolithographic processing followed by thermal processing at 150° C. for 10 min, a resulting photoresist pattern at the location in correspondence to an opening to be formed is slanted at an angle. Then dry etching (e.g. ICP, RIE, RIBE, CAIBE or the like) is carried out using the photoresist pattern as a mask, and a slant face 3 having a plurality of sub-slant faces is formed. This slant face 3 may have a rough surface. Different reflection angles can be created using the plurality of sub-slant faces.

Figure 67:
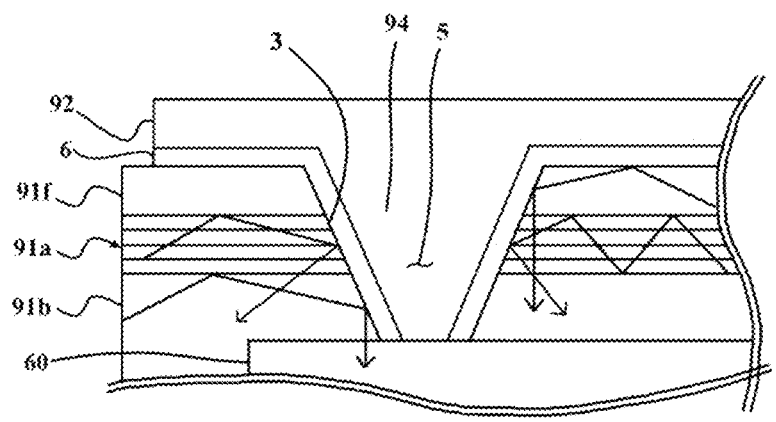
FIG. 67 is a schematic view illustrating a still further exemplary embodiment of a semiconductor light emitting device according to the present disclosure.

FIG. 67 is a schematic view illustrating a still further exemplary embodiment of a semiconductor light emitting device according to the present disclosure.

This semiconductor light emitting device is substantially identical with the semiconductor light emitting device illustrated in FIG. 62 through FIG. 65, except that the former is not provided with p-side finger electrodes, but it includes a reflective electrode layer in contact with a slant face 3 created from the first opening 5. Hence, common features will not be described to avoid redundancy.

The semiconductor light emitting device may or may not include a light absorption barrier film 95.

Optionally, a reflective metal layer 6 in contact with the slant face 3 created from the first opening 5 may be formed to increase reflectivity even more. For example, the reflective metal layer 6 is brought into contact with the face of the dielectric film 91b, the face of the DBR 91a and the face of the clad film 91f, which are created by the first opening 5, and may be composed of a highly reflective metal layer including Ag, Al or an alloy thereof. The reflective metal layer 6 may be a sub-layer of the second electrode 92 or a separate metal layer.

Figure 68:
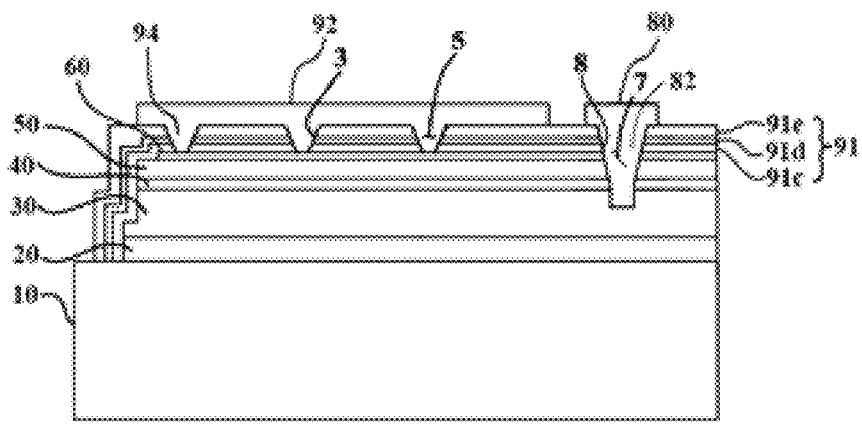
FIG. 68 is a schematic view illustrating a still further exemplary embodiment of a semiconductor light emitting device according to the present disclosure.

FIG. 68 is a schematic view illustrating a still further exemplary embodiment of a semiconductor light emitting device according to the present disclosure.

This semiconductor light emitting device is substantially identical with the semiconductor light emitting device illustrated in FIG. 62 through FIG. 65, except that the former is not provided with p-side finger electrodes and n-side finger electrodes, but it includes a non-conductive reflective film 91 formed on a current spreading conductive film 60, an increased number of first openings 5, and further a second opening 7 formed in the non-conductive reflective film 91, and an n-side bonding pad 80 which is formed on the non-conductive reflective film 91 and electrically connected with an n-type semiconductor layer 30 by an electrical connection 82 formed in the second opening 7. Hence, common features will not be described to avoid redundancy.

The semiconductor light emitting device may or may not include a light absorption barrier film 95.

The non-conductive reflective film is composed of multilayered dielectric films 91c, 91d and 91e. For example, the non-conductive reflective film, which is composed of a SiO$_2$ dielectric film 91c, a TiO$_2$ dielectric film 91d and a SiO$_2$ dielectric film 91e, can serve as a reflective film. Preferentially, the non-conductive reflective film 91 is formed to have a DBR structure.

After the manufacturing process is completed, the semiconductor light emitting device as a finished product can still experience current leakage and suffer from degraded reliability affected by the SiO$_2$ dielectric film 91c, one should be very careful in forming the SiO$_2$ dielectric film 91c. For example, the dielectric film 91c should be formed by a method that is particularly suitable for ensuring the reliability of the device. For instance, CVD, in particular (preferentially) PECVD may be used for obtaining the SiO$_2$ dielectric film 91c, and PVD, in particular (preferentially) E-beam evaporation, sputtering or thermal evaporation may be used for obtaining the dielectric film 91d/dielectric film 91e made of a stack of alternating TiO$_2$/SiO$_2$ DBR, thereby ensuring the reliability of the resulting semiconductor light emitting device according to the this embodiment and ensuring the dielectric films' function as the non-conductive reflective film. This is because CVD is more advantageous than PVD (in particular, E-beam evaporation) for covering steps in a mesa etched region.

A first opening 5 and a second opening 7 are formed, passing through the dielectric film 91*c*, the DBR 91*d* and the dielectric film 91*e*, thereby exposing a part of the current spreading conductive film 60 and a part of the n-type semiconductor layer 30, respectively.

In case of a large area semiconductor light emitting device or a high-output, high-power semiconductor light emitting device, there may be a plurality of first openings 5 formed for connecting the p-side electrode 92 and the current spreading conductive film 60, and an electrical connection 94 is formed accordingly.

The n-side bonding pad 80 is formed on the dielectric film 91*e* and can be electrically connected with the n-type semiconductor layer 30 by the electrical connection 82 formed in the second opening 7. As such, there will be few steps between the p-side electrode 92 and the n-side bonding pad 80 especially in a flip chip.

Due to the first opening 5 and the second opening 7, the dielectric film 91*c*, the DBR 91*d* and the dielectric film 91*e* have slant faces 3, 8. Accordingly, if there are multiple first and second openings 5, 7, more slant faces 3, 8 are created, which in turn leads more light towards the substrate 10.

Figure 69:
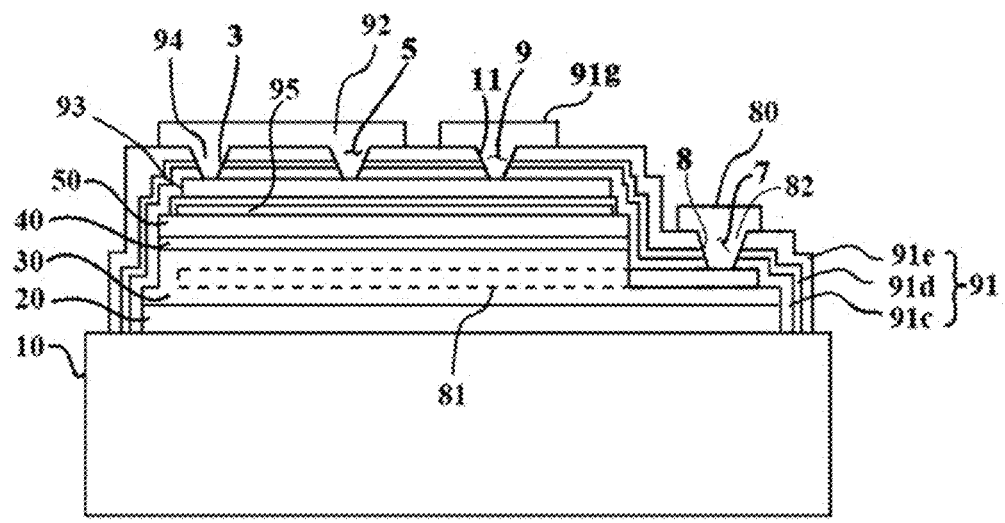
FIG. 69 is a schematic view illustrating a still further exemplary embodiment of a semiconductor light emitting device according to the present disclosure.

FIG. 69 is a schematic view illustrating a still further exemplary embodiment of a semiconductor light emitting device according to the present disclosure.

This semiconductor light emitting device is substantially identical with the semiconductor light emitting device illustrated in FIG. 62 through FIG. 65, except that the former is provided with an increased number of first openings 5 and further a second opening 7 and a third opening 9, and includes an n-side bonding pad 80 which is formed on a non-conductive reflective film and electrically connected to an n-side finger electrode 81 by an electrical connection 82 formed in the second opening 7. Hence, common features will not be described to avoid redundancy.

The semiconductor light emitting device may or may not include a light absorption barrier film 95.

The second opening 7 is formed in the non-conductive reflective film 91 covering the n-side finger electrode 81 in a shape that a slant face 8 is created, and the electrical connection 82 formed in the second opening 7 electrically connects the n-side bonding pad 80 to the n-side finger electrode 81.

The first, second and third openings 5, 7 and 9 are formed in the dielectric film 91*c*, the DBR 91*d* and the dielectric film 91*e*. The third opening 9 may be formed into a very similar shape to the first opening 5. Alternatively, the third opening 9 may be provided exclusively for reflecting light towards the substrate 10, irrelevant to the electrical connection. For instance, if a dielectric 91*g* and the dielectric film 91*c* are made of the same material, light can be reflected from the interfaces between the dielectric 91*g* and the DBR 91*d* and between the dielectric 91*g* and the dielectric film 91*e*. The third opening 9 may be filled with the same material as the dielectric 91*g*. It may be useful if the dielectric 91*g* is made of a material having a lower refractive index than the refractive indexes of the materials for the non-conductive reflective film 91. For example, the dielectric 91*g* may be made of MaF. Alternatively, the third opening 9 may remain as is, instead of being filled up.

Therefore, openings irrelevant to electrical connections can be made available to guide a larger amount of light towards the substrate 10.

Figure 70:
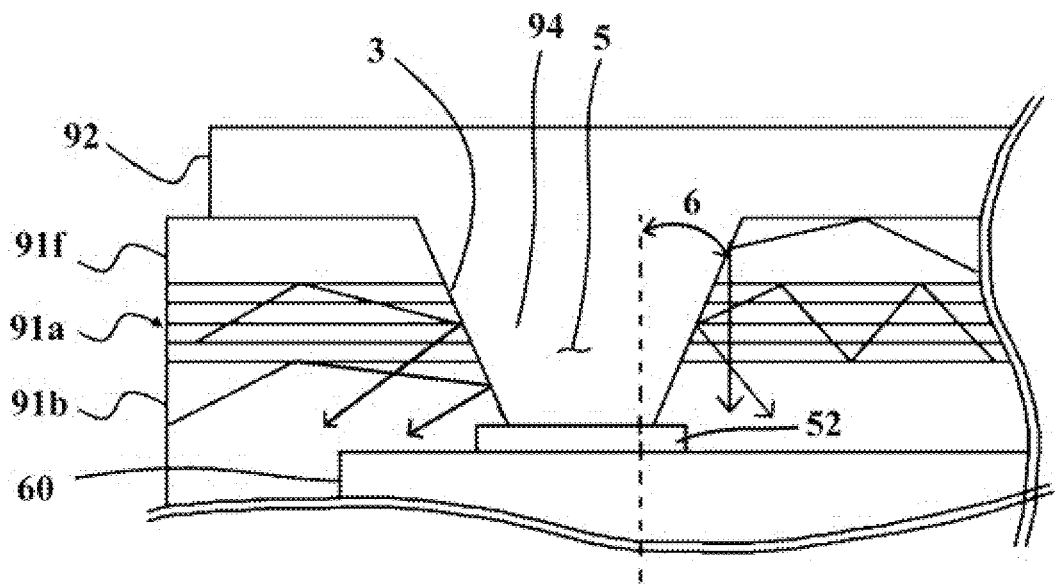
FIG. 70 is a schematic view illustrating a still further exemplary embodiment of a semiconductor light emitting device according to the present disclosure.

FIG. 70 is a schematic view illustrating a still further exemplary embodiment of a semiconductor light emitting device according to the present disclosure.

This semiconductor light emitting device is substantially identical with the semiconductor light emitting device illustrated in FIG. 62 through FIG. 65, except that the former is not provided with a p-side finger electrode, but it includes an ohmic contact layer 52 arranged on a current spreading conductive film 60 in correspondence with a first opening 5, in which the ohmic contact layer 52 is brought into contact with a p-side electrode 92 led into the first opening 5. Hence, common features will not be described to avoid redundancy.

The ohmic contact layer 52 may be formed using an ohmic metal (Cr, Ti or the like), a reflective metal (Al, Ag) or a combination thereof. The ohmic contact layer 52 results in a drop in the operating voltage of the semiconductor light emitting device.

A light absorption barrier film or a current blocking layer may further be arranged between a p-type semiconductor layer and a current spreading conductive film 60, in correspondence with the ohmic contact layer 52.

Figure 71:
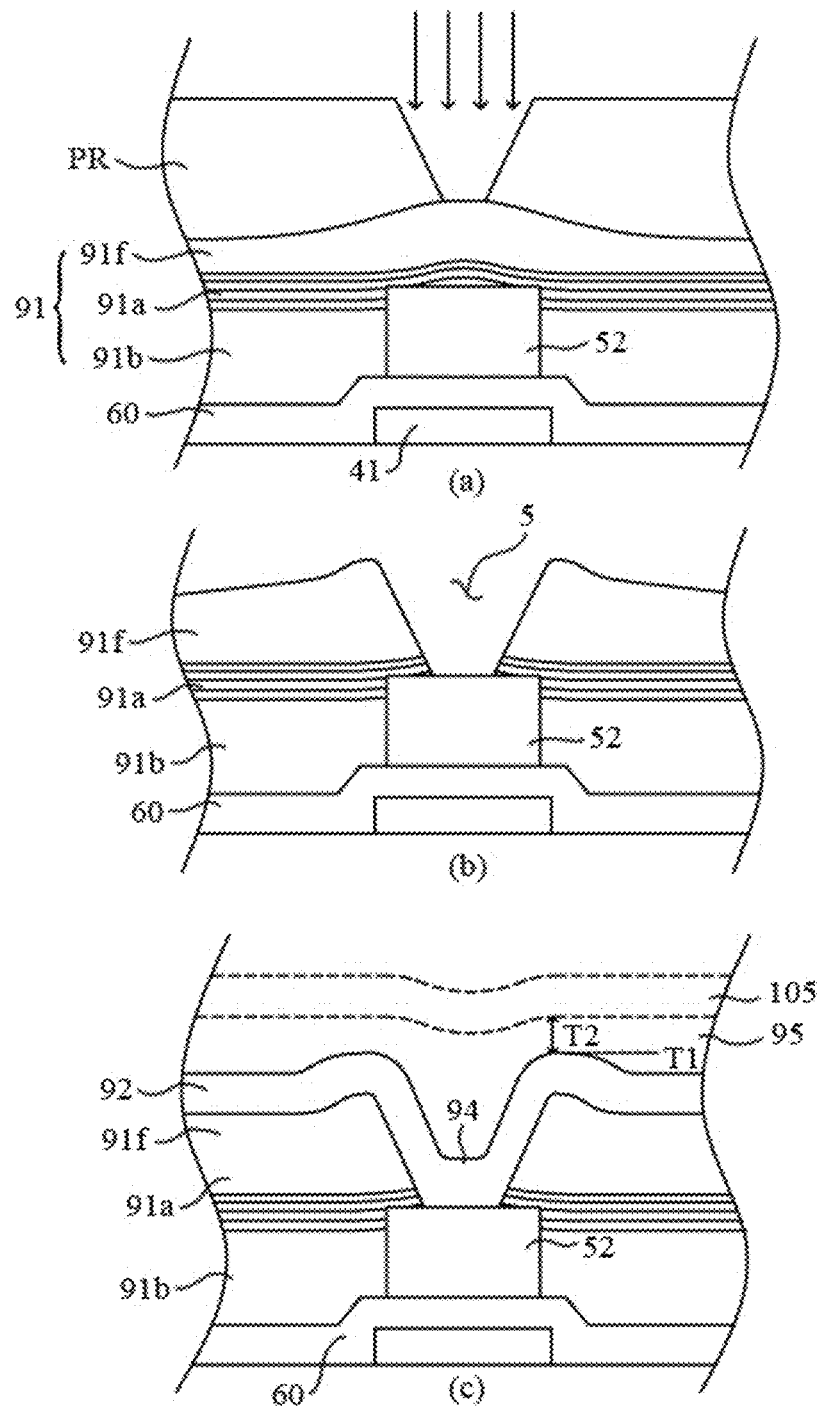
FIG. 71 is a schematic view illustrating an exemplary embodiment of a manufacturing method of a semiconductor light emitting device according to the present disclosure.

FIG. 71 is a schematic view illustrating an exemplary embodiment of a manufacturing method of a semiconductor light emitting device according to the present disclosure, in which the semiconductor light emitting device includes a plurality of semiconductor layers, a light absorption barrier film 41, a current spreading conductive film 60, a first electrode part, a second electrode part and a non-conductive reflective film 91. The plurality of semiconductor layers is explained in detail in the aforementioned embodiments. Here, again, the plurality of semiconductor layers includes a first semiconductor layer having a first conductivity type, a second semiconductor layer having a second conductivity type different from the first conductivity type, and an active layer which is interpositioned between the first semiconductor layer and the second semiconductor layer and generates light by electron-hole recombination. The first electrode part is in electrical communication with the first semiconductor layer, and the second semiconductor layer is in electrical communication with the second semiconductor layer. The non-conductive reflective film 91 is formed on the plurality of semiconductor layers to reflect the light generated in the active layer towards the growth substrate, and has an opening 5 used as an electrical connecting pass. At least one of the first electrode part and the second electrode part includes a lower electrode 52, an upper electrode 92 and an electrical connection 94. The lower electrode has a top face and lateral faces connected to the top face, and is partly exposed through the opening 5. The upper electrode 92 is provided on the non-conductive reflective film 91.

To manufacture this semiconductor light emitting device, first, the plurality of semiconductor layers is formed on the growth substrate, and the light absorption barrier film 41 is formed on the second semiconductor layer in correspondence with the lower electrode 52 of the second electrode part. Then the current spreading conductive film 60 covering the light absorption barrier film 41 is formed, and the lower electrode 52 is formed in a manner that it overlies both the current spreading conductive film 60 in correspondence with the light absorption barrier film 41 and the first semiconductor layer exposed through the opening. Next, the non-conductive reflective film 91 is formed on the lower electrode 52. The non-conductive reflective film 91 may include a dielectric film, a DBR and a clad film, or may simply be a stack of dielectric films. While the formation of the opening 5 is being carried out on the non-conductive reflective film 91, the top face of the current spreading conductor film (e.g. ITO) and the top face of the first semiconductor are affected thereby, resulting in possible deterioration of the electrical communication qualities, e.g. an increased contact resistance, especially when the electrical connection 94 comes into direct contact with ITO and n-GaN. In this embodiment, the lower electrode 52 is interpositioned between the electrical connection 94 and the current spreading conductive film 60 and between the electrical connection 94 and the first semiconductor layer (e.g. n-GaN), such that a contact resistance thereof can be reduced and further a satisfactory electrical contact is established. Thus, the lower electrode 52 is preferentially provided not only as an electrode for supplying or spreading current towards the plurality of semiconductor layers, but also as a component for improving interconnection with the electrical connection 94.

For example, when the lower electrode 52 is about 2 μm thick and the non-conductive reflective film 91 is about 4 μm thick, as can be seen in FIG. 71 (*a*), the non-conductive reflective film 91 is slightly bumped up at the lower electrode 52 region, thereby creating a height difference between the lower electrode 52 and the non-conductive reflective film 91 on the outside the lower electrode. Meanwhile, the light absorption barrier film 41 may be formed to have a thickness of about 0.2 μm, and it does not have a major influence on the creation of a height difference. Next, a photoresist pattern PR is formed on the non-conductive reflective film 91, and the opening 5 is formed as shown in FIG. 71 (*b*). Because of a height difference, the upper inlet boundary, i.e. the upper rim of the opening 5 is raised above the top face of the non-conductive reflective film 91 on the outside the lower electrode 52, creating a height difference T1. Subsequently, the non-conductive reflective film 91 is subjected to a metal formation process, e.g. deposition, to form a metal layer thereon, extending across the top face of the non-conductive reflective film 91 and the opening 5. This metal layer may be composed of a single layer or multiple layers of different kinds (e.g. see 92 and 80 in FIG. 32 through FIG. 35; 92-1, 92-2, 92-3, 92-4 in FIG. 38 and FIG. 41; 92 in FIGS. 42, 6; and 92 in FIG. 42).

The metal layer thus formed can be sub-divided into an upper electrode 92 corresponding to a part formed on the top face of the non-conductive reflective film 91, and an electrical connection 94 corresponding to a part formed in the opening 5. For instance, the upper electrode 92 can be a eutectic bonding electrode, and in that case, the top layer of the upper electrode 92 is made of a eutectic bonding material.

Alternatively, a separate upper electrode may be formed on the metal layer, coming into contact with the metal layer. In this case, the entire metal layer may be taken as the electrical connection 94. Here, the separate upper electrode 92 may be formed in the regions excluding the upper rim of the opening 5, or may be formed to cover the opening 5. If this separate upper electrode is a eutectic bonding electrode, it is preferential that the separate upper electrode is not formed along the upper rim of the opening 5 to make the upper electrode flat (e.g. see 97 in FIG. 19).

Figure 59:
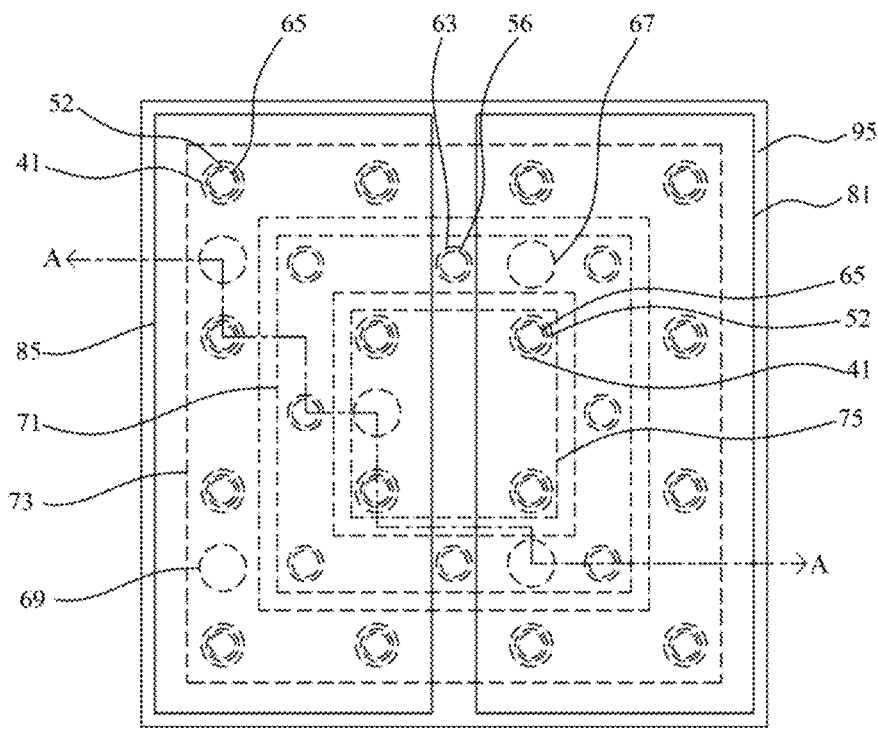

Meanwhile, it is desirable that a plurality of openings 5 is distributed across the light emitting face of the semiconductor light emitting device, and that the electrical connection 94 formed in each of the openings 5 may be additionally provided or connected with a p-side connection electrode or an n-side connection electrode on the non-conductive reflective film 91, for promoting current spreading or uniform current distribution (e.g. see 83, 73 in FIG. 50; and 71, 73, 75 in FIG. 59). The p-side connection electrode or the n-side connection electrode may be unitarily formed with the electrical connection 94 in the opening 5 using the same process, or may be formed to cover the electrical connection 94 using a separate process. Further, in one embodiment, an insulating layer 95 or a passivation layer may be formed for covering the p-side connection electrode or the n-side connection electrode, and a p-side bonding pad 105 and an n-side bonding pad may be formed on the insulating layer 95 (e.g. see 85, 75 in FIG. 44; and 85, 81 in FIG. 51). In this case, the p-side connection electrode and the n-side connection electrode can be taken as the upper electrode, and the p-side bonding pad 105 and the n-side bonding pad can be taken as a separate bonding pad. Alternatively, the p-side connection electrode and the n-side connection electrode may be taken as an extension of the electrical connection 94, and the p-side bonding pad 105 and the n-side bonding pad formed on the insulating layer 95 may be taken as the upper electrode 92. It is necessary to ensure a sufficient spacing T2 between the upper electrode 92 stretched along the upper rim of the opening 5 and the bonding pad 97, by selecting a suitable thickness for the insulating layer 95.

Figure 72:
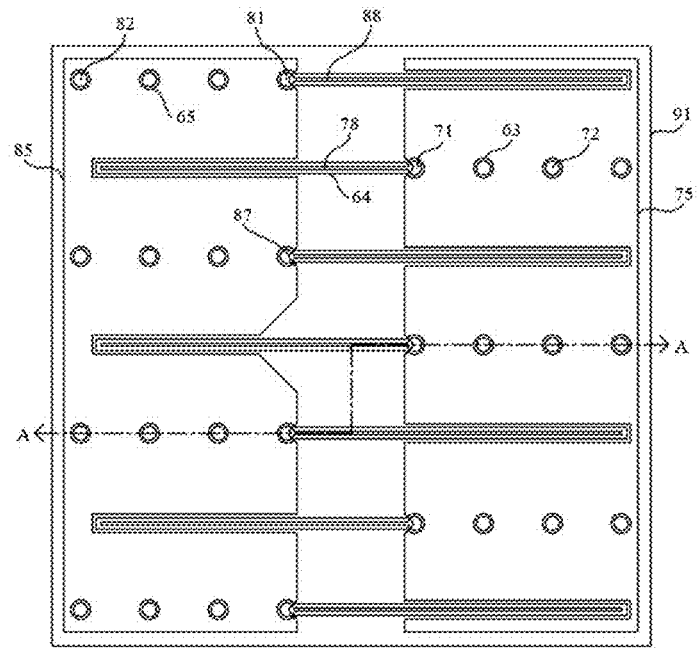
FIG. 72 is a schematic view illustrating a still further exemplary embodiment of a semiconductor light emitting device according to the present disclosure.
Figure 73:
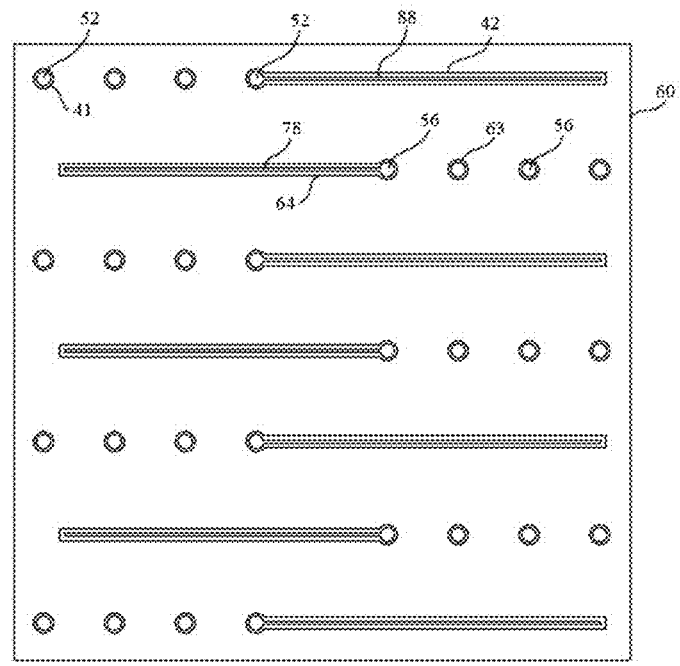
FIG. 73 is a schematic view illustrating a state prior to forming an upper electrode.
Figure 74:
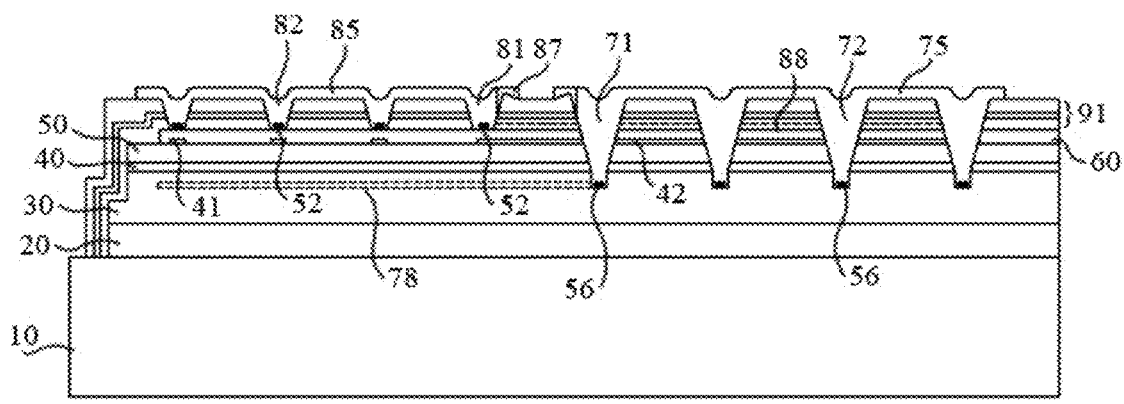
FIG. 74 is a schematic view illustrating an example of a cutaway portion, taken along line A-A in FIG. 72.

FIG. 72 is a schematic view illustrating a still further exemplary embodiment of a semiconductor light emitting device according to the present disclosure, FIG. 73 is a schematic view illustrating a state prior to forming an upper electrode, and FIG. 74 is a schematic view illustrating an example of a cutaway portion, taken along line A-A in FIG. 72.

In this embodiment, the semiconductor light emitting device includes a plurality of semiconductor layers 30, 40, 50, a light absorption barrier film 41, a current spreading conductive film 60, a first electrode part, a second electrode part, and a non-conductive reflective film 91. The plurality of semiconductor layers 30, 40, 50 is explained in detail in the aforementioned embodiments. Here, again, the plurality of semiconductor layers includes a first semiconductor layer 30 having a first conductivity type, a second semiconductor layer 50 having a second conductivity type different from the first conductivity type, and an active layer 40 which is interpositioned between the first semiconductor layer 30 and the second semiconductor layer 50 and generates light by electron-hole recombination. The first electrode part is in electrical communication with the first semiconductor layer 30, and the second semiconductor layer is in electrical communication with the second semiconductor layer 50. The non-conductive reflective film 91 is formed on the plurality of semiconductor layers 30, 40, 50 to reflect the light generated in the active layer 40 towards the growth substrate 10, and has an opening 63, 65 used as an electrical connecting pass. At least one of the first electrode part and the second electrode part includes a lower electrode, an upper electrode, and an electrical connection 81, 82, 71, 72. In this embodiment, the first electrode parts includes a lower electrode 56, 78, an upper electrode 75, and electrical connections 71, 72. The second electrode part includes a lower electrode 52, 88, an upper electrode 85, and electrical connections 81, 82. The lower electrode 52, 56, 88, 78 has a top face and lateral faces connected to the top face, and is at least partly exposed through the opening 63, 65. In this embodiment, the surrounding of the lower electrode 52, 56, 88, 78 is exposed through the opening 63, 65. The upper electrode 75, 85 is provided on the non-conductive reflective film 91. In this embodiment, the upper electrode 75, 85 is formed in contact with the top face of the non-conducive reflective film 91. The electrical connection 81, 82, 71, 72 electrically communicates with the upper electrode 75, 86, and extended into the opening 63, 65, thereby coming into contact with the top face of the lower electrode 52, 56, 88, 78, and covers the top and lateral faces of the lower electrode 52, 56, 88, 78.

In a manufacturing method of the above semiconductor light emitting device, for example, the plurality of semiconductor layers 30, 40, 50 is first formed on the growth substrate 10, and then, as can be seen in FIG. 73 and FIG. 74, the second semiconductor layer 50, the active layer 40 and part of the first semiconductor layer 30 are mesa etched to form n-contact regions (e.g. 63, 64). The n-contact regions 63, 64 are composed of an n-contact region 63 in form of islands, and an n-contact region 64 in form of a long stretched branch. Next, the light absorption barrier film 41 is formed on the second semiconductor layer 50, in correspondence with the lower electrode 52, 88 to be formed. The light absorption barrier film 41 may also be formed in part of the n-contact regions 63, 64. The current spreading conductive film 60 is then formed on the plurality of semiconductor layers 30, 40, 50 to cover the light absorption barrier film 41. Alternatively, the n-contact region 63, 64 may be formed after the formation of the current spreading conductive film 60. The lower electrode 56 (the n-side ohmic contact pad) of the first electrode part is formed in the island-like n-contact region 63, and the lower electrode 78 (the n-side finger electrode) of the first electrode part is formed in the branch-like n-contact region 64. The n-side ohmic contact pad 56 is connected to one end of the n-side finger electrode 78. In addition, the island-like lower electrode 52 (the p-side ohmic contact pad) of the second electrode part and the lower electrode 88 (the p-side finger electrode) of the second electrode part are formed on the current spreading conductive film 60. The n-side ohmic contact pad 56 is connected to one end of the p-side finger electrode 88. Below the lower electrode 52, 88 of the second electrode part is the light absorption barrier film 41.

Figure 75:
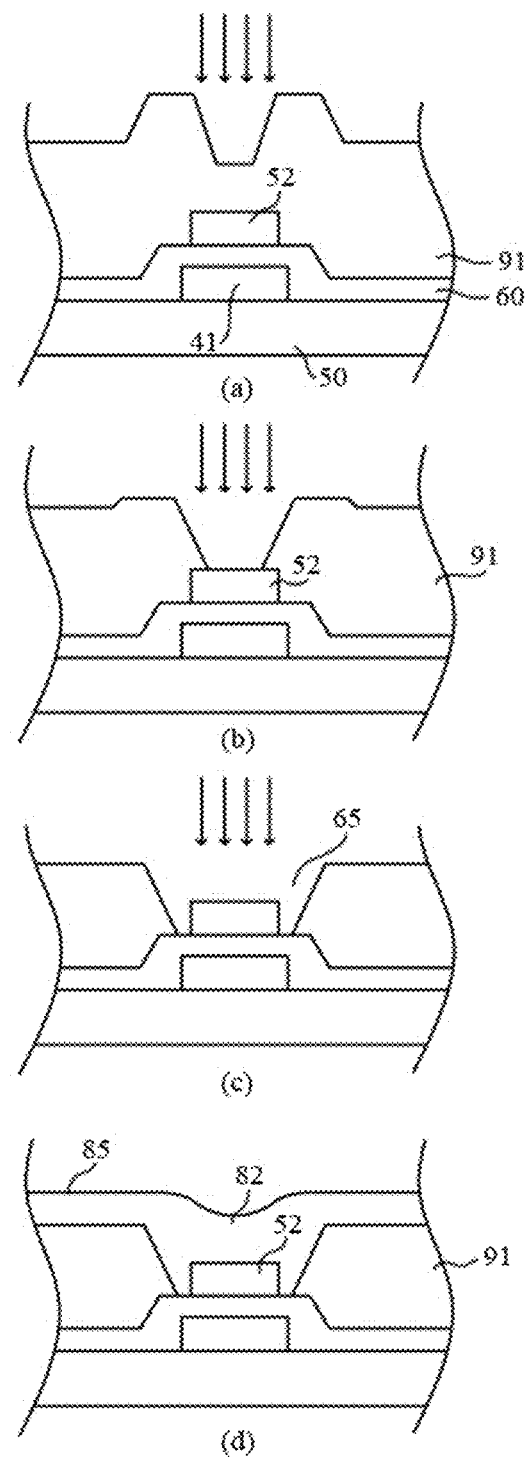
FIG. 75 is a schematic view illustrating an exemplary embodiment of a process for forming an opening.
Figure 76:
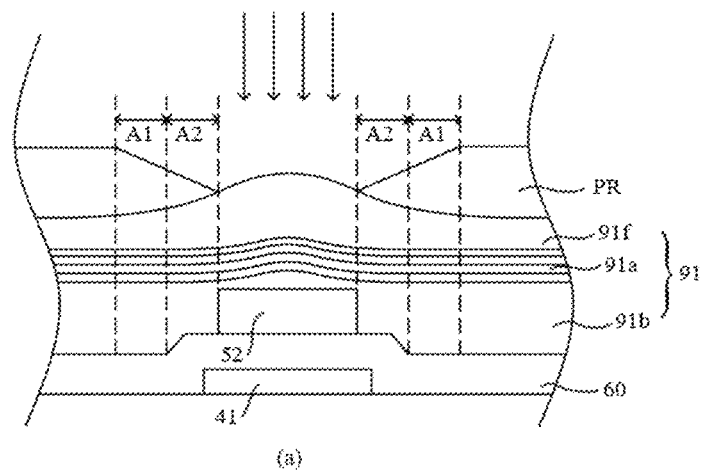
FIG. 76 is a schematic view illustrating an exemplary embodiment of a method for forming an upper rim of the opening.
Figure 76:
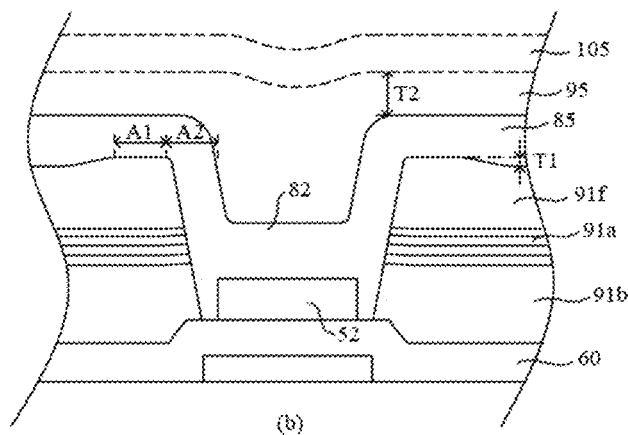

FIG. 75 is a schematic view illustrating an exemplary embodiment of a process for forming an opening, and FIG. 76 is a schematic view illustrating an exemplary embodiment of a method for forming an upper rim of the opening. The non-conductive reflective film 91 is formed on the current spreading conductive film 60, and an etching process (e.g. plasma etching) is carried out to form the opening 63, 65. While the openings 63, 65 in this embodiment are open upwards of the semiconductor light emitting device, as an alternative, they may be open towards the sides.

As the etching process proceeds, the opening gradually takes its form as shown in FIG. 75 (a), and part of the top face of the lower electrode 52 is exposed as shown in FIG. 75 (b) (e.g. see 65 in FIG. 47; 65 in FIG. 58; 5 in FIG. 64; and 5 in FIG. 71). The height difference between the upper rim of the opening and the top face of the non-conductive reflective film 91 is reduced more in FIG. 75 (b), rather than in FIG. 75 (a). As the etching process proceeds further, as can be seen in FIG. 75 (c), the surroundings of the lower electrode 52 is exposed through the opening 65, and the non-conductive reflective film 91 will have slant faces formed by the opening 65. The openings 63, 65 expose the n-side ohmic contact pad and the p-side ohmic contact pad 52. In this embodiment, the openings 63, 65 expose the n-contact region around the n-side ohmic contact pad, and the current spreading conductive film 60 around the p-side ohmic contact pad 52. Also, as shown in FIG. 75 (c), preferentially, the upper rim of the opening 63, 65 and the top face of the non-conductive reflective film 91 are configured to be connected and form a flat plane, such that an etch-exposed face (to be described) created during the opening 63, 65 formation process forms the upper rim of the opening 63, 65, thereby reducing the height difference between the upper rim of the opening 63, 65 and other parts of the non-conductive reflective film 91. Next, the upper electrode 85 and the electrical connection 82 are formed. Optionally, a process may be added to remove materials produced on the top face of the lower electrode, prior to forming the upper electrode 85 and the electrical connection 82 (see FIG. 5 and FIG. 6).

Referring to FIG. 76, as a result of the etching process in this embodiment, a part of the non-conductive reflective film 91 in correspondence to the opening 63, 65 as well as a raised part of the non-conductive reflective film 91 around the opening 63, 65 are etched together. For this etching process, an etching mask PR may be configured to have different etching rates in the part in correspondence to the opening 63, 65 and in the part of the non-conductive reflective film 91 around the opening 63, 65. For example, as can be seen in FIG. 76 (a), the mask in a part corresponding to the ohmic contact pad 52 is open, and different etching rates are applied to slant face regions A2 surrounding the ohmic contact pad 52 to thereby create slant faces on the non-conductive reflective film 91 by the opening 63, 65, and again different etching rates are applied to rim regions A1 surrounding the slant face regions A2 to thereby obtain etch-exposed faces A1 on the non-conductive reflective film 91. These etch-exposed faces A1 form the upper rim of the opening 63, 64, as shown in FIG. 76 (b). This etching process may be done by a single etching process or multiple etching processes, or by a combined dry-wet etching process. As these etch-exposed faces A1 form the upper rim of the opening 63, 65, a step or height difference T1 between the upper rim and the top face of the non-conductive reflective film 91 on the outside the lower electrode 52, 56, 88, 78 is reduced. For example, a height difference T1 between the height from the top face of the current spreading conductive film 60 to the top face of the non-conductive reflective film 91 and the height from the top face of the current spreading conductive film 60 to the upper rim A1 (the etch-exposed face) of the opening 63, 65 is now significantly smaller than the height difference T1 described in FIG. 71. Preferentially, the etching process conditions may be adjusted to obtain a flat face without almost no height difference T1. Moreover, since sufficient spacing T2 can now be ensured between the upper electrode 92 and the bonding pad 105 that can be formed above the upper electrode 92, it is possible to prevent the occurrence of a possible electrical short between the upper electrode 92 and the bonding pad 105.

Figure 77:
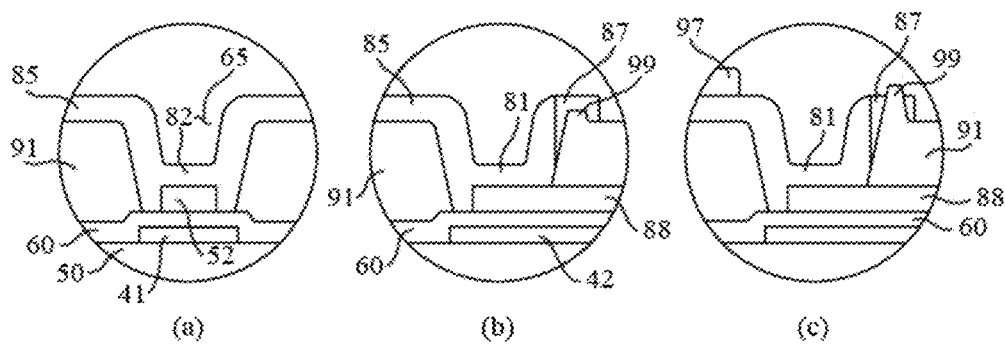
FIG. 77 schematically illustrates examples of an electrode part in a semiconductor light emitting device according to the present disclosure.
Figure 78:
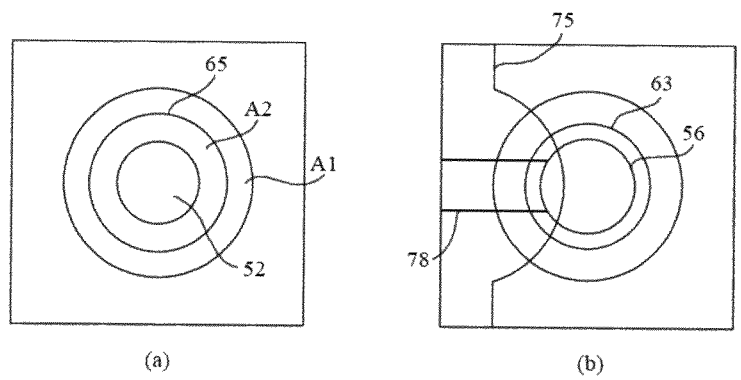
FIG. 78 schematically illustrates examples of a flat shape of the electrode part.

FIG. 77 schematically illustrates examples of an electrode part in a semiconductor light emitting device according to the present disclosure, and FIG. 78 schematically illustrates examples of a planar shape of the electrode part.

The upper electrode 75, 85 is formed on the non-conductive reflective film 91 by deposition or plating, and electrical connection 81, 82, 71, 72 is formed in the opening 63, 65. In the examples illustrated, the upper electrode 75, 85 and the electrical connection 81, 82, 71, 72 are unitarily formed, and the electrical connection 81, 82, 71, 72 is brought into contact with the top and lateral faces of the lower electrode 52, 56, 88, 78; and with the current spreading conductive film 60 and the first semiconductor layer 30, which are exposed through the opening 63, 65. In this way, the contact face between the electrical connection 81, 82, 71, 72 and the lower electrode 52, 56, 88, 78 is increased as compared with the electrode part illustrated in FIG. 71, and a more stable interconnection structure can be obtained among the current spreading conductive film 60—the lower electrode 52, 88—the electrical connection 81, 82, and among the first semiconductor layer 30—the lower electrode 56, 78—the electrical connection 71, 72.

Further, with the opening 63, 65 having a width greater than the width of the lower electrode 52, 56, 88, 78, the opening 63, 65 can be subjected to a strong, sufficient etching action to make its etch-exposed face of the opening 63, 65 into the upper rim A1 thereof. In doing so, the height difference T1 between the upper rim of the opening 63, 65 and other parts of the non-conductive reflective film 91 is reduced to a nearly insignificant level or none, thereby being flat. As a result, the upper electrode 75 of the first electrode part and the upper electrode 85 of the second electrode part are spaced apart on the non-conductive reflective film 91, with their edges facing each other, as shown in FIG. 72, which is a very useful structure for an eutectic bonding electrode.

Since a part of the non-conductive reflective film 91 corresponding to the p-side finger electrode 88 is raised upwards higher than other parts, and a part of the non-conductive reflective film 91 corresponding to the n-side branch electrode 78 is not in a favorable state either to be made flat, the upper electrode 75, 85 is patterned in a manner not to cover the finger electrode 78, 88. For example, as can be seen in FIG. 72, the upper electrode 75 (the n-side bonding pad) of the first electrode part is patterned in a manner not to cover the finger electrode 88 (the p-side finger electrode) of the second electrode part, and the upper electrode 85 (the p-side bonding pad) of the second electrode part is patterned in a manner not to cover the finger electrode 78 (the n-side finger electrode) of the first electrode part. Also, as described above, benefiting from the reduced height difference T1 of the upper rim A1 of the opening 63, 65, the upper electrode 75, 85 can be made flat even when the upper electrode 75, 85 is adapted to cover the opening 63, 65, i.e. to cover the upper rim A1 of the opening 63, 65. For instance, the upper electrode 75 (the n-side bonding pad) of the first electrode part is formed in a manner to cover the island-like lower electrode 56 (the n-side ohmic contact pad) of the first electrode, and the upper electrode 85 (the n-side bonding pad) of the second electrode part is formed in a manner to cover the lower electrode 52 (the p-side ohmic contact pad) of the second electrode part.

Meanwhile, unlike the island-like ohmic contact pads, the ohmic contact pad 56, 52 connected with the finger electrode 78, 88 is not symmetrical due to the finger electrode 78, 88 that is stretched to one side. Therefore, the joint portion where the finger electrode 78, 88 and the ohmic contact pad 56, 52 are connected can be formed in such a way that it has a height difference less than those in other parts of the upper rim A1 of the opening 63, 65, and it is slightly raised upwards higher than other parts of the upper rim A1 of the opening 63, 65. If the upper electrode 75, 85 covers this joint portion between the finger electrode 78, 88 and the ohmic contact pad 56, 52, it can be unfavorable for making them flat. Therefore, in these examples, the upper electrode 75, 85 covers the ohmic contact pad 56, 52, but it does not cover the part of the ohmic contact pad 56, 52 connected with the finger electrode 75, 85. For example, referring to FIG. 72, an escape groove 87 is formed at the edge of the upper electrode 75, 85, for escaping the part of the ohmic contact pad connected with the finger electrode 78, 88.

If the upper electrode 75, 85 is so thick that the raised or embossed part 99 of the upper rim A1 of the opening 63, 65 due to the finger electrode 78, 88 may be ignored, things like an exposing groove 97 would not be required. However, as the upper electrode 75, 85 is likely to have a thickness limit and includes an uneven part due to the embossed part 99, an electrical short with a structure that can be formed on the upper electrode 75, 85, e.g. a separate bonding pad on the insulating layer (see 105 in FIG. 80) may occur, and further a defect may arise therefrom. Accordingly, it is preferential to have patterning (e.g. 87) without the embossed part 99, as in FIG. 77 (b) and FIG. 78 (b). On the other hand, if the raised or embossed part is protruded upwards more than the upper electrode 75, 85 as in FIG. 77 (c), a separate bonding pad 97 may be applied onto the upper electrode 75, 85.

The present invention also includes an etching method for flattening a more raised part corresponding to the finger electrode 78, 88 of the upper rim A1 of the opening 64, 65, or making the part to a similar level with other parts, by adjusting a mask pattern and etching conditions.

Figure 79:
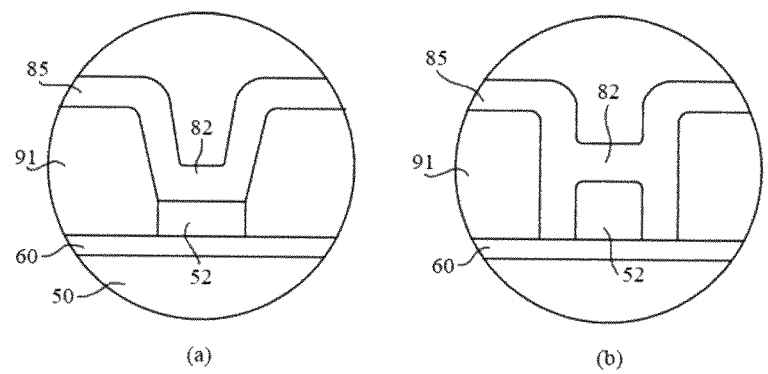
FIG. 79 schematically illustrates further examples of an electrode part according to the present disclosure.

FIG. 79 schematically illustrates further examples of an electrode part according to the present disclosure. In these examples, at least one of the first electrode part and the second electrode part is configured in such a way that, as shown in FIG. 79 (a), the top face of a lower electrode 52 is exposed through the opening, and an electrical connection 82 is formed in contact with the edge where the top face and lateral faces of the lower electrode 52 meet. The electrical connection 82 may come into contact only with the edge of the top face of the lower electrode 52, 56, 88, 78, as shown in FIG. 79 (a), and further it may come into contact with a part of the lateral face. Preferentially, a sufficient area of the lower electrode 52 (the ohmic contact pad) comes into contact with the electrical connection 82. On the other hand, since it is not desirable from the perspective of light absorption that the electrical connection 82 should have an increased cross sectional area, as an alternative, the electrical connection 82 may be adapted to cover the lower electrode 52 up to the edge. In this case, a lower rim of the opening comes into contact with an edge of the lower electrode 52.

In this example, there is no light absorption barrier film below the lower electrode 52. After analyzing an increased brightness level of the semiconductor light emitting device having a light absorption barrier film, and considering the pros and cons in view of extra processes for having a light absorption barrier film, omitting the light absorption barrier film may be a possible compromise.

The opening may have slant faces, or it may look linear because of very small inclination as shown in FIG. 79 (b). Through the opening, the surroundings of the lower electrode 52 is exposed, and the electrical connection 82 is brought into contact with the inner face of the opening, the current spreading conductive film 60, and the top and lateral faces of the lower electrode 52.

Figure 80:
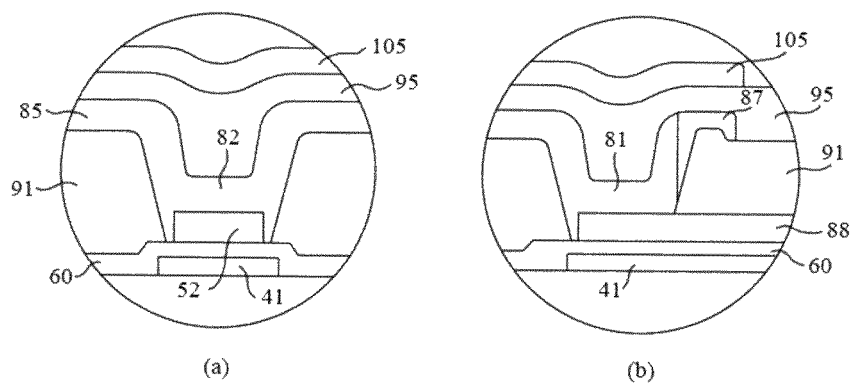
FIG. 80 schematically illustrates still further examples of an electrode part according to the present disclosure.

FIG. 80 schematically illustrates still further examples of an electrode part of a semiconductor light emitting device according to the present disclosure.

In these examples, the semiconductor light emitting device includes an upper electrode 85 and a separate bonding pad 105. An insulating layer or passivation layer 95 is provided between the upper electrode 85 and the bonding pad 105. The upper electrode 85 may be unitarily formed with an electrical connection 82, and may be stretched over a non-conductive reflective film 91. The passivation layer 95 may have an opening through which the upper electrode 85 and the bonding pad 105 are electrically connected. The bonding pad 105 may have an exposing groove in a part corresponding to the ohmic contact pad 52 connected with the finger electrode 88, or the bonding pad 105 may be formed in such a way that it covers the ohmic contact pad 52 connected with the finger electrode 88 when the passivation layer 95 is thick enough to almost completely disable the influence of embossed parts.

Figure 81:
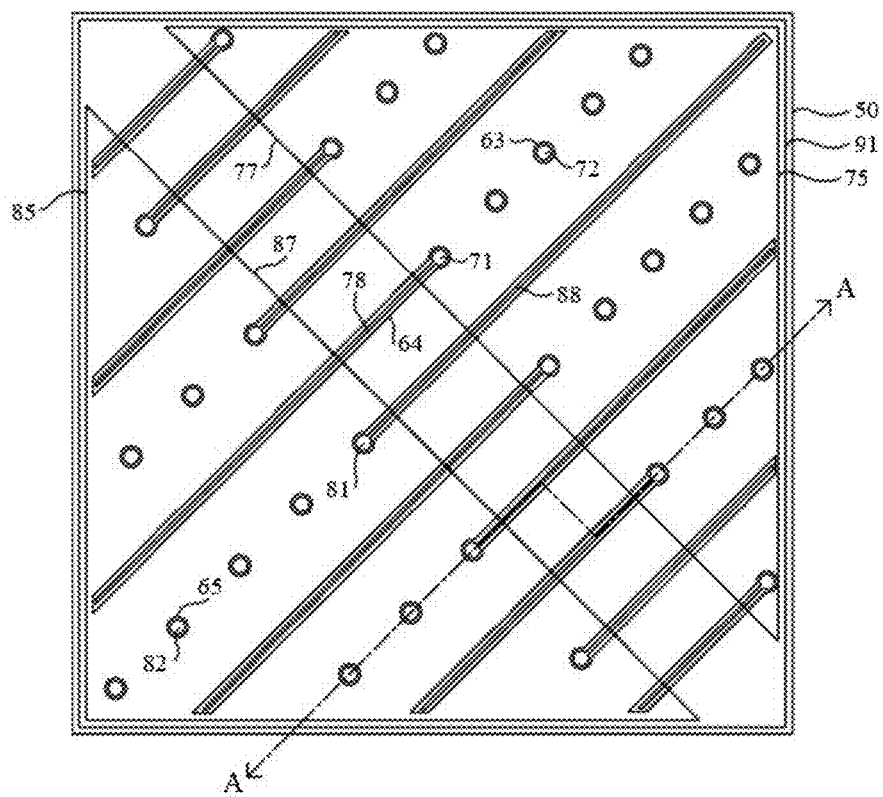
FIG. 81 is a schematic view illustrating an exemplary embodiment of a semiconductor light emitting device according to the present disclosure.
Figure 82:
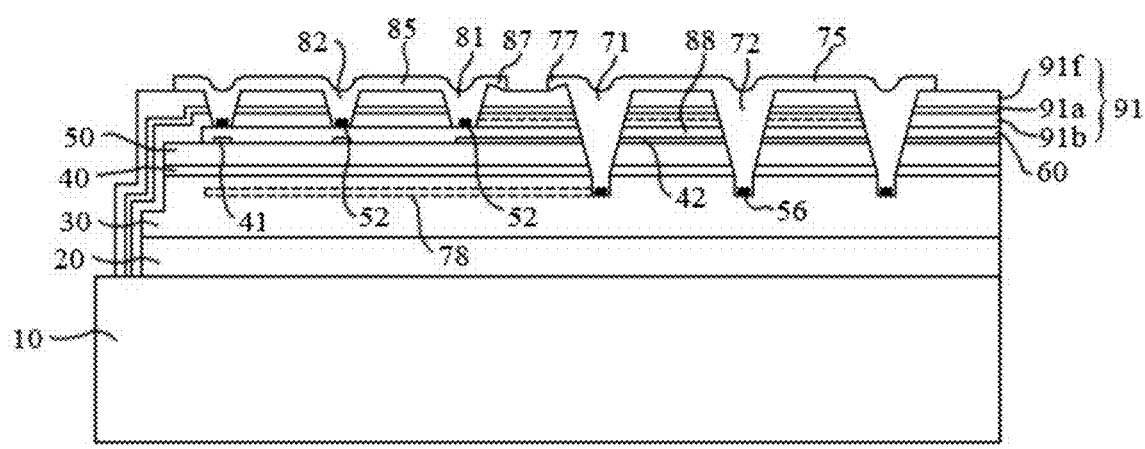
FIG. 82 is a schematic view illustrating an example of a cutaway portion, taken along line A-A in FIG. 81.

FIG. 81 is a schematic view illustrating an exemplary embodiment of a semiconductor light emitting device according to the present disclosure, and FIG. 82 is a schematic view illustrating an example of a cut away, taken along line A-A in FIG. 81.

In this embodiment, the semiconductor light emitting device includes a plurality of semiconductor layers 30, 40, 50, a light absorption barrier film 41, a current spreading conductive film 60, a non-conductive reflective film 91, a first electrode part and a second electrode part. At least one of the first and second electrode parts may include a lower electrode, an upper electrode, and an electrical connection for connecting them. In this embodiment, the first electrode part includes a first finger electrode 78 and a first ohmic contact pad 56 as a lower electrode, a first electrode 75 as an upper electrode, and a first electrical connection 71, 72 for connecting the lower electrode and the upper electrode. In addition, the second electrode part includes a second finger electrode 88 and a second ohmic contact pad 52 as a lower electrode, a second electrode 85 as an upper electrode, and second electrical connections 81, 82 for connecting the lower electrode and the upper electrode.

The plurality of semiconductor layers 30, 40, 50 includes a first semiconductor layer 30 having a first conductivity type, a second semiconductor layer 50 having a second conductivity type different from the first conductivity type, and an active layer 40 interpositioned between the first and second semiconductor layers 30, 50 for generating light by electron-hole recombination, which are sequentially grown on a growth substrate. The non-conductive reflective 91 is provided on the plurality of semiconductor layers 30, 40, 50, to reflect the light generated in the active layer 40 towards the growth substrate 10. The first electrode 75 is provided on the non-conductive reflective film 91 and supplies electrons or holes to the first semiconductor layer 30. The second electrode 85 is provided on the non-conductive reflective film 91, being at a distance away from the first electrode 75, and supplies holes (given that the first electrode supplies electrons) or electrons (given that the first electrode supplies holes) to the second semiconductor layer 50. At least one of an edge 77 of the first electrode and an edge 87 of the second electrode crossing over the plurality of semiconductor layers 30, 40, 50 are formed obliquely against the edge (e.g. 31, see FIG. 83) of the plurality of semiconductor layers.

Figure 83:
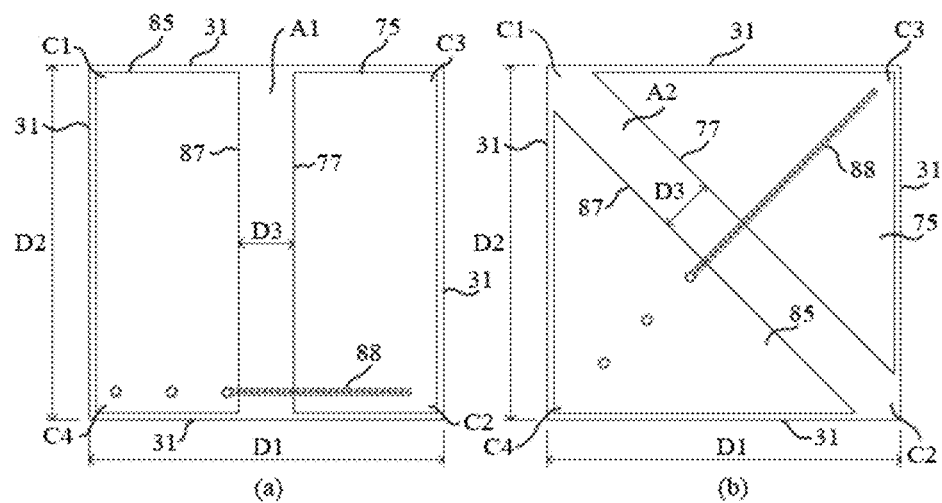
FIG. 83 schematically compares a semiconductor light emitting device according to a comparative example with an exemplary embodiment of a semiconductor light emitting device according to the present disclosure.

In this embodiment, the plurality of semiconductor layers 30, 40, 50 as seen in a top plan view has a quadrangular shape and a plurality of corners (e.g. see C1, C2, C3, C4; FIG. 83). Two of the corners (e.g. C1, C2; see FIG. 83) in a first diagonal direction (e.g. C1-C2 direction; see FIG. 83) of the plurality of semiconductor layers 30, 40, 50 are arranged in an area (e.g. A2; see FIG. 83) between the edge 77 of the first electrode and the edge 87 of the second electrode, which are facing each other. The edge 77 of the first electrode and the edge 87 of the second electrode lie side by side with each other and are formed obliquely against the edge 31 of the plurality of semiconductor layers, continued from the corners C1, C2.

When the first and second electrodes 75, 85 are brought into contact with the non-conductive reflective film 91, despite its being non-conductive and reflective, a portion of incident light can be reflected from a contact face between the electrodes and the non-conductive reflective film 91, and another portion of the light can be absorbed and lost by the first and second electrodes 75, 85. Therefore, in view of improving the brightness, it is preferential that the first electrode 75 and the second electrode 85 should have a smaller area. Meanwhile, from the perspective of thermal conductivity for heat emission, it is preferential that the first electrode 75 and the second electrode 85 should have a larger area. From the perspective of heat emission, therefore, there is a limit to how much wider the spacing between the edge 77 of the first electrode and the edge 87 of the second electrode can be.

Under these restrictions, the edge 77 of the first electrode and the edge 87 of the second electrode in this embodiment are tilted, that is, they formed obliquely as described above, so as to improve the brightness. For example, compared with the case where the edge 77 of the first electrode and the edge 87 of the second electrode are arranged perpendicularly or parallel to the edge 31 of the plurality of semiconductor layers (see FIG. 83 (a)), when the edges form an oblique line as in this embodiment, a larger area is created between the edge 77 of the first electrode and the edge 87 of the second electrode, without greatly affecting other requirements (e.g. thermal conductivity, etc.) of the semiconductor light emitting device. As a result, the light absorption loss by the first electrode 75 and the second electrode 85 is reduced, and the brightness is therefore improved. This will be explained further later.

In the following, a Group III-nitride semiconductor light emitting device will be explained as an example.

The substrate 10, which may eventually be removed, is typically made of sapphire, SiC, Si, GaN or the like. The plurality of semiconductor layers 30, 40, 50 include a buffer layer 20 formed on the substrate 10, a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interpositioned between the first semiconductor layer 30 and the second semiconductor layer 50 and generates light by electron-hole recombination. Each of the plurality of semiconductor layers 30, 40, 50 may have a multilayered structure, and the buffer layer 20 may be omitted.

The non-conductive reflective film 91 reflects light from the active layer 40 towards the plurality of semiconductor layers 30, 40, 50. In this embodiment, the non-conductive reflective film 91 is made of a non-metallic material for reducing light absorption by a metal reflective film. The non-conductive reflective film 91 includes a DBR 91a, a dielectric film 91b and a clad film 91f, for example. The dielectric film 91b or the clad film 91f may be omitted. When the DBR 91a is non-conductive, the dielectric film 91b, the DBR 91a and the clad film 91f all or collectively serve as the non-conductive reflective film 91.

The DBR 91a reflects light from the active layer 40 towards the substrate 10. The DBR 91a is preferentially made of a light transmitting material (e.g. $SiO_2/TiO_2$) to avoid light absorption.

The dielectric film 91b is located between the DBR 91a and the plurality of semiconductor layers 30, 40, 50, and may be made of a dielectric (e.g. $SiO_2$) having a refractive index lower than the effective refractive index of the DBR 91a. Here, the effective refractive index means an equivalent refractive index of light that can travel in a waveguide made of materials having different refractive indices. The dielectric film 91b may also be helpful for light reflection.

The clad film 91f is formed on the DBR 91a. The clad film 91f can also be made of a material (e.g. $Al_2O_3$, $SiO_2$, SiON, MgF, CaF) having a lower refractive index than the effective refractive index of the DBR 91a.

A large portion of the light generated in the active layer 40 is reflected towards the first semiconductor layer 30 by the dielectric film 91*b* and the DBR 91*a*. The relationships among the dielectric film 91*b*, the DBR 91*a* and the clad layer 91*f* can be explained from the perspective of an optical waveguide. The optical waveguide is a structure that encompasses the propagation part of light by a material having a lower refractive index than the refractive index of the light propagation part and guides the light using total internal reflection. In this regard, if the DBR 91*a* is taken as the propagation part, the dielectric film 91*b* and the clad film 91*f* can be considered as part of the structure that encompasses the propagation part.

The non-conductive reflective film 91 is provided with a plurality of openings, each opening being used as an electrical connecting pass. In this embodiment, the plurality of first semiconductor layer-side openings 63 is formed, passing through the non-conductive reflective film 91, the second semiconductor layer 50, the active layer 40, and until reaching down to part of the first semiconductor layer 30; and the plurality of second semiconductor layer-side openings 65 is formed, passing through the non-conductive reflective film 91. In this embodiment, the dielectric film 91*b* extends from between a current spreading conductive film 60 and the DBR 91*a* to the inner face of the first semiconductor layer side, thereby insulating the first electrical connection 71 and another first electrical connection 72 from the second semiconductor layer 50 and the active layer 40. On the other hand, a separate insulating film may be formed between the DBR 91*b* and the current spreading conductive film 60.

The light absorption barrier film 41 can be formed in correspondence to at least one of the second ohmic contact pad 52 and the second finger electrode 88, or it may be omitted. In this embodiment, a light absorption barrier film 41 or a current blocking layer may be provided between the second semiconductor layer 50 and the current spreading conductive film 60, corresponding to the p-side ohmic contact pad 52 (the second ohmic contact pad) and the p-side finger electrode 88 (the second finger electrode).

The semiconductor light emitting device includes the current spreading conductive film 60 between the non-conductive reflective film 91 and the plurality of semiconductor layers 30, 40, 50, for example, between the dielectric film 91*b* and the second semiconductor layer 50. The current spreading conductive film 60 may be formed of a current spreading electrode (ITO or the like), an ohmic metal layer (Cr, Ti or the like), a reflective metal layer (Al, Ag or the like), or a combination thereof. In order to reduce light absorption by a metal layer, the current spreading conductive film 60 is preferentially made of a light transmitting conductive material (e.g. ITO).

The first finger electrode 78 and the first ohmic contact pad 56 are provided on the etch-exposed first semiconductor layer 30, and the second finger electrode 88 and the second ohmic contact pad 52 are provided on the current spreading conductive film 60. In this embodiment, the first finger electrode 78 and the second finger electrode 88 are stretched in the second diagonal direction (e.g. C3-C4 direction; see FIG. 83). The closer the first finger electrode 78 and the second finger electrode 88 get to two corners C1, C2, they become shorter in length.

For example, a plurality of n-side finger electrodes 78 (the first finger electrode) is arrayed on the etch-exposed first semiconductor layer 30, and stretched from below the first electrode 75 to below the second electrode 85. The shape and array of the plurality of n-side finger electrodes 78 may vary, depending on the shape, size or the like of the semiconductor light emitting device. A plurality of n-side ohmic contact pads 56 (the first ohmic contact pad) is arranged below the first electrode 75 in the direction away from the second electrode 85, along an extension line of the n-side finger electrode 78. The n-side ohmic contact pad 56 may be made of the same material as the n-side finger electrode 78, and interpositioned between the first semiconductor layer 30 and the additional first electrical connection 72 for improving the electrical contact. The first electrical connection 71 is led into some of the first semiconductor layer-side openings 63 and becomes electrically conductive with the n-side finger electrode 78. The additional first electrical connection 72 is led into the rest of the first semiconductor layer-side openings 63 and becomes electrically conductive with the n-side ohmic contact pad 56.

A plurality of p-side finger electrodes 88 (the second finger electrode) is provided between the current spreading conductive film 60 and the dielectric film 91*b*, and stretched from below the second electrode 85 to below the first electrode 75. The p-side finger electrodes 88 promote current spreading towards the second semiconductor layer 50 (e.g. Mg-doped GaN) that corresponds to a p-type semiconductor layer more resistant to current spreading as compared with the first semiconductor layer 30 (e.g. Si-doped GaN) that corresponds to an n-type semiconductor layer. The shape and array of the plurality of p-side finger electrodes 88 may vary depending on the shape, size or the like of the semiconductor light emitting device. A plurality of p-side ohmic contact pads 52 (the second ohmic contact pad) is arranged below the second electrode 85 in the direction away from the first electrode 75, along an extension line of the p-side finger electrode 88. The p-side ohmic contact pads 52 are interpositioned between the current spreading current film 60 and the additional second electrical connection 82 for improving the electrical contact. The p-side ohmic contact pad 52 may be made of the same material as the n-side finger electrode 78. The second electrical connection 81 is led into some of the second semiconductor layer-side openings 65 and becomes electrically conductive with the p-side finger electrode 88. The additional second electrical connection 82 is led into the rest of the second semiconductor layer-side openings 65 and becomes electrically conductive with the n-side ohmic contact pad 56.

The number, spacing and layout of the first and second semiconductor layer-side openings 63, 65 may suitably modified, depending on the size of the semiconductor light emitting device, and for accomplishing current spreading, uniform current supply and homogeneous emission of light.

The first electrode 75 and the second electrode 85 are provided on the non-conductive reflective film 91, being spaced apart from each other. The first electrode 75 is electrically connected with the n-side finger electrode 78 and the n-side ohmic contact pad 56 through the first electrical connection 71 and the additional first electrical connection 72 for supplying electrons to the first semiconductor layer 30. The second electrode 85 is electrically connected with the p-side finger electrode 88 and the p-side ohmic contact pad 52 through the second electrical connection 81 and the additional second electrical connection 82 for supplying holes to the second semiconductor layer 30. The edge 77 of the first electrode and the edge 87 of the second electrode lie side by side with each other, crossing over the non-conductive reflective film 91, and are formed obliquely against the edge 31 of the plurality of semiconductor layers. As described above, there are two corners in the first diagonal direction in an area between the edge 77 of the first electrode and the edge 87 of the second electrode.

FIG. 83 schematically compares a semiconductor light emitting device according to a comparative example with an exemplary embodiment of a semiconductor light emitting device according to the present disclosure, in which a plurality of semiconductor layers 30, 40, 50, a first electrode 75, a second electrode 85, and a p-side finger electrode 88 are illustrated.

For example, the semiconductor light emitting device according to the comparative example suggested in FIG. 83 (a) and the exemplary embodiment of a semiconductor light emitting device according to the present disclosure suggested in FIG. 83 (b) have the same width (D1) and height (D2), and the same spacing D3 between the edge 77 of the first electrode and the edge 87 of the second electrode. Here, the plurality of semiconductor layers 30, 40, 50 as seen in a top plan view has a quadrangular shape, and thus the diagonal length (e.g. C1-C2 direction) is longer than the edge 31 at one side of the plurality of semiconductor layers 30, 40, 50. As such, the area A2 between the edge 77 of the first electrode and the edge 87 of the second electrode is larger than the area A1. As a result, the light absorption loss by the first electrode 75 and the second electrode 85 is reduced more than the semiconductor light emitting device according to the comparative example suggested in FIG. 83 (a), and the brightness is therefore improved. Given that the devices have the same width D1, the height D2 and the spacing D3, the areas of the first and second electrodes 75, 85 are slightly smaller in the semiconductor light emitting device suggested in FIG. 83 (b) than those in the comparative example suggested in FIG. 83 (a). Yet, considering that major heat emission is done by the metallic electrical connections 71, 72, 81, 82 formed in the openings, the difference between two devices in FIG. 83 (a) and FIG. 83 (b) is rather insignificant in terms of heat emission. However, the device in FIG. 83 (b) according to the disclosure has a substantially increased level of brightness.

Meanwhile, in order to promote current spreading or uniform current density, it is preferential to array finger electrodes symmetrically with respect to the corner. For example, in the comparative example suggested in FIG. 83 (a), the end of the p-side finger electrode 88 is arranged at the corner C2. However, if seen with respect to the corner C2, the p-side finger electrode 88 is not located at the center, but leaned towards one side. On the other hand, in the semiconductor light emitting device according to the disclosure suggested in FIG. 83 (b), the p-side finger electrode 88 and the p-side ohmic contact pad 52 are symmetrically arranged at the center of the corner C3, C4 in the second diagonal direction. This finger electrode being stretched in the diagonal direction is closely related to the fact that the edge 77 of the first electrode and the edge 87 of the second electrode are obliquely formed as described above. In conclusion, it is found that the edge 77 of the first electrode and the edge 87 of the second electrode formed obliquely can be advantageous for improving uniformity of the current density in relation to the finger electrode array.

Figure 84:
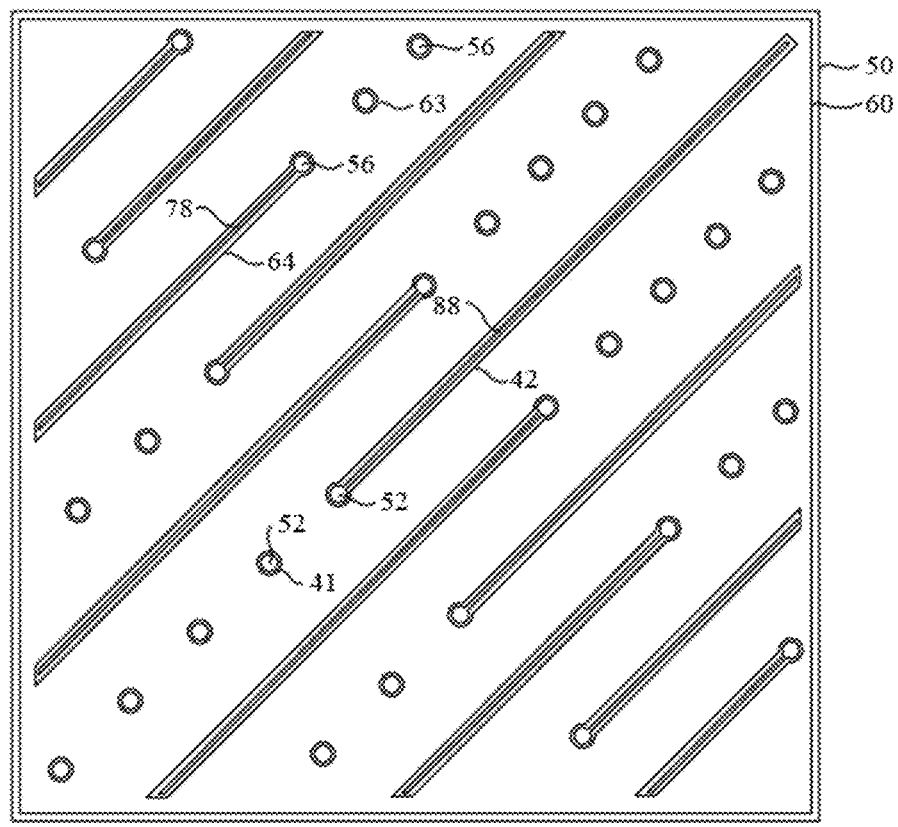
FIG. 84 is a schematic view illustrating a state prior to forming first and second electrodes.

FIG. 84 is a schematic view illustrating a state prior to forming first and second electrodes. In an exemplary embodiment of a manufacturing method of a semiconductor light emitting device according to the present disclosure, first of all, a plurality of semiconductor layers 30, 40, 50 is grown on a substrate 10 (see FIG. 82). For instance, on the substrate 10 (e.g. $Al_2O_3$, Si, SiC), a buffer layer (e.g. an AlN or GaN buffer layer), an un-doped semiconductor layer (e.g. un-doped GaN), a first semiconductor layer 30 having a first conductivity type (e.g. Si-doped GaN), an active layer 40 for generating light by electron-hole recombination (InGaN/(In) GaN, a multiple quantum well structure), and a second semiconductor layer 50 having a second conductivity type different from the first conductivity type (e.g. Mg-doped GaN) are grown. The buffer layer 20 may be omitted, and each of the plurality of said semiconductor layers 30, 40, 50 may have a multilayered structure. Although the first semiconductor layer 30 and the second semiconductor layer 50 may have opposite conductivity type, this is not desirable in the case of a Group III-nitride semiconductor light emitting device.

The first semiconductor layer 30, on which an n-side finger electrode 78 and an n-side ohmic contact pad 56 are supposed to be provided, is then exposed by a mesa etching process (e.g. the regions corresponding to 61, 63). The mesa etching process may be carried out after a light absorption barrier layer 41 (to be described) is formed, or after the current spreading conductive film 60 is formed.

Next, the light absorption barrier film 41 is formed on the second semiconductor layer 50. The light absorption barrier film 41 may be arranged in correspondence to at least one of the A-side finger electrode 88 and the p-side ohmic contact pad 52. As suggested in FIG. 82 and FIG. 84, the light absorption barrier film 41 in this embodiment is formed on the p-side finger electrode 88 and the p-side ohmic contact pad 52. Alternatively, the light absorption barrier film 41 may be omitted.

The current spreading barrier film 60 is formed on the second semiconductor layer 50 in a manner that it covers the light absorption barrier film 41. The current spreading barrier film 60 may be composed of a light transmitting conductor (e.g. ITO) for reducing light absorption. Although the current spreading barrier film 60 may be omitted, it is usually included to help current spreading towards the second semiconductor layer 50.

Then, the p-side finger electrode 88 and the p-side ohmic contact pad 52 are formed on the current spreading conductive film 60. Together, or through a separate process, the n-side finger electrode 78 and the n-side ohmic contact pad 56 are formed on the exposed first semiconductor layer 30. Each of the p-side finger electrode 88, the p-side ohmic contact pad 52, the n-side finger electrode 78 and the n-side ohmic contact pad 56 may have a multilayered structure. This will be explained further later.

Subsequently, a non-conductive reflective film 91 is formed. For example, a dielectric film 91b covering the current spreading conductive film 60 and the p-side finger electrode 88, and covering the p-side ohmic contact pad 52, the n-side finger electrode 78 and the n-side ohmic contact pad 56; a DBR 91a; and a clad film 91f are formed. The dielectric film 91b or the clad film 91f may be omitted.

The DBR 91a is composed of a stack of several periods (repetitions) of alternating layers of $SiO_2$ and $TiO_2$, for example. In addition, the DBR 91a may be a combination of a highly reflective material such as $Ta_2O_5$, HfO, ZrO or SiN, and a dielectric thin film (typically $SiO_2$) having a lower refractive index than the material. When the DBR 91a is made of $TiO_2/SiO_2$, it is preferentially subjected to an optimum process designed in consideration of the reflectivity as a function of the incident angle and the wavelength, using the ¼ optical thickness of the wavelength of light coming out of the active light as a reference. It is not absolutely required for each layer to have a thickness corresponding to ¼ of the optical thickness of the wavelength. The number of combinations is suitably in a range from 4 to 20 pairs.

For reflecting and guiding light, the DBR 91a preferentially has an effective refractive index larger than a refractive index of the dielectric film 91b. When the DBR 91a is made of $SiO_2/TiO_2$, with $SiO_2$ having the refractive index of 1.46 and $TiO_2$ having the refractive index of 2.4, the effective refractive index of the DBR 91a has a value between 1.46 and 2.4. Therefore, the dielectric film 91b may be made of $SiO_2$, and it preferentially has a thickness ranging from 0.2 μm to 1.0 μm. As the deposition of the DBR 91a needs to be done with high precision, the dielectric film 91b having a uniform thickness may be formed before the deposition such that the DBR 91b can be prepared in a stable manner, and light reflection can also benefit therefrom.

The clad film 91f can also be made of a metallic oxide such as $Al_2O_3$, or a dielectric film 91b such as $SiO_2$ or SiON, or a material such as MgF, CaF or the like. The clad film 91f may also be formed of $SiO_2$ having the refractive index of 1.46 that is smaller than the effective refractive index of the DBR 91a. Preferentially, the clad film 91f has a thickness which desirably ranges from $\lambda/4n$ to 3.0 μm, in which $\lambda$ denotes a wavelength of the light generated in the active layer 40, and n denotes a refractive index of a material of the clad film 91f. When $\lambda$ is 450 nm (4500 Å), the clad film 91f can be formed in a thickness of 771 Å (4500/4×1.46=771 Å) or more.

Considering that the top layer of the DBR 91a made of multiple pairs of $SiO_2/TiO_2$ can be composed of a $SiO_2$ layer having a thickness of $\lambda/4n$, it is desirable that the clad film 91f is thicker than $\lambda/4n$ to be distinguished from the top layer of the DBR 91a that is underlaid beneath the clad film 91f. However, it is not desirable for the top layer of the DBR 91a to be too thick (e.g., 3 μm or more) because this would impose a burden on the subsequent processes for forming a plurality of first semiconductor layer-side openings 63 and a plurality of second semiconductor layer-side openings 65 and only increase the material cost without contributing to the improvement of the efficiency. Therefore, an appropriate upper limit of the thickness of the clad film 91f would be between 1 μm and 3 μm, so as to relieve the burden on the subsequent processes for forming the plurality of first semiconductor layer-side openings 63 and the plurality of second semiconductor layer-side openings 65. But still, it is not totally prohibited to make the top layer as thick as 3.0 μm or more.

When the DBR 91a comes into direct contact with the metal layer (e.g. the p-side finger electrode 88, the n-side finger electrode 78, the first electrode 75 and the second electrode 85), part of the light travelling through the DBR 91a might be absorbed by the metal electrode. As described above, by introducing the clad film 91f and the dielectric film 91b having a lower refractive index than the refractive index of the DBR 91a, it becomes possible to significantly reduce an amount of light being absorbed.

Optionally, the dielectric film 91b may be omitted. Also, although not desirable in terms of an optical waveguide, there is no reason to exclude the configuration composed of the DBR 91a and the clad film 91f, when the overall technical idea of this disclosure is taken into consideration. Alternatively, a $TiO_2$ dielectric film 91b may also be used in place of the DBR 91a. Further, as an alternative, the clad film 91f may be omitted if the DBR 91a includes a $SiO_2$ layer on the top thereof.

Accordingly, the dielectric film 91b, the DBR 91a and the clad film 91f form the non-conductive reflective film 91 and serve as an optical waveguide, and they preferentially have a combined thickness of 1 to 8 μm.

A large portion of the light incident on the non-conductive reflective film is reflected towards the first semiconductor layer 30, but part of the light may be absorbed by or reflected from the first and second electrodes 75, 85 in contact with the non-conductive reflective film 91, or escaped via an area between the edge 77 of the first electrode and the edge 87 of the second electrode. In the semiconductor light device according to this embodiment, the edge 77 of the first electrode and the edge 87 of the second electrode are obliquely against the edge of the plurality of semiconductor layers, thereby having an increased area A2 therebetween. As a result, the light absorption loss by the first electrode 75 and the second electrode 85 is reduced, and the brightness is therefore improved.

Figure 85:
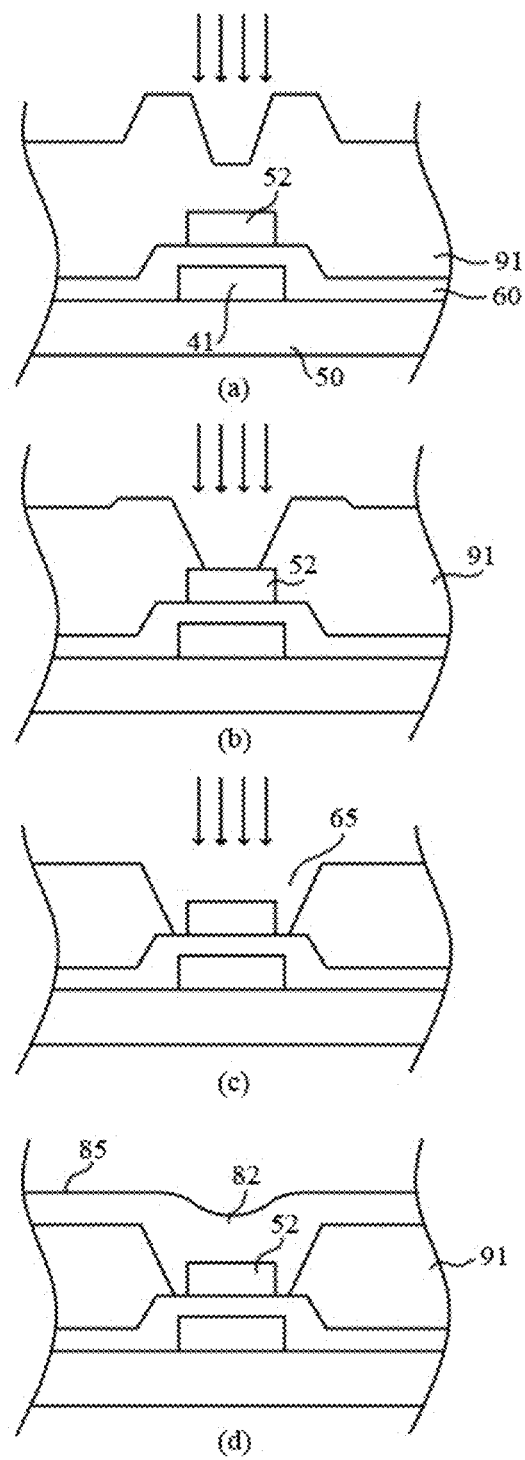
FIG. 85 is a schematic view illustrating an exemplary embodiment of a process for forming an opening in a semiconductor light emitting device according to the present disclosure.

FIG. 85 is a schematic view illustrating an example of a process for forming an opening in a semiconductor light emitting device according to the present disclosure. As described above, the non-conductive reflective film 91 is formed, and then the first semiconductor layer-side opening and the second semiconductor layer-side opening 65 are formed in the non-conductive reflective film 91 by etching (e.g. plasma etching) (see FIG. 81 and FIG. 85). While the first semiconductor layer-side opening and the second semiconductor layer-side opening 65 are open upwards of the semiconductor light emitting device, as an alternative, they may be open towards the sides. The first and second semiconductor-layer side openings 63, 65 are formed in correspondence to one end of the n-side finger electrode 78, the n-side ohmic contact pad 56, one end of the p-side finger electrode 88 and the p-side ohmic contact pad 52, respectively.

For example, as an etching process proceeds as in FIG. 85(a), part of the top face of the p-side ohmic contact pad 52 gets exposed as in FIG. 85(b). As the process continued gradually, a height difference between the upper rim of the opening 65, i.e. an etch-exposed face as in FIG. 85(b), and the top face of the non-conductive reflective film 91 is reduced. With further etching, the surroundings of the p-side ohmic contact pad 52 is exposed through the opening 65 as in FIG. 85(c), and the non-conductive reflection film 91 has slant faces formed by the opening 65. Moreover, in this embodiment, the upper rim of the opening 63, 65 and the top face of the non-conductive reflective film 91 are configured to be connected and form a flat plane, such that the etch-exposed face created during the opening 63, 65 formation process forms the upper rim of the opening 63, 65, thereby reducing the height difference between the upper rim of the opening 63, 65 and other parts of the non-conductive reflective film 91. Next, the second electrode 85 is formed in such a way that it comes into contact with the additional second electrical connection 82 in the second semiconductor layer-side opening 65 and with the top and lateral faces of the p-side ohmic contact pad 52, or it encompasses the top and lateral faces of the p-side ohmic contact pad 52. As a result, a larger contact face is obtained, and a stable electrical connection is established. Since the process for forming the first semiconductor layer-side opening 63 is very similar to the above description, it will not be explained here to avoid redundancy.

Figure 86:
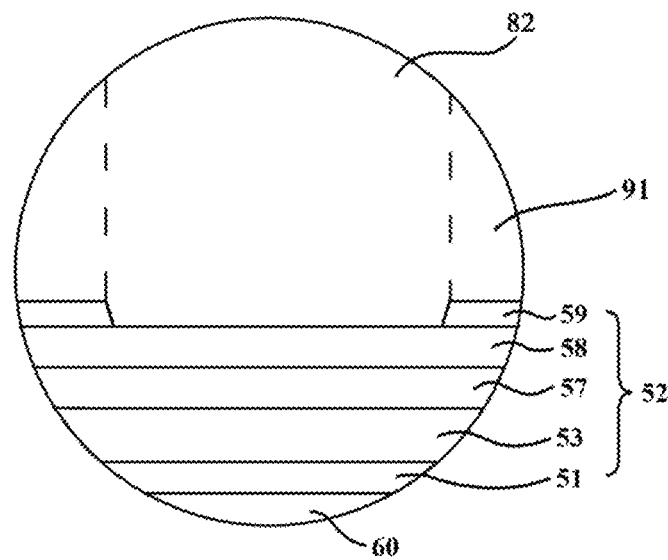
FIG. 86 is a schematic view illustrating an example of a layer structure of the lower electrode.

FIG. 86 is a schematic view illustrating an example of a layer structure of the lower electrode.

Harmful materials for electrical conducting, which have been produced during forming the opening (e.g. 63, 65), can be removed from the top face of the lower electrode (e.g. 56, 78, 52, 88) by an additional process, before the upper electrode (e.g. 75, 85) and the electrical connection (e.g. 71, 72, 81, 82) are formed. For example, in dry etching for forming a plurality of openings 63, 65, halogen gases containing an F group (e.g. $CF_4$, $C_2F_6$, $C_3F_8$, $SF_6$ or the like) may be used as an etching gas. If the opening formation process proceeds in absence of the p-side finger electrode 88, the n-side finger electrode 78, the p-side ohmic contact pad 52 and the n-side ohmic contact pad 56, it is inevitable that the surface of the current spreading conductive film 60 and the surface of the first semiconductor layer 30 become rough, and this can be unfavorable for an electrical contact. In this context, the p-side finger electrode 88, the n-side finger electrode 78, the p-side ohmic contact pad 52 and the n-side ohmic contact pad 56 are metal pads for interconnection that prevents such an electrical contact failure. Their presence reduces the contact resistance against the current spreading conductive film 60 and the first semiconductor layer 30, and allows the electrical connection 71, 72, 81, 82 to establish stable interconnection with the current spreading conductive film 60 and the first semiconductor layer 30.

Meanwhile, each of the p-side finger electrode 88, the n-side finger electrode 78, the p-side ohmic contact pad 52 and the n-side ohmic contact pad 56 can have a multilayered structure, as suggested in FIG. 86. For example, they each have a contact layer 51 in contact with the current spreading conductive film 60 or with the first semiconductor layer 30, an anti-oxidation layer 58 formed on the contact layer 51, and an anti-etching layer 59 formed on the anti-oxidation layer 58. Alternatively, they each have a contact layer 51, a reflective layer 53, a diffusion barrier layer 57, an anti-oxidation layer 58, and an anti-etching layer 59, which are arranged sequentially.

The contact layer 51 is typically made of a material such as Cr or Ti, and other materials such as Ni, TiW or the like, or highly reflective materials such as Al, Ag or the like may also be used. The reflective layer 53 may be made of a highly reflective metal (e.g. Ag, Al or a combination thereof). The reflective layer 53 reflects light generated in the active layer 40 towards the plurality of semiconductor layers 30, 40, 50. The reflective layer 53 may be omitted. The diffusion barrier layer 57 prevents the material of the reflective layer 53 or the material of the anti-oxidation layer 58 from diffusing into other layers. The diffusion barrier layer 57 may be made of at least one selected from Ti, Ni, Cr, W, TiW or the like. If the diffusion barrier layer 57 needs to be highly reflective, Al, Ag or the like may be used. The anti-oxidation layer 58 may be made of Au, Pt or the like, and any material that would not be oxidized easily when exposed to the outside and brought into contact with oxygen is also useful. Au, a highly electrically conductive material, is typically used for the anti-oxidation layer 58.

The anti-etching layer 59 is a layer exposed during dry etching for forming the first semiconductor layer-side opening 63 and the second semiconductor layer-side opening 65 in the non-conductive reflective film 91. When the anti-etching layer 59 is made of Au, it shows weak bonding strength towards the non-conductive reflective film 91, and part of Au may be damaged or ruined during etching. Hence, the anti-etching layer 59 is preferentially made of a material such as Ni, W, TiW, Cr, Pd, Mo or the like, instead of Au, in order to retain the bonding strength towards the non-conductive reflective layer 91, thus improving reliability. Meanwhile, during dry etching, the anti-etching layer 59 protects the p-side finger electrodes 88, the p-side ohmic contact pad 52, the n-side finger electrode 78 and the n-side ohmic contact pad 56, and in particular it prevents damages on the anti-oxidation layer 58. The etching gas used in dry etching for forming the opening 65 may produce harmful materials for electrical conducting, including a material such as an insulation material or impurities, on the top layer of the electrode. This material is removed by wet etching following the opening formation etching process, such that the anti-oxidation layer 58 in correspondence to the opening 63, 65 is exposed. The material as well as the anti-etching layer 59 are etched and removed together. With the material having been removed, the p-side finger electrodes 88, the p-side ohmic contact pad 52, the n-side finger electrode 78 and the n-side ohmic contact pad 56 may have a better electrical contact among them, and deterioration of the electrical properties of the semiconductor light emitting device is avoided.

In one embodiment, the p-side finger electrode 88 and the p-side ohmic contact pad 52 have a stack of Cr (contact layer)/Al (reflective layer)/Ni (diffusion barrier layer)/Au (anti-oxidation layer)/Cr (anti-etching layer) arranged sequentially. Also, having removed a part of the anti-etching layer 59 in correspondence to the second semiconductor layer-side opening 65 to avoid deterioration of the electrical properties, in one embodiment, the p-side finger electrode 88 and the p-side ohmic contact pad 52 may have a stack of Cr (contact layer)/Al (reflective layer)/Ni (diffusion barrier layer)/Au (anti-oxidation layer) arranged sequentially, in which the anti-oxidation layer 58 may come into contact with an electrical connection 81, 82 (to be described). The n-side finger electrode 78 and the n-side ohmic contact pad 52 can also have the same layer structure as the p-side finger electrode 88. If the Al reflective layer is made thick, Al may be burst out. In this case, the bursting may be avoided by alternately stacked Al/Ni layers.

Referring back to FIG. 85 (d), the first electrode 75 and the second electrode 85 may be deposited on the non-conductive reflective film 91 using a stud bump, sputtering equipment, E-beam equipment, for example. During the process of forming the first and second electrodes 75, 85, electrical connections 71, 72, 81, 82 are also formed in the openings 63, 65. The first electrode 75 and the second electrode 85 can be electrically connected with an electrode prepared in the outside (package, COB, sub-mount, or the like) by means of a stud bump, conductive paste or eutectic bonding. In the case of eutectic bonding, it is important that the first electrode 75 and the second electrode 85 have comparable heights without much difference. In the semiconductor light emitting device according to this embodiment, the height difference of the upper rim of the opening, and therefore unevenness can be reduced during the aforementioned process of forming an opening, resulting in an advantageous structure for eutectic bonding. When the semiconductor light emitting device is electrically connected to the outside through eutectic bonding, the top part of the first and second electrodes 75, 85 may be formed of a eutectic bonding material such as an Au/Sn alloy or an Au/Sn/Cu alloy. As an alternative, a separate bonding pad may be formed over the first electrode 75 and the second electrode 85.

Figure 87:
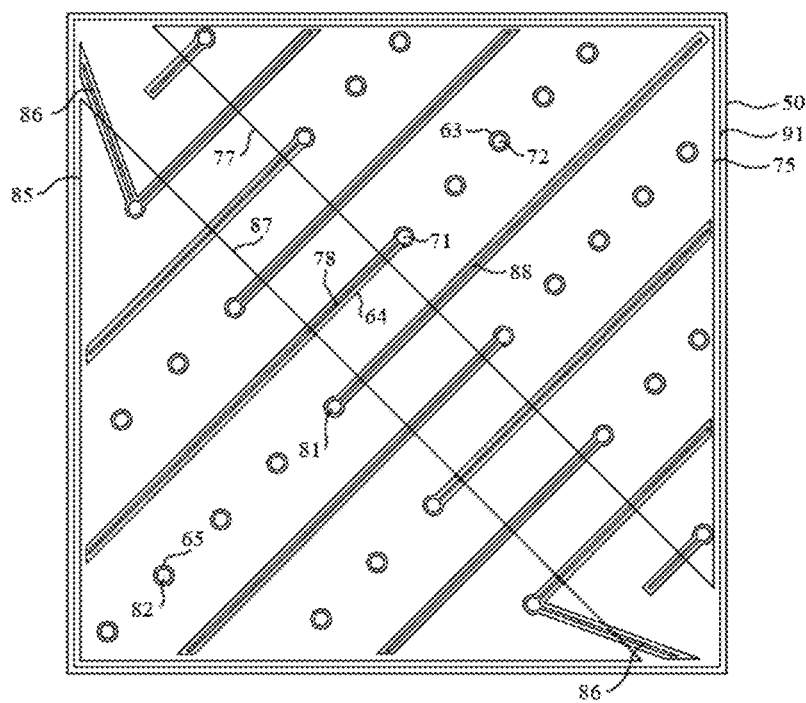
FIG. 87 is a schematic view illustrating a still further exemplary embodiment of a semiconductor light emitting device according to the present disclosure.

FIG. 87 is a schematic view illustrating a still further exemplary embodiment of a semiconductor light emitting device according to the present disclosure. Here, the semiconductor light emitting device further includes a p-side finger electrode 86 (a third finger electrode) for improving current uniformity, the electrode being stretched from the second electrical connection 81 close to the first diagonal direction corner towards a neighboring corner, and the n-side finger electrode 78 close to the corner has a shorter length. Same components denoted by the same reference numerals will not be explained to avoid redundancy.

In order to improve current spreading or current density uniformity, it is preferential to array electrodes symmetrically with respect to the corner. For example, in the comparative example suggested in FIG. 83 (a), the end of the p-side finger electrode 88 is arranged at the corner C2. However, if seen with respect to the corner C2, the p-side finger electrode 88 is not located at the center, but leaned towards one side. On the other hand, in the semiconductor light emitting device according to the disclosure, the p-side finger electrode 88 and the p-side ohmic contact pad 52 are symmetrically arranged at the center of the corner in the second diagonal direction. Moreover, the presence of the additional finger electrode 86 as mentioned above improves current spreading and uniformity at the corner in the first diagonal direction.

Figure 88:
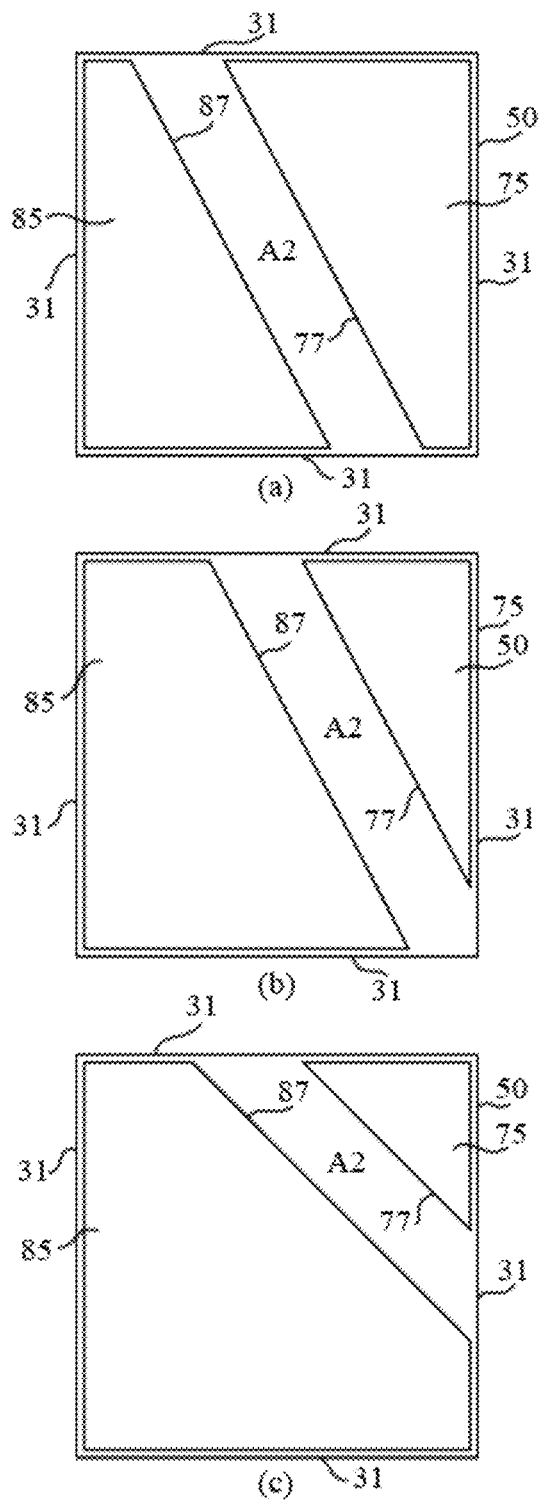
FIG. 88 schematically shows still further exemplary embodiments of a semiconductor light emitting device according to the present disclosure.

FIG. 88 schematically shows still further exemplary embodiments of a semiconductor light emitting device according to the present disclosure.

In the embodiments suggested in FIG. 88, the edge 77 of the first electrode and the edge 87 of the second electrode are formed obliquely against the edge of the semiconductor light emitting device. As suggested in FIG. 88 (*a*), in an alternative embodiment, there may be no corner in the area between the edge 77 of the first electrode and the edge 87 of the second electrode. Moreover, as suggested in FIG. 88 (*b*), there may be one corner in the area between the edge 77 of the first electrode and the edge 87 of the second electrode. In a further alternative embodiment, as suggested in FIG. 88 (*c*), there may be no corner in the area between the edge 77 of the first electrode and the edge 87 of the second electrode, but the first electrode 75 and the second electrode 85 may have different areas.

As such, independent of the shape and area splits of the first and second electrodes 75, 85, improved brightness is obtained when the edge 77 of the first electrode and the edge 87 of the second electrode are formed obliquely against the edge 31 of the plurality of semiconductor layer, as compared with the case where the edge 77 of the first electrode and the edge 87 of the second electrode are arranged perpendicularly or parallel to the edge 31 of the plurality of semiconductor layers.

The following describes various exemplary embodiments of the present disclosure.

(1) A semiconductor light emitting device characterized by comprising: a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a first electrode part, which is in electrical communication with the first semiconductor layer and supplies electrons or holes thereto; a second electrode part, which is in electrical communication with the second semiconductor layer and supplies holes thereto if the first electrode part supplies electrons, or electrons if the first electrode part supplies holes; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode.

(2) The semiconductor light emitting device characterized in that a current spreading barrier film is provided between the second semiconductor layer and the non-conductive reflective film, and the lower electrode comes in contact with the current spreading conductive film and the electrical connection, respectively, on the current spreading conductive film.

(3) The semiconductor light emitting device characterized in that the opening is formed, passing through the second semiconductor layer, the active layer and until reaching down to part of the first semiconductor layer, and the lower electrode comes in contact with an exposed part of the first semiconductor layer and with the electrical connection, respectively.

(4) The semiconductor light emitting device characterized in that the lower electrode comprises: a contact layer for lowering an electrical contact resistance with the plurality of semiconductor layers; a reflective layer provided on the contact layer; a diffusion barrier layer provided on the reflective layer; an anti-oxidation layer provided on the diffusion barrier layer; and an anti-etching layer provided on the anti-oxidation layer, wherein the anti-etching layer in correspondence to the opening is removed to allow the electrical connection to come into contact with the anti-oxidation layer.

(5) The semiconductor light emitting device characterized in that the non-conductive reflective film comprises a DBR (Distributed Bragg Reflector) for reflecting light from the active layer.

(6) The semiconductor light emitting device characterized by further comprising a current blocking layer between the second semiconductor layer and the current spreading conductive film.

(7) The semiconductor light emitting device characterized in that a top layer of the upper electrode is made of a eutectic bonding material.

(8) The semiconductor light emitting device characterized in that the lower electrode comprises at least one of the following: a finger electrode long stretched above the plurality of semiconductor layers; and an island-like ohmic contact pad.

(9) The semiconductor light emitting device characterized in that a face of the non-conductive reflective film formed by the opening is slanted.

(10) The semiconductor light emitting device characterized in that the upper electrode comprises a Sn-containing soldering layer as a top layer.

(11) The semiconductor light emitting device characterized in that the upper electrode comprises: a Sn-containing soldering layer; and an anti-oxidation layer formed on the soldering layer, the anti-oxidation layer being formed of at least one of Au and Pt.

(12) The semiconductor light emitting device characterized in that the soldering layer has a thickness of 5000 Å or more, and the anti-oxidation layer has a thickness of 1000 Å or less.

(13) The semiconductor light emitting device characterized in that the upper layer comprises: a crack resistant layer having a first thermal expansion coefficient for preventing cracks in the semiconductor light emitting device during bonding; and an anti-burst layer provided on the crack resistant layer, the anti-burst layer having a second thermal expansion coefficient higher than the first thermal expansion coefficient for preventing the crack resistant layer from getting burst.

(14) The semiconductor light emitting device characterized in that the non-conductive reflective film comprises a DBR for reflecting light from the active layer, and the current spreading conductive film has an embossed part distinguishable from the plurality of semiconductor layers, the embossed part serving to reduce an interference between light generated in the active layer and light reflected from the DBR.

(15) The semiconductor light emitting device characterized in that the lower electrode is partly exposed through the opening, and the non-conductive reflective film is raised up at the edge of the lower electrode.

(16) The semiconductor light emitting device characterized in that the lower electrode has a top face and lateral faces, and the surroundings of the lower electrode is exposed through the opening, and the electrical connection is adapted to encompass the top and lateral faces of the lower electrode.

(17) The semiconductor light emitting device characterized in that a face that has been etched during formation of the opening and thus has a reduced height difference forms an upper rim of the opening.

(18) The semiconductor light emitting device characterized in that the upper rim of the opening is raised upwards higher than the top face of the non-conductive reflective film.

(19) The semiconductor light emitting device characterized in that the upper electrode comprises an ohmic contact pad being at least partly exposed through the opening, and a finger electrode extended from the ohmic contact pad, and the upper electrode is patterned in such a way that the upper electrode covers the electrical connection, without covering the finger electrode and a part of the ohmic contact pad connected with the finger electrode.

(20) The semiconductor light emitting device characterized by comprising: an upper electrode; a separate bonding pad; and an insulating layer provided between the bonding pad and the upper electrode, wherein the bonding pad and the upper electrode electrically communicate with each other through an opening formed in the insulating layer.

(21) A semiconductor light emitting device characterized by comprising: a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film, which is formed on the plurality of semiconductor layers for reflecting the light generated in the active layer towards the growth substrate; a first electrode provided on the non-conductive reflective film and adapted to supply electrons or holes to the first semiconductor layer; and a second electrode provided on the non-conductive reflective film at a distance from the first electrode and adapted to supply holes to the second semiconductor given that the first electrode supplies electrons, or electrons given that the first electrode supplies holes, wherein at least one of an edge of the first electrode and an edge of the second electrode crossing above the plurality of semiconductor layers is formed obliquely against an edge of the plurality of semiconductor layers.

(22) The semiconductor light emitting device characterized in that the plurality of semiconductor layers has a plurality of corners as seen in a top plan view, and the edge of the first electrode and the edge of the second electrode, facing each other, have, in an area therebetween, two corners in a diagonal direction.

(23) The semiconductor light emitting device characterized in that the plurality of semiconductor layers has a quadrangular shape as seen in a top plan view.

(24) The semiconductor light emitting device characterized in that the edge of the first electrode and the edge of the second electrode lie side by side and are formed obliquely against the edge of the plurality of semiconductor layers.

(25) The semiconductor light emitting device characterized in that the plurality of semiconductor layers has a plurality of corners as seen in a top plan view, and the edge of the first electrode and the edge of the second electrode have at least one corner in an area therebetween.

(26) The semiconductor light emitting device characterized in that the plurality of semiconductor layers has a plurality of corners as seen in a top plan view, and the edge of the first electrode and the edge of the second electrode have no corner in an area therebetween.

(27) The semiconductor light emitting device characterized in that the non-conductive reflective film comprises a DBR.

(28) The semiconductor light emitting device characterized by comprising: a first finger electrode provided on an exposed part of the first semiconductor layer by etching the second semiconductor layer and the active layer, the first finger electrode being stretched from below the first electrode to below the second electrode; and a first electrical connection passing through the non-conductive reflective film to electrically connect the first electrode with the first finger electrode.

(29) The semiconductor light emitting device characterized by comprising: a second finger electrode provided between the second semiconductor layer and the non-conductive reflective film, the second finger electrode being stretched from below the second electrode to below the first electrode; and a second electrical connection passing through the non-conductive reflective film to electrically connect the second electrode with the second finger electrode.

(30) The semiconductor light emitting device characterized by comprising: a first finger electrode provided on an exposed part of the first semiconductor layer by etching the second semiconductor layer and the active layer, the first finger electrode being stretched from below the first electrode to below the second electrode; a first electrical connection passing through the non-conductive reflective film to electrically connect the first electrode with the first finger electrode; a second finger electrode provided between the second semiconductor layer and the non-conductive reflective film, the second finger electrode being stretched from below the second electrode to below the first electrode; and a second electrical connection passing through the non-conductive reflective film to electrically connect the second electrode with the second finger electrode, wherein the plurality of semiconductor layers has a quadrangular shape as seen in a top plan view, and the edge of the first electrode and the edge of the second electrode, facing each other, have, in an area therebetween, two corners in a first diagonal direction.

(31) The semiconductor light emitting device characterized by comprising: an island-like first ohmic contact pad provided on the first semiconductor layer, at a distance from the first finger electrode below the first electrode; an island-like second ohmic contact pad provided on the second semiconductor layer, at a distance from the second finger electrode below the second electrode; an additional, first electrical connection passing through the non-conductive reflective film to electrically connect the first ohmic contact pad with the first electrode; and an additional, second electrical connection passing through the non-conductive reflective film to electrically connect the second ohmic contact pad with the second electrode.

(32) The semiconductor light emitting device characterized by comprising a light absorption barrier film 41 provided in at least one of the following: between the second electrode and the second semiconductor layer, and between the second ohmic contact pad and the second semiconductor layer.

(33) The semiconductor light emitting device characterized by comprising a plurality of first finger electrodes and a plurality of second finger electrodes, wherein lengths of the first finger electrode and the second finger electrode get shorter towards two corners in the first diagonal direction.

(34) The semiconductor light emitting device characterized by comprising a third finger electrode stretching from the second electrical connection close to the corner in the first diagonal direction towards the corner in the first diagonal direction.

(35) A manufacturing method of a semiconductor light emitting device characterized by comprising, as a second etching process, a wet etching process for removing a material of interest.

The electrical connection may be formed in an opening by using an electrode material. The opening can be formed by dry etching, wet etching or a combination of both. The second etching process may be carried out by dry etching for removing a material of interest, or by both wet etching and dry etching.

(36) The manufacturing method of a semiconductor light emitting device characterized in that an electrode formation step includes: forming a contact layer for electrically connecting a plurality of semiconductor layers; and forming an anti-etching layer on the contact layer, the anti-etching layer being exposed through the opening during the first etching process.

(37) The manufacturing method of a semiconductor light emitting device characterized in that a part of the anti-etching layer in correspondence to the opening is exposed by a dry etching process which is the first etching process, and the part of the anti-etching layer in correspondence to the opening as well as a material of interest are removed by a wet etching process which is the second etching process.

(38) The manufacturing method of a semiconductor light emitting device characterized in that a part of the anti-etching layer in correspondence to the opening is exposed by a wet etching process which is the first etching process, and the part of the anti-etching layer in correspondence to the opening is removed by a wet etching process which is the second etching process.

(39) The manufacturing method of a semiconductor light emitting device characterized in that an electrode formation step includes: forming a reflective layer on the contact layer before forming the anti-etching layer; forming a diffusion barrier layer on the reflective layer; and forming an anti-oxidation layer on the diffusion barrier layer, wherein the anti-etching layer is formed on the anti-oxidation layer.

(40) The manufacturing method of a semiconductor light emitting device characterized in that the first etching process is a dry etching process using halogen gases containing a F group as an etching gas, the anti-oxidation layer is made of at least one of Au and Pt, and the anti-etching layer is made of at least one selected from Cr, Ni, W, TiW, Pd or Mo.

The manufacturing method of a semiconductor light emitting device characterized by alternatively stacking several periods (repetitions) of the reflective layer and the diffusion barrier layer.

(42) The manufacturing method of a semiconductor light emitting device characterized in that a non-conductive film formation step includes at least one of the following: forming a dielectric film on the opposite side of a plurality of semiconductor layers with respect to the electrode; and forming a DBR on the opposite side of the plurality of semiconductor layers with respect to the electrode.

The manufacturing method of a semiconductor light emitting device according to the present disclosure includes introducing a conductive reflective film, independently of the non-conductive film.

(43) The manufacturing method of a semiconductor light emitting device characterized by including: forming, on the second semiconductor layer, a light absorption barrier for reducing light absorption by the electrode; forming a current spreading current film in a manner to cover the light absorption barrier from above the second semiconductor layer; and forming, on the non-conductive film, a reflective electrode electrically connected with an electrical connection, the electrode formation step including: forming a contact layer on the current spreading conductive film; forming a reflective film on the contact layer; forming a diffusion barrier layer on the reflective layer; forming an anti-oxidation layer on the diffusion barrier layer; and forming an anti-etching layer on the anti-oxidation layer, the non-conductive film formation step including: forming a dielectric film using $SiO_2$ in a manner to cover the electrode; and forming a DBR including a $TiO_2/SiO_2$ layer on the dielectric film, wherein a part of the anti-etching layer in correspondence to the opening is exposed by a dry etching process which is the first etching process, and the part of the anti-etching layer in correspondence to the opening as well as a material of interest are removed by a wet etching process which is the second etching process, and the anti-oxidation layer comes into contact with the electrical connection.

A semiconductor light emitting device characterized by comprising: a plurality of semiconductor layers, which includes a first semiconductor layer having a first conductivity type, a second semiconductor layer having a second conductivity type different from the first conductivity type, and an active layer interpositioned between the first and second semiconductor layers, for generating light by electron-hole recombination; an electrode electrically connected with the first semiconductor layer or the second semiconductor layer, the electrode including a contact layer formed on the first semiconductor layer or the second semiconductor layer, an anti-oxidation layer formed on the contact layer and an anti-etching layer formed on the anti-oxidation layer; a non-conductive film arranged in a manner to cover the electrode, to face the plurality of semiconductor layers, and to reflect light from the active layer, the non-conductive film having an opening as an electrical connection pass with the electrode; and an electrical connection coming into contact with the electrode through the opening.

Semiconductor light emitting devices and their manufacturing methods according to the present disclosure are applicable to a vertical semiconductor light emitting device, a lateral chip, a flip chip and so on.

(45) The semiconductor light emitting device characterized in that a part of the anti-etching layer in correspondence to the opening is removed, and the electrical connection is brought into contact with an exposed part of the anti-oxidation layer after the anti-etching layer has been removed.

(46) The semiconductor light emitting device characterized in that the non-conductive film comprises a DBR including a $TiO_2/SiO_2$ layer.

(47) The semiconductor light emitting device characterized in that the anti-oxidation layer is made of at least one of Au and Pt.

(48) The semiconductor light emitting device characterized in that the anti-etching layer is made of at least one selected from Cr, Ni, W, TiW, Pd and Mo.

(49) The semiconductor light emitting device characterized by comprising: a reflective layer provided between the contact layer and the anti-oxidation layer, the reflective layer being made of at least one of Ag and Al; and a diffusion barrier layer provided between the reflective layer and the anti-oxidation layer, the diffusion barrier layer being made of at least one selected from Ti, Ni, Cr, W and TiW.

(50) The semiconductor light emitting device characterized by comprising: a plurality of semiconductor layers, which includes a first semiconductor layer having a first conductivity type, a second semiconductor layer having a second conductivity type different from the first conductivity type, and an active layer interpositioned between the first and second semiconductor layers, for generating light by electron-hole recombination; a DBR reflecting light from the active layer, the DBR having a first opening, and a slant face created by the first opening; a first electrode adapted to supply electrons or holes to a first semiconductor layer; and a second electrode electrically connected with the plurality of semiconductor layers through the first opening and adapted to supply holes to a second semiconductor layer given that the first electrode supplies electrons, or electrons given that the first electrode supplies holes.

(51) The semiconductor light emitting device characterized by comprising at least one of the following: a dielectric film interpositioned between the plurality of semiconductor layers and the DBR, the dielectric film having a lower refractive index than the effective refractive index of the DBR and being penetrated by the first opening; and a clad film arranged on the opposite side of the plurality of semiconductor layers with respect to the DBR, the clad film having a lower refractive index than the effective refractive index of the DBR and being penetrated by the first opening.

(52) The semiconductor light emitting device characterized in that a slant angle between a vertical line at right angles with the top face of the DBR and a face of the DBR formed by the first opening is no more than 75 degrees and no less than 25 degrees.

The slant face formed by the first opening does not necessarily have to be flat. It can be curved or slanted in a step shape.

(53) The semiconductor light emitting device characterized in that the face of DBR formed by the first opening comprises a plurality of sub-faces having different slant angles.

(54) The semiconductor light emitting device characterized in that the first opening is inclined to reflect light that had been guided by the dielectric film and the clad film into the DBR, towards the plurality of semiconductor layers.

(55) The semiconductor light emitting device characterized by comprising a reflective metal layer which includes both a dielectric film and a clad film and is made of Ag, Al or an alloy thereof coming into contact with a face of the dielectric film, a face of DBR and a face of the clad film, each face being formed by the first opening.

(56) The semiconductor light emitting device characterized in that the DBR has a second opening, which creates a slant face on the DBR and through which the first electrode is electrically connected with the plurality of semiconductor layers.

The first opening and the second opening do not necessarily have to be formed together.

(57) The semiconductor light emitting device characterized in that the DBR has a third opening, which creates a slant face on the DBR and is not covered by the first electrode and the second electrode.

(58) The semiconductor light emitting device characterized by comprising: a dielectric film interpositioned between the plurality of semiconductor layers and the DBR, the dielectric film having a lower refractive index than the effective refractive index of the DBR and being penetrated by the first opening; and a clad film arranged on the opposite side of the plurality of semiconductor layers with respect to the DBR, the clad film having a lower refractive index than the effective refractive index of the DBR and being penetrated by the first opening, wherein a plurality of first openings and at least one second opening are formed passing through the clad film, the DBR and the dielectric film, and the first electrode and the second electrode are formed on the clad film at a substantially equal height.

(59) The semiconductor light emitting device characterized by comprising: a dielectric film interpositioned between the plurality of semiconductor layers and the DBR, the dielectric film having a lower refractive index than the effective refractive index of the DBR and being penetrated by the first opening; a clad film arranged on the opposite side of the plurality of semiconductor layers with respect to the DBR, the clad film having a lower refractive index than the effective refractive index of the DBR and being penetrated by the first opening; and a light transmitting conductive film interpositioned between the plurality of semiconductor layers and the dielectric film and electrically connected with the second electrode filled in the first opening, wherein the first opening is inclined to reflect light that had been guided by the dielectric film and the clad film into the DBR, towards the plurality of semiconductor layers, and the DBR has a second opening, which creates a slant face on the DBR and through which the first electrode is electrically connected with the plurality of semiconductor layers.

(60) A semiconductor light emitting device characterized by comprising: a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film, which is formed on the second semiconductor layers for reflecting the light generated in the active layer towards the growth substrate and has a first semiconductor layer-side opening and a second semiconductor layer-side opening formed therein; a finger electrode stretched between the non-conductive reflective film and the second semiconductor layer and electrically connected with the second semiconductor layer; a plurality of first electrical connections electrically connected with the first semiconductor layer through the first semiconductor layer-side opening; and a second electrical connection connected with the finger electrode through the second semiconductor layer-side opening.

(61) The semiconductor light emitting device characterized by comprising a first electrode formed on the non-conductive reflective film to be connected with the plurality of first electrical connection, the first electrode supplying electrons or holes to the first semiconductor layer; and a second electrode formed on the non-conductive reflective film to be connected with the second electrical connection, and adapted to supply holes to the second semiconductor layer given that the first electrode supplies electrons, or electrons given that the first electrode supplies holes.

(62) The semiconductor light emitting device characterized by comprising a third electrical connection electrically connected with the second semiconductor layer through the second semiconductor layer-side opening, independently of the finger electrode.

(63) The semiconductor light emitting device characterized in that the first semiconductor layer has a greater electrical conductivity than the electrical conductivity of the second semiconductor layer.

(64) The semiconductor light emitting device characterized in that a plurality of finger electrodes is stretched from below the second electrode to below the first electrode, and a plurality of first electrical connections is arranged between the plurality of finger electrodes.

(65) The semiconductor light emitting device characterized by comprising a third electrical connection electrically connected with the second semiconductor layer through the second semiconductor layer-side opening, independently of the finger electrode, where the third electrical connection is located below the second electrode and further away from the first electrode than the second electrical connection.

(66) The semiconductor light emitting device characterized by comprising: a first connection electrode provided between the non-conductive reflective film and the first electrode for connecting a plurality of first electrical connections and electrically connected with the first electrode; a second connection electrode provided between the non-conductive reflective film and the second electrode for connecting a plurality of second electrical connections and electrically connected with the second electrode; and an insulating layer formed in at least one of the following: between the first connection electrode and the second electrode, and between the second connection electrode and the first electrode.

(67) The semiconductor light emitting device characterized in that the plurality of finger electrodes stretch side by side from below the second electrode to below the first electrode, the plurality of first electrical connections is arranged between the plurality of finger electrodes, and the first and second connection electrodes each have a finger shape and are arranged in an interdigitate finger shape.

(68) The semiconductor light emitting device characterized by comprising a third electrical connection electrically connected with the second semiconductor layer through the second semiconductor layer-side opening, independently of the finger electrode, wherein the third electrical connection is located on the opposite of the finger electrode with respect to the second electrical connection, and below the second electrode only.

(69) The semiconductor light emitting device characterized in that the first electrode and the second electrode are arranged to face each other, and one of an edge of the first electrode and an edge of the second electrode, facing each other, is provided with a groove for distinguishment purpose.

(70) A combination of the aforementioned semiconductor light emitting devices.

(71) A semiconductor light emitting device characterized by comprising: a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a first electrode part in electrical communication with the first semiconductor layer; a second electrode part in electrical communication with the second semiconductor layer; and a non-conductive reflective film, which is formed on the plurality of semiconductor layers for reflecting the light generated in the active layer towards the growth substrate and has an opening formed therein, wherein at least one of the first electrode part and the second electrode part includes: a lower electrode having a top face and lateral faces connected to the top face, at least part of the lower electrode being exposed through the opening; an upper electrode provided on the non-conductive reflective film; and an electrical connection, which is in communication with the upper electrode, being led into the opening to come into contact with the top face of the lower electrode, and adapted to cover edges where the top face and the lateral faces of the lower electrode meet.

(72) The semiconductor light emitting device characterized in that surroundings of the lower electrode is exposed through the opening, and the electrical connection is adapted to encompass the top and lateral faces of the lower electrode.

(73) The semiconductor light emitting device characterized in that a lower rim of the opening comes into contact with an edge of the lower electrode.

(74) The semiconductor light emitting device characterized in that the lower electrode is inserted inside the opening.

(75) The semiconductor light emitting device characterized in that the non-conductive reflective film has a slant face formed by the opening.

(76) The semiconductor light emitting device characterized in that the non-conductive reflective film comprises a DBR.

(77) The semiconductor light emitting device characterized in that an upper rim of the opening is flatly connected horizontally with the top face of the non-conductive reflective film.

(78) The semiconductor light emitting device characterized in that a vertical thickness from the upper rim of the opening to the top face of the lower electrode is times the thickness of the non-conductive reflective film outside the lower electrode.

(79) The semiconductor light emitting device characterized by comprising a light absorption barrier film provided between the plurality of semiconductor layers and the lower electrode.

The semiconductor light emitting device characterized by comprising a current spreading conductive film provided between the second semiconductor layer and the non-conductive reflective film, and the lower electrode comes into contact with them, respectively, between the current spreading conductive film and the electrical connection.

(81) The semiconductor light emitting device characterized in that the opening is formed passing through the second semiconductor layer, the active layer and until reaching down to part of the first semiconductor layer, and the lower electrode comes in contact with them, respectively, between the first semiconductor layer and the electrical connection.

(82) The semiconductor light emitting device characterized in that the upper electrode comprises an ohmic contact pad in correspondence to an opening; and a finger electrode extended from the ohmic contact pad, and a part of the upper rim of the opening above the finger electrode is raised upwards higher than other parts of the upper rim.

(83) The semiconductor light emitting device characterized in that the upper electrode comprises: a contact layer for lowering an electrical contact resistance; a reflective layer provided on the contact layer; a diffusion barrier layer provided on the reflective layer; an anti-oxidation layer provided on the diffusion barrier layer; and an anti-etching layer provided on the anti-oxidation layer.

(84) The semiconductor light emitting device characterized in that a top layer of the upper electrode is made of a eutectic bonding material.

(85) The semiconductor light emitting device characterized in that the upper electrode is patterned in such a way that the upper electrode covers the electrical connection, without covering the finger electrode and a part of the ohmic contact pad connected with the finger electrode.

(86) The semiconductor light emitting device characterized by comprising a separate bonding pad in electrical communication with the upper electrode.

(87) The semiconductor light emitting device characterized in that the lower electrode comprises an island-like ohmic contact pad that is covered by the upper electrode, where the upper electrode on the first electrode part side is patterned in a manner to cover an island-like ohmic contact pad of the first electrode part without covering a finger electrode of the second electrode part, and the upper electrode on the second electrode part side is patterned in a manner to cover a ohmic contact pad of the second electrode part without covering a finger electrode of the first electrode part.

(88) The semiconductor light emitting device characterized by comprising an insulating layer provided between the bonding pad and the upper electrode, wherein the bonding pad and the upper electrode electrically communicate with each other through an opening formed in the insulating layer.

(89) A semiconductor light emitting device characterized by comprising: a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a first electrode part in electrical communication with the first semiconductor layer; a second electrode part in electrical communication with the second semiconductor layer; and a non-conductive reflective film, which is formed on the plurality of semiconductor layers for reflecting the light generated in the active layer towards the growth substrate and has an opening formed therein, with an upper rim of the opening being formed of an etch-exposed face of the non-conductive reflective film having a reduced height difference, wherein at least one of the first and second electrode parts includes a lower electrode exposed at least partly through the opening; an electrical connection formed in the opening to come into contact with the lower electrode; and an upper electrode provided on the non-conductive reflective film and being in electrical communication with the electrical connection.

(90) The semiconductor light emitting device characterized in that the lower electrode comprises an ohmic contact pad being at least partly exposed through the opening, and a finger electrode extended from the ohmic contact pad; and the upper electrode is patterned in a manner to cover the electrical connection without covering the finger electrode as well as a joint portion where a part of the ohmic contact pad is connected with the finger electrode.

(91) The semiconductor light emitting device characterized in that the lower electrode comprises an island-like ohmic contact pad, and the upper electrode completely covers the ohmic contact pad.

(92) The semiconductor light emitting device characterized in that the lower electrode comprises a finger electrode, and the upper electrode of the first electrode part and the upper electrode of the second electrode part are provided on the non-conductive reflective film at a distance from each other, the upper electrode of the first electrode part being patterned in a manner to cover an island-like ohmic contact pad of the first electrode part without covering a finger electrode of the second electrode part, the upper electrode of the second electrode part being patterned in a manner to cover an island-like ohmic contact pad of the second electrode part without covering a finger electrode of the first electrode part.

(93) The semiconductor light emitting device characterized in that a part of the upper rim of the opening on the side of the finger electrode is raised upwards higher than a part of the upper rim on the side of the ohmic contact pad.

(94) The semiconductor light emitting device characterized in that a groove is formed at an edge of the upper electrode, for exposing a part of the ohmic contact pad connected with the finger electrode.

(95) The semiconductor light emitting device characterized in that the electrical connection and the upper electrode are unitarily formed and extended from the opening to the top face of the non-conductive reflective film along the upper rim of the opening.

(96) The semiconductor light emitting device characterized in that the upper electrode is formed in a manner not to cover a part of the ohmic contact pad connected with the finger electrode.

(97) The semiconductor light emitting device characterized in that an upper rim of the opening in correspondence to the island-like ohmic contact pad is flatly connected horizontally with the top face of the non-conductive reflective film.

(98) The semiconductor light emitting device characterized in that the surroundings of the ohmic contact pad is exposed through the opening, and the electrical connection is brought into contact with the top and lateral faces of the ohmic contact pad.

(99) The semiconductor light emitting device characterized in that a lower rim of the opening comes into contact with edges where the top face and the lateral faces of the ohmic contact pad meet.

(100) The semiconductor light emitting device characterized by comprising a light absorption barrier layer provided between the plurality of semiconductor layers and the upper electrode.

(101) The semiconductor light emitting device characterized by comprising a current spreading conductive film provided between the second semiconductor layer and the non-conductive reflective film, and the lower electrode comes into contact with them, respectively, between the current spreading conductive film and the electrical connection.

(102) The semiconductor light emitting device characterized in that the opening is formed passing through the second semiconductor layer, the active layer and until reaching down to part of the first semiconductor layer, and the lower electrode comes in contact with them, respectively, between the first semiconductor layer and the electrical connection.

(103) The semiconductor light emitting device characterized in that a top layer of the upper electrode is made of a eutectic bonding material.

(104) The semiconductor light emitting device characterized in that the electrical connection is extended from the opening to the top face of the non-conductive reflective film along the upper rim of the opening, and the upper electrode is provided on the electrical connection extended to the top face of the non-conductive reflective film.

(105) The semiconductor light emitting device characterized in that the lower electrode comprises an island-like ohmic contact pad and a finger electrode stretched from the ohmic contact pad; the upper electrode of the first electrode part is patterned in a manner to cover an island-like ohmic contact pad of the first electrode part without covering a finger electrode of the second electrode part; and the upper electrode of the second electrode part is patterned in a manner to cover an island-like ohmic contact pad of the second electrode part without covering a finger electrode of the first electrode part.

(106) The semiconductor light emitting device characterized by comprising: an upper electrode and a separate bonding pad; and an insulating layer provided between the bonding pad the upper electrode, wherein the bonding pad and the upper electrode are electrically communicate with each other through an opening formed in the insulating layer.

In an exemplary embodiment of a semiconductor light emitting device according to the disclosure, the presence of the lower electrode in the electrode part makes it possible to lower the contact resistance.

In a further exemplary embodiment of a semiconductor light emitting device according to the disclosure, with the electrical connection encompassing the top face and at least an edge of the lower electrode, it is possible to obtain a satisfactory electrical contact between the electrical connection with the current spreading conductive film and the electrical connection with the first semiconductor layer, thereby providing a stable interconnection structure.

In a still further exemplary embodiment of a semiconductor light emitting device according to the disclosure, an opening exposing the surroundings of the lower electrode is formed such that the step or height difference of the upper rim of the opening can be substantially reduced, and therefore unevenness of the non-conductive reflective film can also be greatly reduced.

In a still further exemplary embodiment of a semiconductor light emitting device according to the disclosure, substantially reducing unevenness of the non-conductive reflective film due to the opening allows to make the upper electrode flat, making it useful for eutectic bonding.

In a still further exemplary embodiment of a semiconductor light emitting device according to the disclosure, substantially reducing unevenness of the non-conductive reflective film due to the opening allows to prevent an electrical short between the upper electrode and the bonding pad.

In a still further exemplary embodiment of a semiconductor light emitting device according to the disclosure, forming an edge of the first electrode and an edge of the second electrode, facing each other, obliquely against the edge of the plurality of semiconductor layers reduces light absorption by the first and second electrodes, thereby improving brightness.

In a still further exemplary embodiment of a semiconductor light emitting device according to the disclosure, the light absorption loss by the metal reflective film is reduced by using the non-conductive reflective film.

In an exemplary embodiment of a manufacturing method of a semiconductor light emitting device according to the disclosure, a material on the electrode surface produced during dry etching is removed by a subsequent etching process, thereby preventing deterioration of the electrical properties of the semiconductor light emitting device.

In a further exemplary embodiment of a manufacturing method of a semiconductor light emitting device according to the disclosure, the method is applicable for manufacturing flip-chip type, vertical, or horizontal semiconductor light emitting devices, such that any material that can be produced on the electrode surface during the first etching process is removed by the second etching process, thereby preventing deterioration of the electrical properties of the semiconductor light emitting device.

In a still further exemplary embodiment of a manufacturing method of a semiconductor light emitting device according to the disclosure, light absorption by the metal reflective film can be reduced by introducing the non-conductive reflective film, and sufficient current spreading passes can be ensured by electrical connections through the openings.

In a still further exemplary embodiment of a manufacturing method of a semiconductor light emitting device according to the disclosure, it is possible to obtain a semiconductor light emitting device having an electrode that demonstrates excellent bonding strength towards the non-conductive reflective film and establishes a satisfactory electrical connect with the electrical connection.

In an exemplary embodiment of a semiconductor light emitting device according to the disclosure, improved brightness is obtained by guiding part of the light heading for the lateral face from inside the semiconductor light emitting device, towards the substrate of the semiconductor light emitting device or in the vertical direction.

In a further exemplary embodiment of a semiconductor light emitting device according to the disclosure, as light is reflected by the slant face created by an opening available for the electrical connection, brightness is improved without a separate additional process or additional component.

In a still further exemplary embodiment of a semiconductor light emitting device according to the disclosure, light absorption by the metal reflective film is reduced, and current spreading is improved with the help of a finger electrode.

In a still further exemplary embodiment of a semiconductor light emitting device according to the disclosure, there is no n-side finger electrode interconnecting the first electrical connections, such that light absorption loss caused by the n-side finger electrode can be avoided.

In a still further exemplary embodiment of a semiconductor light emitting device according to the disclosure, as n-side finger electrodes are omitted, a reduced light emitting face area can be avoided.

In a still further exemplary embodiment of a semiconductor light emitting device according to the disclosure, the p-side finger electrode is connected only with the second electrical connection, and the third electrical connection is electrically connected with the second semiconductor layer, independently of the p-side finger electrode. Accordingly, there is no need to increase the number of p-side finger electrodes unnecessarily, and thus light absorption loss is lowered.

In a still further exemplary embodiment of a semiconductor light emitting device according to the disclosure, a flip-chip type semiconductor light emitting device takes advantage of an improved uniform current supply, and the non-conductive reflective film used therein reduces light absorption due to the metal reflective film.

What is claimed is:

1. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the opening is formed, passing through the second semiconductor layer, the active layer and until reaching down to part of the first semiconductor layer, and the lower electrode comes in contact with an exposed part of the first semiconductor layer and with the electrical connection, respectively.

2. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the lower electrode comprises: a contact layer for lowering an electrical contact resistance with the plurality of semiconductor layers; a reflective layer provided on the contact layer; a diffusion barrier layer provided on the reflective layer; an anti-oxidation layer provided on the diffusion barrier layer; and an anti-etching layer provided on the anti-oxidation layer, wherein the anti-etching layer in correspondence to the opening is removed to allow the electrical connection to come into contact with the anti-oxidation layer.

3. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the lower electrode comprises at least one of the following: a finger electrode long stretched above the plurality of semiconductor layers; and an island-like ohmic contact pad.

4. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and wherein a face of the non-conductive reflective film formed by the opening is slanted.

5. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the upper electrode comprises: a Sn-containing soldering layer; and an anti-oxidation layer formed on the soldering layer, the anti-oxidation layer being formed of at least one of Au and Pt.

6. The semiconductor light emitting device of claim 5, wherein the soldering layer has a thickness of 5000 Å or more, and the anti-oxidation layer has a thickness of 1000 Å or less.

7. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the upper layer comprises: a crack resistant layer having a first thermal expansion coefficient for preventing cracks in the semiconductor light emitting device during bonding; and an anti-burst layer provided on the crack resistant layer, the anti-burst layer having a second thermal expansion coefficient higher than the first thermal expansion coefficient for preventing the crack resistant layer from getting burst.

8. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and
a non-conductive reflective film, which is formed on the plurality of semiconductor layers for reflecting the light generated in the active layer towards the growth substrate and has an opening formed therein,
wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and
wherein the lower electrode has a top face and lateral faces, and surroundings of the lower electrode are exposed through the opening, and the electrical connection is adapted to encompass the top face and the lateral faces of the lower electrode.

9. A semiconductor light emitting device, comprising:
a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a first electrode part, which is in electrical communication with the first semiconductor layer and supplies electrons or holes thereto;
a second electrode part, which is in electrical communication with the second semiconductor layer and supplies holes thereto if the first electrode part supplies electrons, or electrons if the first electrode part supplies holes; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and wherein a face having been etched during formation of the opening and thereby having a reduced height difference forms an upper rim of the opening.

10. The semiconductor light emitting device of claim 9, wherein the upper electrode comprises an ohmic contact pad being at least partly exposed through the opening, and a finger electrode extended from the ohmic contact pad, and the upper electrode is patterned in such a way that the upper electrode covers the electrical connection, without covering the finger electrode and a part of the ohmic contact pad connected with the finger electrode.

11. A semiconductor light emitting device, comprising:

a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;

a first electrode part, which is in electrical communication with the first semiconductor layer and supplies electrons or holes thereto;

a second electrode part, which is in electrical communication with the second semiconductor layer and supplies holes thereto if the first electrode part supplies electrons, or electrons if the first electrode part supplies holes; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, wherein the lower electrode is partly exposed through the opening, and the non-conductive reflective film is raised up at the edge of the lower electrode, and wherein the upper rim of the opening is raised upwards higher than the top face of the non-conductive reflective film.

12. A semiconductor light emitting device, comprising:

a plurality of semiconductor layers grown sequentially on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;

a first electrode part, which is in electrical communication with the first semiconductor layer and supplies electrons or holes thereto;

a second electrode part, which is in electrical communication with the second semiconductor layer and supplies holes thereto if the first electrode part supplies electrons, or electrons if the first electrode part supplies holes; and a non-conductive reflective film, which is formed on the plurality of semiconductor layers for reflecting the light generated in the active layer towards the growth substrate and has an opening formed therein, wherein at least one of the first and second electrode parts includes a lower electrode exposed at least partly through the opening; an upper electrode provided on the non-conductive reflective film; and an electrical connection, which comes into contact with the lower electrode by passing through the opening and is in electrical communication with the upper electrode, and wherein the device further comprises an upper electrode; a separate bonding pad; and an insulating layer provided between the bonding pad and the upper electrode, wherein the bonding pad and the upper electrode electrically communicate with each other through an opening formed in the insulating layer.

* * * * *